United States Patent
Yamazaki et al.

(10) Patent No.: US 11,195,758 B2
(45) Date of Patent: Dec. 7, 2021

(54) SEMICONDUCTOR DEVICE AND METHOD FOR MANUFACTURING SEMICONDUCTOR DEVICE HAVING PLURALITY OF INSULATOR

(71) Applicant: SEMICONDUCTOR ENERGY LABORATORY CO., LTD., Atsugi (JP)

(72) Inventors: Shunpei Yamazaki, Tokyo (JP); Toshihiko Takeuchi, Kanagawa (JP); Tsutomu Murakawa, Kanagawa (JP); Hiroki Komagata, Kanagawa (JP); Daisuke Matsubayashi, Kanagawa (JP); Noritaka Ishihara, Kanagawa (JP); Yusuke Nonaka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 28 days.

(21) Appl. No.: 16/643,195

(22) PCT Filed: Aug. 28, 2018

(86) PCT No.: PCT/IB2018/056534
§ 371 (c)(1),
(2) Date: Feb. 28, 2020

(87) PCT Pub. No.: WO2019/048983
PCT Pub. Date: Mar. 14, 2019

(65) Prior Publication Data
US 2020/0194310 A1 Jun. 18, 2020

(30) Foreign Application Priority Data

Sep. 5, 2017 (JP) .............................. JP2017-170022
Sep. 5, 2017 (JP) .............................. JP2017-170023
Dec. 13, 2017 (JP) .............................. JP2017-238210

(51) Int. Cl.
*H01L 27/088* (2006.01)
*H01L 21/8234* (2006.01)
(Continued)

(52) U.S. Cl.
CPC .......... *H01L 21/8234* (2013.01); *H01L 27/06* (2013.01); *H01L 27/088* (2013.01); *H01L 27/108* (2013.01); *H01L 29/7869* (2013.01)

(58) Field of Classification Search
CPC ........... H01L 29/0847; H01L 29/41733; H01L 29/42384; H01L 29/4908; H01L 29/786;
(Continued)

(56) References Cited

U.S. PATENT DOCUMENTS 7,378,286 B2   5/2008   Hsu et al.
8,547,771 B2   10/2013  Koyama
(Continued)

FOREIGN PATENT DOCUMENTS

JP   2006-060209 A   3/2006
JP   2016-134578 A   7/2016
(Continued)

OTHER PUBLICATIONS

International Search Report (Application No. PCT/IB2018/056534) dated Dec. 18, 2018.
(Continued)

*Primary Examiner* — Hoai V Pham
(74) *Attorney, Agent, or Firm* — Fish & Richardson P.C.

(57) ABSTRACT

A semiconductor device which has favorable electrical characteristics and can be highly integrated is provided.
The semiconductor device includes a first insulator; an oxide over the first insulator; a second insulator over the oxide; a first conductor over the second insulator; a third insulator in contact with a top surface of the first insulator, a side surface of the oxide, a top surface of the oxide, a side surface of the
(Continued)

second insulator, and a side surface of the first conductor; and a fourth insulator over the third insulator. The third insulator includes an opening exposing the first insulator, and the fourth insulator is in contact with the first insulator through the opening.

12 Claims, 51 Drawing Sheets

(51) Int. Cl.
*H01L 27/06* (2006.01)
*H01L 27/108* (2006.01)
*H01L 29/786* (2006.01)

(58) Field of Classification Search
CPC .............. H01L 27/088; H01L 27/3274; H01L 21/8234
See application file for complete search history.

(56) References Cited

U.S. PATENT DOCUMENTS

| | | | |
|---|---|---|---|
| 9,287,407 | B2 | 3/2016 | Koezuka et al. |
| 9,614,103 | B2 | 4/2017 | Ota et al. |
| 9,954,112 | B2 | 4/2018 | Asami et al. |
| 10,186,614 | B2 | 1/2019 | Asami |
| 2006/0038242 | A1 | 2/2006 | Hsu et al. |
| 2011/0240998 | A1 | 10/2011 | Morosawa et al. |
| 2016/0218224 | A1 | 7/2016 | Ota et al. |
| 2016/0372606 | A1 | 12/2016 | Ito et al. |
| 2017/0170211 | A1 | 6/2017 | Yamazaki |
| 2017/0317104 | A1* | 11/2017 | Jeong .................. H01L 27/1218 |

FOREIGN PATENT DOCUMENTS

| | | |
|---|---|---|
| JP | 2017-130647 A | 7/2017 |
| JP | 2018-022713 A | 2/2018 |
| KR | 2018-0020157 A | 2/2018 |
| TW | 201709346 | 3/2017 |
| WO | WO-2016/203354 | 12/2016 |
| WO | WO-2017/072627 | 5/2017 |

OTHER PUBLICATIONS

Written Opinion (Application No. PCT/IB2018/056534) dated Dec. 18, 2018.
Amano.S et al., "Low Power LC Display Using In—Ga—Zn—Oxide TFTs Based on Variable Frame Frequency", SID Digest '10: SID International Symposium Digest of Technical Papers, May 23, 2010, vol. 41, No. 1, pp. 626-629.
Yamazaki.S et al., "Research, Development, and Application of Crystalline Oxide Semiconductor", SID Digest '12: SID International Symposium Digest of Technical Papers, Jun. 5, 2012, vol. 43, No. 1, pp. 183-186.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, p. 021201-1-021201-7.
Yamazaki.S et al., "Properties of crystalline In—Ga—Zn—oxide semiconductor and its transistor characteristics", Jpn. J. Appl. Phys. (Japanese Journal of Applied Physics), Mar. 31, 2014, vol. 53, No. 4S, p. 04ED18-1-04ED18-10.
Yamazaki.S et al., "In—Ga—Zn—Oxide Semiconductor and Its Transistor Characteristics", ECS Journal of Solid State Science and Technology, July 1, 2014, vol. 3, No. 9, pp. Q3012-Q3022.
Yamazaki.S, "Crystalline Oxide Semiconductor Using CAAC—IGZO and its Application", ECS Transactions, Oct. 1, 2014, vol. 64, No. 10, pp. 155-164, The Electrochemical Society.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology: Digest of Technical Papers, 2015, pp. T216-T217.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Mistry.K, "Transistor Scaling: The Age of Innovation", https://nanohub.org/resources/20880, Apr. 30, 2014, pp. 1-51.

* cited by examiner

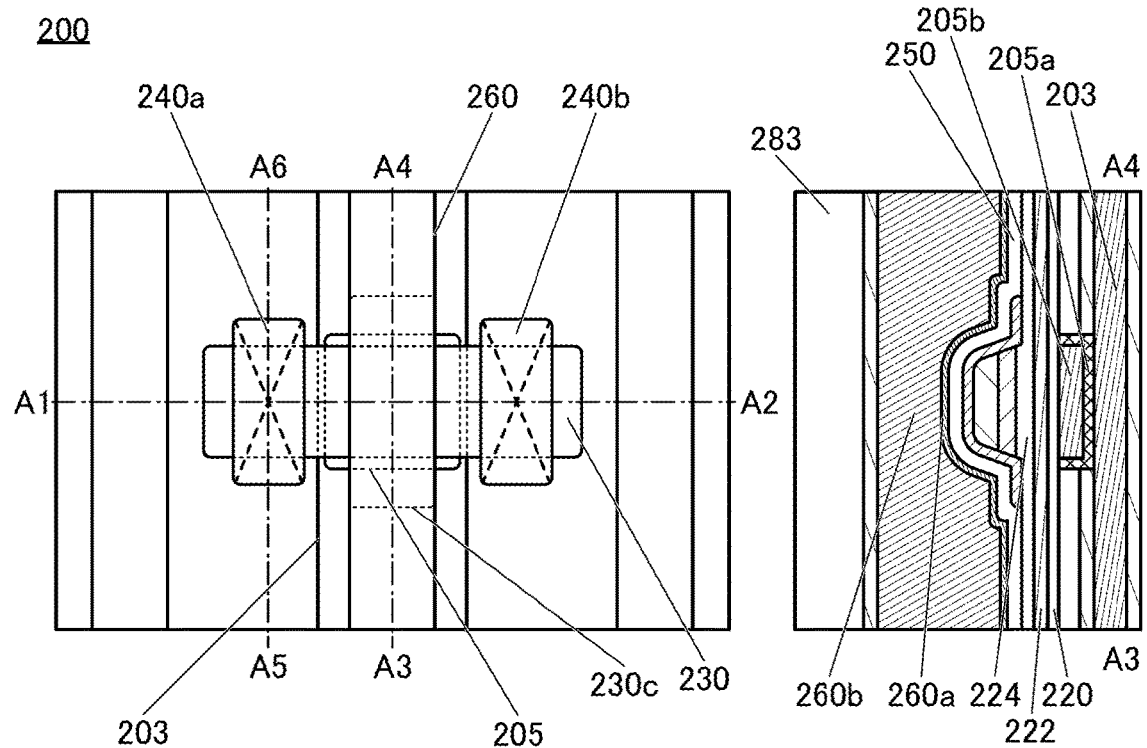
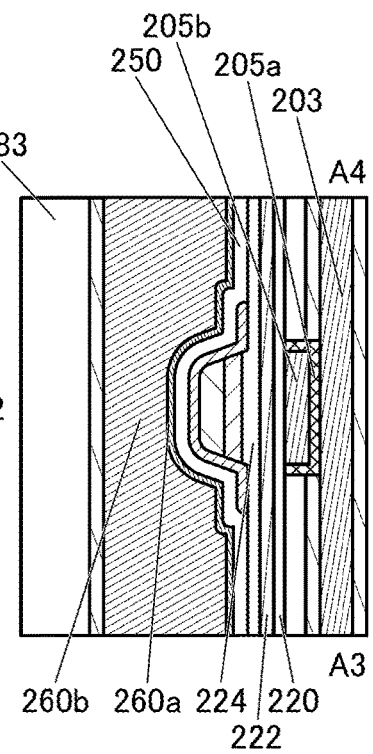
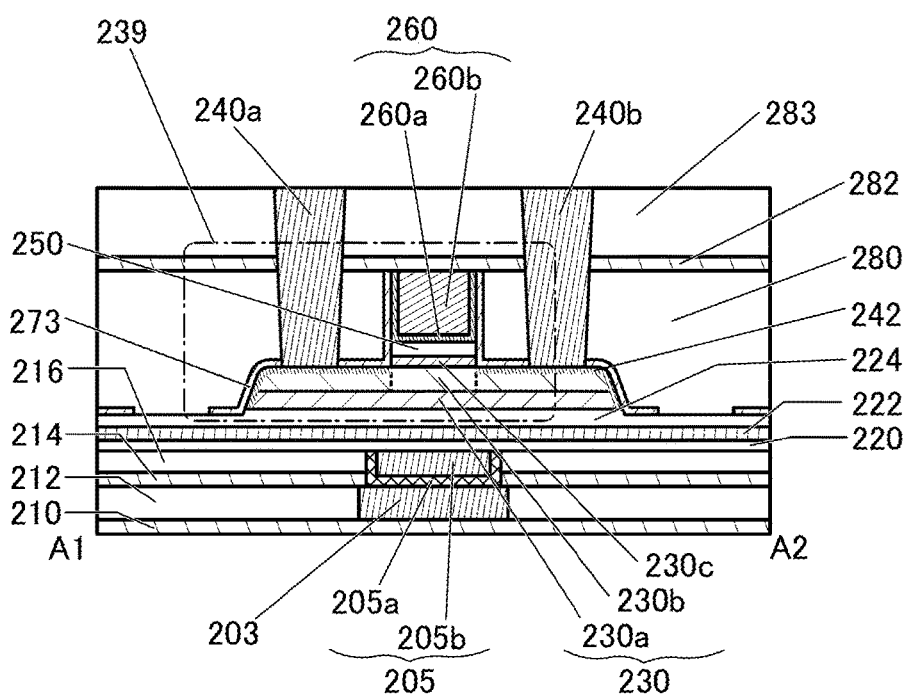

SEMICONDUCTOR DEVICE AND METHOD FOR MANUFACTURING SEMICONDUCTOR DEVICE HAVING PLURALITY OF INSULATOR

CROSS REFERENCE TO RELATED APPLICATIONS

This application is a U.S. National Phase Application under 35 U.S.C. § 371 of International Application PCT/IB2018/056534, filed on Aug. 28, 2018, which is incorporated by reference and which claims the benefit of foreign priority applications filed in Japan on Sep. 5, 2017, as Application No. 2017-170022, on Sep. 5, 2017, as Application No. 2017-170023, and on Dec. 13, 2017, as Application No. 2017-238210.

TECHNICAL FIELD

One embodiment of the present invention relates to a semiconductor device and a method for fabricating the semiconductor device. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

In recent years, semiconductor devices have been developed and mainly used for an LSI, a CPU, or a memory. A CPU is an aggregation of semiconductor elements in which an electrode which is a connection terminal is formed, which includes a semiconductor integrated circuit (at least a transistor and a memory) separated from a semiconductor wafer.

A semiconductor circuit (an IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

It is known that a transistor using an oxide semiconductor has an extremely low leakage current in a non-conduction state. For example, a low-power-consumption CPU utilizing a characteristic of low leakage current of the transistor that uses an oxide semiconductor is disclosed (see Patent Document 1).

A transistor with a self-aligned structure has been proposed as the transistor using an oxide semiconductor. A method for fabricating the transistor with a self-aligned structure in which a metal film is formed over a source region and a drain region and heat treatment is performed on the metal film so that the resistance of the metal film is increased and the resistance of the source region and the drain region is reduced is disclosed (see Patent Document 2).

As a method for fabricating the transistor using an oxide semiconductor, a method in which a metal film is formed over a source region and a drain region, heat treatment is performed, and a dopant is introduced through the metal film so that the resistance of the source region and the drain region is reduced is disclosed (see Patent Document 3).

In recent years, demand for an integrated circuit in which transistors and the like are integrated with high density has risen with reductions in the size and weight of an electronic device. In addition, improvement in the productivity of a semiconductor device including an integrated circuit is required.

A silicon-based semiconductor material is widely known as a semiconductor thin film that can be used in a transistor, and as another material, an oxide semiconductor has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively studied.

From the studies on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). In Non-Patent Document 1 and Non-Patent Document 2, a technique for fabricating a transistor using an oxide semiconductor having a CAAC structure is also disclosed. Moreover, Non-Patent Document 4 and Non-Patent Document 5 disclose that a fine crystal is included even in an oxide semiconductor which has lower crystallinity than an oxide semiconductor having the CAAC structure or the nc structure.

In addition, a transistor that uses IGZO for an active layer has an extremely low off-state current (see Non-Patent Document 6), and an LSI and a display utilizing the characteristics have been reported (see Non-Patent Document 7 and Non-Patent Document 8).

PRIOR ART DOCUMENTS

Patent Documents

[Patent Document 1] Japanese Published Patent Application No. 2012-257187
[Patent Document 2] Japanese Published Patent Application No. 2011-228622
[Patent Document 3] Japanese Published Patent Application No. 2013-016782

Non-Patent Documents

[Non-Patent Document 1] S. Yamazaki et al., "SID Symposium Digest of Technical Papers", 2012, volume 43, issue 1, pp. 183-186.

[Non-Patent Document 2] S. Yamazaki et al., "Japanese Journal of Applied Physics", 2014, volume 53, Number 4S, pp. 04ED18-1-04ED18-10.

[Non-Patent Document 3] S. Ito et al., "The Proceedings of AM-FPD'13 Digest of Technical Papers", 2013, pp. 151-154.

[Non-Patent Document 4] S. Yamazaki et al., "ECS Journal of Solid State Science and Technology", 2014, volume 3, issue 9, pp. Q3012-Q3022.

[Non-Patent Document 5] S. Yamazaki, "ECS Transactions", 2014, volume 64, issue 10, pp. 155-164.

[Non-Patent Document 6] K. Kato et al., "Japanese Journal of Applied Physics", 2012, volume 51, pp. 021201-1-021201-7.

[Non-Patent Document 7] S. Matsuda et al., "2015 Symposium on VLSI Technology Digest of Technical Papers", 2015, pp. T216-T217.

[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

In Patent Document 2, when the resistance of a source region and a drain region is reduced, a metal film is formed over the source region and the drain region and heat treatment is performed on the metal film in an oxygen atmosphere. By performing the heat treatment, a constituent element of the metal film enters the source region and the drain region of an oxide semiconductor film as a dopant, whereby the resistance of the source region and the drain region is reduced. By performing the heat treatment in an oxygen atmosphere, the conductive film is oxidized, whereby the resistance of the conductive film is increased. Note that since the heat treatment is performed in an oxygen atmosphere, oxygen is less likely to be extracted from the oxide semiconductor film to the metal film.

Patent Document 2 discloses the oxygen concentration in a channel formation region, and does not refer to the concentration of impurities such as water or hydrogen. That is, purification of the channel formation region (a reduction in impurities such as water or hydrogen, typically, dehydration or dehydrogenation) is not performed; thus, there is a problem in that a transistor tends to have normally-on characteristics. Note that "normally on" means a state where a channel exists without application of a voltage to a gate electrode and a current flows through the transistor. In contrast, normally-off characteristics of a transistor means a state where a current does not flow through the transistor without application of a voltage to a gate.

In view of the above problems, an object of one embodiment of the present invention is to provide a semiconductor device having favorable electrical characteristics by stably reducing the resistance of a source region and a drain region of a transistor and purifying a channel formation region.

Another object of one embodiment of the present invention is to provide a semiconductor device that can be miniaturized or highly integrated. Another object of one embodiment of the present invention is to provide a semiconductor device having favorable electrical characteristics. Another object of one embodiment of the present invention is to provide a semiconductor device with high productivity.

Another object of one embodiment of the present invention is to provide a semiconductor device capable of retaining data for a long time. Alternatively, an object of one embodiment of the present invention is to provide a semiconductor device capable of high-speed data writing. Another object of one embodiment of the present invention is to provide a semiconductor device with high design flexibility. Another object of one embodiment of the present invention is to provide a semiconductor device with low power consumption. Another object of one embodiment of the present invention is to provide a novel semiconductor device.

Note that the descriptions of these objects do not disturb the existence of other objects. One embodiment of the present invention does not need to achieve all of these objects. Objects other than these will be apparent from the descriptions of the specification, the drawings, the claims, and the like, and can be derived from the descriptions of the specification, the drawings, the claims, and the like.

Means for Solving the Problems

One embodiment of the present invention is a semiconductor device including a first insulator; an oxide over the first insulator; a second insulator over the oxide; a first conductor over the second insulator; a third insulator in contact with a top surface of the first insulator, a side surface of the oxide, a top surface of the oxide, a side surface of the second insulator, and a side surface of the first conductor; and a fourth insulator over the third insulator. The third insulator includes an opening exposing the first insulator, and the fourth insulator is in contact with the first insulator through the opening.

Alternatively, one embodiment of the present invention is a semiconductor device including a first insulator; a first oxide including an opening over the first insulator; a second oxide over the first oxide; a second insulator over the second oxide; a first conductor over the second insulator; a third insulator in contact with a top surface of the first insulator, a side surface of the first oxide, a side surface of the second oxide, a top surface of the second oxide, a side surface of the second insulator, and a side surface of the first conductor; and a fourth insulator over the third insulator. The third insulator includes an opening exposing the first insulator, and the fourth insulator is in contact with the first insulator through the opening in the third insulator.

Furthermore, in the above, it is preferable that the first insulator and the fourth insulator are more likely to transmit oxygen than the third insulator.

Furthermore, the oxide preferably contains In, an element M (M is Al, Ga, Y, or Sn), and Zn.

Furthermore, it is preferable that the first oxide contain In, an element M (M is Al, Ga, Y, or Sn) and Zn, and the second oxide contain In, an element M (M is Al, Ga, Y, or Sn), and Zn.

Furthermore, it is preferable that the second oxide be more likely to transmit oxygen than the first oxide.

Furthermore, the third insulator is preferably an oxide containing one or both of aluminum and hafnium.

Alternatively, one embodiment of the present invention is a method for fabricating a semiconductor device in which a first insulator is formed over a substrate; an oxide layer is formed over the first insulator; a first insulating film and a dummy gate film are deposited in this order over the oxide layer; the first insulating film and the dummy gate film are processed to form a second insulator and a dummy gate layer; a first film containing metal is formed in contact with the first insulator, the oxide layer, and the dummy gate layer; first heat treatment is performed in an atmosphere containing nitrogen; the first film is removed; a second insulating film is deposited to cover the first insulator, the oxide layer, and the dummy gate layer; the second insulating film is processed to form a third insulator including an opening; a third insulating film is deposited over the third insulator; first CMP treatment is performed to remove parts of the dummy gate layer, the third insulator, and the third insulating film until part of the dummy gate layer is exposed; the dummy gate layer is etched to expose the second insulator; a conductive film is deposited; second CMP treatment is performed to remove parts of the conductive film until the third insulator is exposed and to form a first conductive layer and a fourth insulator; oxygen is injected into the fourth insulator; a fifth insulator is formed over the first conductive layer and over the fourth insulator; and second heat treatment is performed in an atmosphere containing oxygen.

Furthermore, in the above, the first film is preferably formed by a sputtering method using one or a plurality of gases selected from argon, nitrogen, and oxygen.

Furthermore, in the above, oxygen is preferably injected into the oxide layer through the opening and the first insulator by performing the second heat treatment.

Furthermore, for the injection of oxygen, one selected from an ion implantation method, an ion doping method, a plasma treatment method, and a plasma immersion ion implantation method may be used.

The injection of oxygen may be performed using an ion implantation method.

Effect of the Invention

According to one embodiment of the present invention, a semiconductor device having favorable electrical characteristics can be provided. Alternatively, according to one embodiment of the present invention, a semiconductor device that can be miniaturized or highly integrated can be provided. Alternatively, according to one embodiment of the present invention, a semiconductor device with high productivity can be provided.

Alternatively, a semiconductor device capable of retaining data for a long time can be provided. Alternatively, a semiconductor device capable of high-speed data writing can be provided. Alternatively, a semiconductor device with high design flexibility can be provided. Alternatively, a semiconductor device with low power consumption can be provided. Alternatively, a novel semiconductor device can be provided.

Note that the descriptions of the effects do not disturb the existence of other effects. One embodiment of the present invention does not necessarily achieve all the effects. Effects other than these will be apparent from the descriptions of the specification, the drawings, the claims, and the like, and can be derived from the descriptions of the specification, the drawings, the claims, and the like.

BRIEF DESCRIPTION OF DRAWINGS

FIGS. 1A to 1C A top view and cross-sectional views of a semiconductor device of one embodiment of the present invention.

MODE FOR CARRYING OUT THE INVENTION

Figure 2:
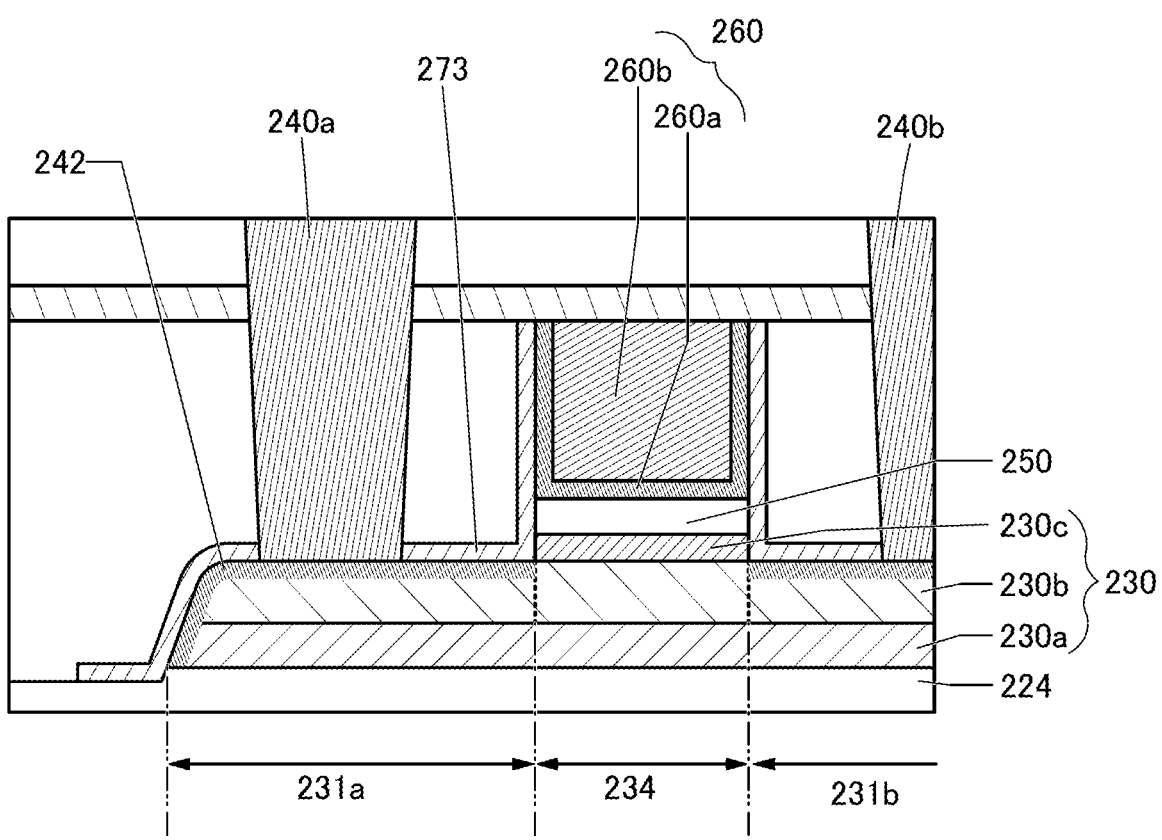
FIG. 2 A cross-sectional view of a semiconductor device of one embodiment of the present invention.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following descriptions of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which might not be reflected in the drawings for easy understanding of the invention. Note that in the drawings, the same reference numerals are used, in different drawings, for the same portions or portions having similar functions, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. The description of some hidden lines and the like might also be omitted.

Note that in this specification and the like, the ordinal numbers such as first and second are used for convenience and do not denote the order of steps or the stacking order of layers. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In this specification, terms for describing arrangement, such as "over" and "under", are used for convenience in describing a positional relationship between components with reference to drawings. Furthermore, the positional relation between components is changed as appropriate in accordance with a direction in which each component is described. Thus, without limitation to terms described in this specification, the description can be changed appropriately depending on the situation.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or texts, a connection relation other than one shown in drawings or texts is regarded as being described in the drawings or the texts.

Here, X and Y denote an object (e.g., a device, an element, a circuit, a wiring, an electrode, a terminal, a conductive film, or a layer).

An example of the case where X and Y are directly connected is the case where an element that allows electrical connection between X and Y (e.g., a switch, a transistor, a capacitor, an inductor, a resistor, a diode, a display element, a light-emitting element, or a load) is not connected between X and Y, and is the case where X and Y are connected without an element that allows electrical connection between X and Y (e.g., a switch, a transistor, a capacitor, an inductor, a resistor, a diode, a display element, a light-emitting element, or a load) placed therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch has a function of being controlled to be turned on or off That is, a switch has a function of being in a conduction state (on state) or non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" is used interchangeably in this specification and the like in some cases.

Note that a channel length refers to, for example, the distance between a source (a source region or a source electrode) and a drain (a drain region or a drain electrode) in a region where a semiconductor (or a portion where current flows in a semiconductor when a transistor is on) and a gate electrode overlap with each other, or a region where a channel is formed in a plan view of the transistor. In one transistor, channel lengths in all regions do not necessarily have the same value. In other words, the channel length of one transistor is not fixed to one value in some cases. Thus, in this specification, the channel length is any one of values, the maximum value, the minimum value, or the average value in a region where a channel is formed.

The channel width refers to, for example, the length of a region where a channel is formed in a direction perpendicular to a channel length direction in a region where a semiconductor (or a portion where current flows in a semiconductor when a transistor is in an on state) and a gate electrode overlap with each other or a region where a channel is formed in a top view of the transistor. In one transistor, channel widths in all regions do not necessarily have the same value. In other words, the channel width of one transistor is not fixed to one value in some cases. Thus, in this specification, the channel width is any one of values, the maximum value, the minimum value, or the average value in a region where a channel is formed.

Note that depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, an effective channel width is greater than an apparent channel width.

In such a case, an effective channel width is difficult to estimate by actual measurement in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Thus, in this specification, an apparent channel width is referred to as a "surrounded channel width (SCW)" in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that values of a channel length, a channel width, an effective channel width, an apparent channel width, a surrounded channel width, and the like can be determined, for example, by analyzing a cross-sectional TEM image and the like.

Note that an impurity in a semiconductor refers to, for example, elements other than the main components of a semiconductor. For example, an element with a concentration of lower than 0.1 atomic % can be regarded as an impurity. When an impurity is contained, for example, DOS (Density of States) in a semiconductor may be increased or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also functions as an impurity in some cases. In addition, in the case of an oxide semiconductor, oxygen vacancies are formed by entry of impurities, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a "silicon oxynitride film" is a film in which oxygen content is higher than nitrogen content in its composition. For example, the silicon oxynitride film preferably contains oxygen, nitrogen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively. Moreover, "silicon nitride oxide film" is a film in which nitrogen content is higher than oxygen content in its composition. For example, the silicon nitride oxide film preferably contains nitrogen, oxygen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively.

Moreover, in this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In addition, in this specification and the like, the term "insulator" can be replaced with the term insulating film or insulating layer. Moreover, the term "conductor" can be replaced with the term conductive film or conductive layer. Furthermore, the term "semiconductor" can be replaced with the term semiconductor film or semiconductor layer.

Furthermore, unless otherwise specified, transistors described in this specification and the like are field-effect transistors. Furthermore, unless otherwise specified, transistors described in this specification and the like are n-channel transistors. Thus, unless otherwise specified, the threshold voltage (also referred to as "$V_{th}$") is higher than 0 V.

In this specification and the like, "parallel" indicates a state where two straight lines are placed such that the angle formed therebetween is greater than or equal to −10° and less than or equal to 10°. Accordingly, the case where the angle is greater than or equal to −5° and less than or equal to 5° is also included. The term "substantially parallel" indicates a state where two straight lines are placed such that the angle formed therebetween is greater than or equal to −30° and less than or equal to 30°. In addition, "perpendicular" indicates a state where two straight lines are placed such that the angle formed therebetween is greater than or equal to 80° and less than or equal to 100°. Accordingly, the case where the angle is greater than or equal to 85° and less than or equal to 95° is also included. The term "substantially perpendicular" indicates a state where two straight lines are placed such that the angle formed therebetween is greater than or equal to 60° and less than or equal to 120°.

Note that in this specification, a barrier film means a film having a function of inhibiting the passage of oxygen and impurities such as hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is referred to as an oxide semiconductor in some cases. That is, in the case where an OS FET is stated, it can also be referred to as a transistor including an oxide or an oxide semiconductor.

In this specification and the like, "normally off" means that current per micrometer of channel width flowing in a transistor when a voltage is not applied to a gate or the gate is supplied with a ground potential is $1\times10^{-20}$ A or lower at room temperature, $1\times10^{-18}$ A or lower at 85° C., or $1\times10^{-16}$ A or lower at 125° C.

Embodiment 1

An example of a semiconductor device including a transistor 200 of one embodiment of the present invention will be described below.
<Structure Example 1 of Semiconductor Device>
FIG. 1 includes a top view and cross-sectional views of the transistor 200 of one embodiment of the present invention and the periphery of the transistor 200.

FIG. 1(A) is a top view of the semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A).

The semiconductor device of one embodiment of the present invention includes the transistor 200, and an insulator 210, an insulator 212, an insulator 280, an insulator 282, and an insulator 283 functioning as interlayer films. The semiconductor device also includes a conductor 203 functioning as a wiring and a conductor 240 (a conductor 240a and a conductor 240b) functioning as a plug, which are electrically connected to the transistor 200.

Note that the conductor 203 is formed to be embedded in the insulator 212. The level of a top surface of the conductor 203 and the level of a top surface of the insulator 212 can be substantially the same. Note that although a structure in which the conductor 203 is a single layer is illustrated, the present invention is not limited thereto. For example, the conductor 203 may have a stacked-layer structure of two or more layers. Note that in the case where a structure body has a stacked-layer structure, the layers may be distinguished by ordinal numbers corresponding to the formation order.

The conductor 240 is formed in contact with an inner wall of an opening in an insulator 273, the insulator 280, the insulator 282, and the insulator 283. Here, the level of a top surface of the conductor 240 and the level of a top surface of the insulator 283 can be substantially the same. Although a structure in which the conductor 240 of the transistor 200 is a single layer is illustrated, the present invention is not limited thereto. For example, the conductor 240 may have a stacked-layer structure of two or more layers.

[Transistor 200]

As illustrated in FIG. 1(B), the transistor 200 includes an insulator 214 and an insulator 216 positioned over a substrate (not illustrated); a conductor 205 (a conductor 205a and a conductor 205b) positioned to be embedded in the insulator 214 and the insulator 216; an insulator 220 positioned over the insulator 216 and the conductor 205; an insulator 222 positioned over the insulator 220; an insulator 224 positioned over the insulator 222; an oxide 230 (an oxide 230a, an oxide 230b, and an oxide 230c) positioned over the insulator 224; an insulator 250 positioned over the oxide 230; a conductor 260 (a conductor 260a and a conductor 260b) positioned over the insulator 250; and an insulator 273 positioned to be in contact with a top surface of the insulator 224, a side surface of the oxide 230a, a side surface of the oxide 230b, a top surface of the oxide 230b, a side surface of the oxide 230c, a side surface of the insulator 250, and a side surface of the conductor 260. The insulator 273 has an opening exposing the insulator 224, and the insulator 280 is in contact with the insulator 224 through the opening. The conductor 260 includes the conductor 260a and the conductor 260b, and the conductor 260a is positioned to cover a bottom surface and side surfaces of the conductor 260b. As illustrated in FIG. 1(B), a top surface of the conductor 260 is substantially aligned with a top surface of the insulator 280.

Although the transistor 200 has a structure in which three layers of the oxide 230a, the oxide 230b, and the oxide 230c are stacked, the present invention is not limited thereto. For example, a structure may be employed in which a single layer of the oxide 230b, a two-layer structure of the oxide 230b and the oxide 230a, a two-layer structure of the oxide 230b and the oxide 230c, or a stacked-layer structure of four or more layers is provided. Similarly, although the transistor 200 has a structure in which the conductor 260a and the conductor 260b are stacked, the present invention is not limited thereto.

In the transistor 200, a metal oxide functioning as an oxide semiconductor (hereinafter also referred to as an oxide semiconductor) is preferably used for the oxide 230 (the oxide 230a, the oxide 230b, and the oxide 230c), which includes a region where a channel is formed (hereinafter also referred to as a channel formation region).

The transistor 200 using an oxide semiconductor in its channel formation region has an extremely low leakage current in a non-conduction state; thus, a semiconductor device with low power consumption can be provided. An oxide semiconductor can be deposited by a sputtering method or the like, and thus can be used for the transistor 200 constituting a highly integrated semiconductor device.

For the oxide 230, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the element M is preferably aluminum, gallium, yttrium, or tin. Furthermore, as the oxide 230, an In—Ga oxide or an In—Zn oxide may be used.

Here, when a metal element such as aluminum, ruthenium, titanium, tantalum, chromium, or tungsten is added to the oxide semiconductor in addition to the constituent element of the oxide semiconductor, a metal compound is formed in part of the oxide semiconductor and the resistance thereof is reduced in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is preferably provided over the oxide semiconductor. By providing such a film, some oxygen in the interface between the film and the oxide semiconductor or in the oxide semiconductor in the vicinity of the interface is absorbed by the film or the like and an oxygen vacancy is formed, so that the resistance of the oxide semiconductor in the vicinity of the interface is reduced in some cases.

After the metal film, the nitride film containing the metal element, or the oxide film containing the metal element is provided over the oxide semiconductor, heat treatment is preferably performed in an atmosphere containing nitrogen. By the heat treatment in the atmosphere containing nitrogen, the metal element is diffused from the metal film into the oxide semiconductor; thus, the metal element can be added to the oxide semiconductor.

In the case where hydrogen in the oxide semiconductor diffuses into a low-resistance region of the oxide semiconductor and enters an oxygen vacancy in the low-resistance region, the hydrogen is brought into a relatively stable state. It is known that hydrogen in the oxygen vacancy in the oxide semiconductor is released from the oxygen vacancy by heat treatment at 250° C. or higher, is diffused into a low-resistance region of the oxide semiconductor, enters an oxygen vacancy in the low-resistance region, and is brought into a relatively stable state. Thus, by the heat treatment, the resistance of the low-resistance region of the oxide semiconductor tends to be further reduced, and the oxide semiconductor whose resistance is not reduced tends to be highly purified (a reduction in impurities such as water or hydrogen) to have an increased resistance.

The carrier density of the oxide semiconductor is increased when an impurity element such as hydrogen or nitrogen exists. Hydrogen in the oxide semiconductor reacts with oxygen bonded to a metal atom to be water, and thus forms an oxygen vacancy in some cases. Entry of hydrogen into the oxygen vacancy increases carrier density. Furthermore, in some cases, bonding of part of hydrogen to oxygen bonded to a metal atom causes generation of an electron serving as a carrier. That is, the resistance of an oxide semiconductor containing nitrogen or hydrogen is reduced.

Thus, selective addition of a metal element and an impurity element such as hydrogen and nitrogen to the oxide semiconductor allows a high-resistance region and a low-resistance region to be formed in the oxide semiconductor. In other words, when the resistance of the oxide 230 is selectively reduced, a region functioning as a semiconductor having a low carrier density and a low-resistance region functioning as a source region or a drain region can be formed in the oxide 230 processed into an island shape.

FIG. 2 is an enlarged view illustrating a region 239 including the oxide 230 whose resistance is selectively reduced, which is surrounded by a dashed-dotted line in FIG. 1(B).

As illustrated in FIG. 2, the oxide 230 includes a region 234 functioning as a channel formation region of the transistor 200 and a region 231 (a region 231a and a region 231b) functioning as a source region and a drain region of the transistor 200.

The region 231 functioning as the source region or the drain region is a region having a low oxygen concentration, a high carrier concentration, and a reduced resistance. The region 234 functioning as the channel formation region is a high-resistance region having a higher oxygen concentration and a lower carrier density than the region 231 functioning as the source region or the drain region.

The concentration of at least one of a metal element and an impurity element such as hydrogen and nitrogen in the region 231 is preferably higher than that in the region 234.

For example, in addition to the metal elements included in the oxide 230, the region 231 preferably contains one or a plurality of metal elements selected from aluminum, ruthenium, titanium, tantalum, tungsten, chromium, and the like.

In order to selectively reduce the resistance of the oxide 230, at least one of metal elements that increase conductivity, such as aluminum, ruthenium, titanium, tantalum, tungsten, chromium, and indium, and an impurity is added to a desired region, for example. As the impurity, an element that forms an oxygen vacancy, an element trapped by an oxygen vacancy, or the like may be used. Examples of the element include hydrogen, boron, carbon, nitrogen, fluorine, phosphorus, sulfur, chlorine, titanium, and a rare gas. Typical examples of the rare gas element are helium, neon, argon, krypton, and xenon.

In order to form the region 231, a film containing a metal element may be provided in contact with the oxide 230, for example. Note that as the film containing the metal element, a metal film, an oxide film containing a metal element, or a nitride film containing a metal element can be used. In that case, a layer 242 that is a compound layer may be formed at the interface between the oxide 230 and the film containing the metal element. Note that the layer 242 is a layer containing a metal compound containing a component of the film containing the metal element and a component of the oxide 230. For example, the layer 242 may be a layer in which a metal element in the oxide 230 and an added metal element are alloyed.

Thus, addition of a metal element to the oxide 230 can form the layer 242 in the oxide 230 and the resistance of the region 231 can be reduced. Note that the layer 242 is not necessarily formed in the oxide 230. For example, the layer 242 may be formed at a surface of the oxide 230 or at the interface between the oxide 230 and the film containing the metal element.

Thus, the region 231 includes the layer 242, in some cases. In other words, in this specification, a region functioning as a source region or a drain region is the region 231.

Although the region 234 and the region 231 formed in the oxide 230b in FIG. 1 and FIG. 2, there is no such limitation. These regions may also be formed in the oxide 230a and the oxide 230c, for example. Although boundaries between the regions are illustrated as being perpendicular to the top surface of the oxide 230 in FIG. 1 and FIG. 2, this embodiment is not limited thereto. For example, the boundary between the region 231a and the region 234 may have a shape which recedes to the A1 (in FIG. 1(B)) side in the vicinity of the bottom surface of the oxide 230b, or the boundary between the region 231b and the region 234 may have a shape which recedes to the A2 (in FIG. 1(B)) side in the vicinity of the bottom surface of the oxide 230b.

In the oxide 230, the boundaries between the regions are difficult to clearly observe in some cases. The concentration of a metal element and an impurity element such as hydrogen and nitrogen, which is detected in each region, may be not only gradually changed between the regions, but also continuously changed (also referred to as gradation) in each region. That is, the region closer to the channel formation region preferably has a lower concentration of a metal element and an impurity element such as hydrogen and nitrogen.

Note that the low-resistance region of the oxide 230 is shown as the layer 242 in FIG. 2. Note that in this specification and the like, the area of the layer 242 is not limited to the areas illustrated in FIG. 2. For example, the layer 242 whose resistance is reduced is formed in a region in the vicinity of the interface between the oxide 230 and the conductor 240, or in a region from the top surface of the oxide 230 to the bottom surface of the oxide 230 in the region 231 in some cases. The same applies to the other drawings.

Heat treatment is preferably performed in an atmosphere containing nitrogen in a state where the region 231 is in contact with the metal film, the nitride film containing the metal element, or the oxide film containing the metal element. By the heat treatment, the metal element is diffused from the metal film into the region 231 of the oxide 230; thus, the metal element can be added to the region 231. Note that the region 231 of the oxide 230 may be alloyed with the metal element. When the region 231 of the oxide 230 is alloyed with the metal element, the metal element added to the oxide semiconductor is brought into a relatively stable state; therefore, a highly reliable semiconductor device can be provided.

In the case where hydrogen in the oxide 230 is diffused into the region 231 and enters an oxygen vacancy in the region 231, the hydrogen is brought into a relatively stable state. Hydrogen in an oxygen vacancy in the region 234 is released from the oxygen vacancy by heat treatment at 250° C. or higher, is diffused into the region 231, enters an oxygen vacancy in the region 231, and is brought into a relatively stable state. Thus, by the heat treatment, the resistance of the region 231 is further reduced, and the region 234 is highly purified (a reduction in impurities such as water or hydrogen) and the resistance is further increased.

Here, in the case where the metal film, the oxide film containing the metal element, or the nitride film containing the metal element has a property of absorbing hydrogen, hydrogen in the oxide 230 is absorbed by the film. Thus, hydrogen, which is an impurity in the oxide 230, can be reduced. In a later step, the metal film, the oxide film containing the metal element, or the nitride film containing the metal element may be removed together with hydrogen absorbed from the oxide 230.

Note that the metal film, the oxide film containing the metal element, or the nitride film containing the metal element is not necessarily removed. When the metal film, the oxide film containing the metal element, or the nitride film containing the metal element is oxidized by oxygen absorbed from the oxide 230 to be a high-resistance insulator, for example, the film may be left. In this case, the film may function as an interlayer film.

In the case where a region having conductivity is left in the metal film, the oxide film containing the metal element, or the nitride film containing the metal element, for example, the region having conductivity is oxidized by heat treatment, so that the film becomes a high-resistance insulator. The heat treatment is preferably performed in an oxidation atmosphere, for example. In the case where a structure body containing oxygen is provided in the vicinity of the metal film, the oxide film containing the metal element, or the nitride film containing the metal element, by heat treatment, the metal film, the oxide film containing the metal element, or the nitride film containing the metal element may be reacted with oxygen contained in the structure body and oxidized.

The metal film, the oxide film containing the metal element, or the nitride film containing the metal element can function as an interlayer film when remains as an insulator.

For example, the metal film, the oxide film containing the metal element, or the nitride film containing the metal element is preferably provided to have a thickness of greater than or equal to 0.5 nm and less than or equal to 5 nm, further preferably greater than or equal to 1 nm and less than or equal to 2 nm. When aluminum having a thickness of greater than or equal to 0.5 nm and less than or equal to 5 nm is oxidized by heat treatment, for example, aluminum oxide having a thickness of greater than or equal to 0.7 nm and less than or equal to 8 nm may be formed. Note that in the case where heat treatment is performed in the above oxidation atmosphere, such heat treatment is preferably performed after carrying out, in an atmosphere containing nitrogen, another heat treatment which is performed in a state where the oxide 230 is in contact with the metal film, the oxide film containing the metal element, or the nitride film containing the metal element. When the heat treatment is performed in an atmosphere containing nitrogen once, oxygen in the oxide 230 is easily diffused into the metal film, the oxide film containing the metal element, or the nitride film containing the metal element.

Here, a transistor using an oxide semiconductor is likely to have its electrical characteristics changed by impurities and oxygen vacancies in a region of the oxide semiconductor where a channel is formed; accordingly, the reliability is decreased in some cases. Moreover, if the region of the oxide semiconductor where a channel is formed includes oxygen vacancies, the transistor tends to have normally-on characteristics. Thus, oxygen vacancies in the region 234 where a channel is formed are preferably reduced as much as possible.

Here, as the insulator 273, an oxide having a function of inhibiting the passage of oxygen and an impurity such as water or hydrogen is preferably used. For example, aluminum oxide or hafnium oxide is preferably used. The insulator 273 can be deposited by a sputtering method, a CVD method, an MBE method, a PLD method, an ALD method, or the like. An oxide is preferably deposited as the insulator 273 by an ALD method, for example. When an oxide is deposited by an ALD method, a dense thin film with good coverage and few defects can be deposited even in the case of being deposited over a step-like shape. Furthermore, the insulator 224 and the insulator 280 are more likely to transmit oxygen than the insulator 273.

As illustrated in FIG. 1, the insulator 273 is positioned over the insulator 224 to cover side surfaces of the oxide 230, a top surface of the oxide 230, side surfaces of the insulator 250, and side surfaces of the conductor 260. Furthermore, the insulator 273 includes an opening exposing the insulator 224, and the insulator 280 is in contact with the insulator 224 through the opening. The top surface of the conductor 260 is covered with the insulator 282. For the insulator 282, it is preferable to use an oxide having a function of inhibiting the passage of oxygen and impurities such as water and hydrogen, as for the insulator 273.

That is, the transistor 200 is covered with the insulator 273 and the insulator 282 that are oxides having a function of inhibiting the passage of oxygen. Here, when the insulator 280 containing oxygen at a higher proportion than oxygen in the stoichiometric composition (also referred to as excess oxygen) is positioned over the transistor 200 with the insulator 273 therebetween, excess oxygen contained in the insulator 280 can be diffused into the insulator 224 through the opening included in the insulator 273 and then injected into the region 234, which is a channel formation region, through the insulator 224. Furthermore, the insulator 282 can inhibit upward diffusion of the excess oxygen. Furthermore, the insulator 273 can inhibit the excess oxygen contained in the insulator 280 from being diffused into the conductor 260, so that oxidation of the conductor 260 can be inhibited. The insulator 273 also inhibits the passage of excess oxygen through other paths.

With the structure illustrated in FIG. 1, excess oxygen contained in the insulator 280 can be efficiently injected into the region 234, so that oxygen vacancies in the region 234 of the oxide 230 can be reduced.

Treatment for injecting oxygen into the insulator 280 is performed after the formation of the insulator 280, whereby the insulator 280 containing excess oxygen can be formed. As the treatment for injecting oxygen, for example, aluminum oxide, hafnium oxide, a silicon oxide film, or the like may be deposited by a sputtering method using a gas containing oxygen.

In this embodiment, after the formation of the insulator 280, aluminum oxide is deposited as the insulator 282 by a sputtering method using a gas containing oxygen. The aluminum oxide deposited over the insulator 280 enables oxygen injection into the insulator 280.

As another treatment for injecting oxygen, plasma treatment using a gas containing oxygen, treatment for injecting oxygen ions with an ion implantation apparatus, or the like can be given. Oxygen can be injected into the insulator 280 by plasma irradiation using a gas containing oxygen with an apparatus including a high-density plasma source, for example. Alternatively, oxygen ions can be injected into the insulator 280 with an ion implantation apparatus.

In particular, ion implantation with an ion implantation apparatus can control the amount of ion implantation and the depth of ion implantation independently, which is preferable. That is, an optimal amount of oxygen can be injected into the insulator 280 at an optimal depth, so that a semiconductor device including a high-performance transistor with small variation in performance can be manufactured. The implantation amount and the implantation depth can be optimized as appropriate depending on the thickness of the insulator 280, the size of the transistor, the arrangement density of the transistor, and the arrangement of the transistor.

When the above structures or the above steps are combined, the resistance of the oxide 230 can be selectively reduced.

In formation of a low-resistance region in the oxide 230, the resistance of the oxide 230 is reduced in a self-aligned manner with the use of the conductor 260 functioning as a gate electrode as a mask. Therefore, when the plurality of transistors 200 are formed simultaneously, variations in electrical characteristics of the transistors can be reduced. The channel length of the transistor 200 is determined depending on the width of the conductor 260; the transistor 200 can be miniaturized when the conductor 260 has the minimum feature width.

Thus, by appropriate selection of the areas of the regions, a transistor having electrical characteristics that meet the demand for the circuit design can be easily provided.

An oxide semiconductor can be deposited by a sputtering method or the like, and thus can be used for a transistor constituting a highly integrated semiconductor device. The transistor using an oxide semiconductor in its channel formation region has an extremely low leakage current (off-state current) in a non-conduction state; thus, a semiconductor device with low power consumption can be provided.

Accordingly, a semiconductor device including a transistor having a high on-state current can be provided. Alternatively, a semiconductor device including a transistor having a low off-state current can be provided. Alternatively, a semiconductor device that has small variation in electrical characteristics, stable electrical characteristics, and high reliability can be provided.

The structure of the semiconductor device including the transistor 200 of one embodiment of the present invention will be described in detail below.

The conductor 203 extends in the channel width direction as illustrated in FIG. 1(A) and FIG. 1(C) and functions as a wiring that applies a potential to the conductor 205. Note that the conductor 203 is preferably provided to be embedded in the insulator 212.

The conductor 205 is positioned to overlap with the oxide 230 and the conductor 260. Moreover, the conductor 205 is preferably provided in contact with the top surface of the conductor 203. Furthermore, the conductor 205 is preferably provided to be embedded in the insulator 214 and the insulator 216.

Here, the conductor 260 functions as a first gate (also referred to as a top gate) electrode in some cases. The conductor 205 functions as a second gate (also referred to as a bottom gate) electrode in some cases. In that case, the threshold voltage of the transistor 200 can be controlled by changing a potential applied to the conductor 205 not in synchronization with but independently of a potential applied to the conductor 260. In particular, the threshold voltage of the transistor 200 can be higher than 0 V and the off-state current can be reduced by applying a negative potential to the conductor 205. Thus, a drain current when a potential applied to the conductor 260 is 0 V can be lower in the case where a negative potential is applied to the conductor 205 than in the case where the negative potential is not applied to the conductor 205.

When the conductor 205 is provided over the conductor 203, the distance between the conductor 203 and the conductor 260 functioning as the first gate electrode and the wiring can be designed as appropriate. That is, the insulator 214, the insulator 216, and the like are provided between the conductor 203 and the conductor 260, whereby a parasitic capacitance between the conductor 203 and the conductor 260 can be reduced, and the withstand voltage between the conductor 203 and the conductor 260 can be increased.

Moreover, the reduction in the parasitic capacitance between the conductor 203 and the conductor 260 can improve the switching speed of the transistor 200, so that the transistor can have high frequency characteristics. The increase in the withstand voltage between the conductor 203 and the conductor 260 can improve the reliability of the transistor 200. Therefore, the film thicknesses of the insulator 214 and the insulator 216 are preferably large. Note that the extending direction of the conductor 203 is not limited to this; for example, the conductor 203 may extend in the channel length direction of the transistor 200.

Note that as illustrated in FIG. 1(A), the conductor 205 is positioned to overlap with the oxide 230 and the conductor 260. The conductor 205 is preferably larger than the region 234 of the oxide 230. As illustrated in FIG. 1(C), it is particularly preferable that the conductor 205 extend to a region outside an end portion of the region 234 of the oxide 230 that intersects with the channel width direction.

With the above structure, in the case where potentials are applied to the conductor 260 and the conductor 205, an electric field generated from the conductor 260 and an electric field generated from the conductor 205 are connected, so that the channel formation region formed in the oxide 230 can be electrically surrounded.

That is, the channel formation region in the region 234 can be electrically surrounded by the electric field of the conductor 260 having a function of the first gate electrode and the electric field of the conductor 205 having a function of the second gate electrode. In this specification, a transistor structure in which a channel formation region is electrically surrounded by electric fields of a first gate electrode and a second gate electrode is referred to as a surrounded channel (S-channel) structure.

In the conductor 205, a first conductor is formed in contact with an inner wall of an opening in the insulator 214 and the insulator 216, and a second conductor is formed on the inner side. Here, the levels of top surfaces of the first conductor and the second conductor can be substantially the same as the level of a top surface of the insulator 216. Although the transistor 200 having a structure in which the first conductor and the second conductor are stacked is described, the present invention is not limited thereto. For example, the conductor 205 may have a single-layer structure or a stacked-layer structure of three or more layers.

The first conductor of the conductor 205 or the conductor 203 is preferably formed using a conductive material which has a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom (through which the above impurities are less likely to pass). Alternatively, it is preferable to use a conductive material having a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and the above oxygen.

When the first conductor of the conductor 205 or the conductor 203 has a function of inhibiting diffusion of oxygen, the conductivity of the second conductor of the conductor 205 or the conductor 203 can be inhibited from being lowered because of oxidization. As a conductive material having a function of inhibiting diffusion of oxygen, for example, tantalum, tantalum nitride, ruthenium, or ruthenium oxide is preferably used. Thus, a single layer or a stacked layer of the above conductive materials may be used for the first conductor of the conductor 205 or the conductor 203. Thus, impurities such as water or hydrogen can be inhibited from being diffused into the transistor 200 side through the conductor 203 and the conductor 205.

A conductive material containing tungsten, copper, or aluminum as its main component is preferably used for the second conductor of the conductor 205. Note that the second conductor of the conductor 205 is a single layer in the drawing but may have a stacked-layer structure; for example, a stacked layer of any of the above conductive materials and titanium or titanium nitride may be employed.

The second conductor of the conductor 203 functions as a wiring and thus is preferably a conductor having higher conductivity than the second conductor of the conductor 205. For example, a conductive material containing copper or aluminum as its main component can be used. The second conductor of the conductor 203 may have a stacked-layer structure; for example, a stacked layer of any of the above conductive materials and titanium or titanium nitride may be employed.

It is particularly preferable to use copper for the second conductor of the conductor 203. Copper is preferably used for a wiring and the like because of its small resistance. However, copper is easily diffused, and thus may deteriorate the electrical characteristics of the transistor 200 when diffused into the oxide 230. In view of the above, for example, a material through which copper is less likely to pass, such as aluminum oxide or hafnium oxide, is used for the insulator 214, whereby diffusion of copper can be inhibited.

The conductor 205, the insulator 214, and the insulator 216 are not necessarily provided. In that case, part of the conductor 203 can function as the second gate electrode.

The insulator 210 and the insulator 214 preferably function as a barrier insulating film that inhibits impurities such as water or hydrogen from entering the transistor 200 from the substrate side. Accordingly, for the insulator 210 and the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (through which the above impurities are less likely to pass). Alternatively, it is preferable to use an insulating material having a function of inhibiting diffusion of oxygen (e.g., at least one of oxygen atoms, oxygen molecules, and the like) (through which the above oxygen is less likely to pass).

For example, it is preferable that aluminum oxide or the like be used for the insulator 210 and that silicon nitride or the like be used for the insulator 214. Accordingly, impurities such as water and hydrogen can be inhibited from being diffused to the transistor 200 side from the substrate side through the insulator 210 and the insulator 214. Alternatively, oxygen contained in the insulator 224 or the like can be inhibited from being diffused to the substrate side through the insulator 210 and the insulator 214.

Furthermore, with the structure in which the conductor 205 is stacked over the conductor 203, the insulator 214 can be provided between the conductor 203 and the conductor 205. Here, even when a metal that is easily diffused, such as copper, is used for the second conductor of the conductor 203, silicon nitride or the like provided as the insulator 214 can inhibit diffusion of the metal into a layer above the insulator 214.

The dielectric constant of each of the insulator 212, the insulator 216, and the insulator 280 functioning as interlayer films is preferably lower than that of the insulator 210 or the insulator 214. When a material with a low dielectric constant is used for an interlayer film, the parasitic capacitance generated between wirings can be reduced.

For example, a single layer or a stacked layer of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used as the insulator 212, the insulator 216, and the insulator 280. Alternatively, to the insulator of these, aluminum oxide, bismuth oxide, germanium oxide, niobium oxide, silicon oxide, titanium oxide, tungsten oxide, yttrium oxide, or zirconium oxide may be added, for example. Alternatively, the insulator of these may be subjected to nitriding treatment. Silicon oxide, silicon oxynitride, or silicon nitride may be stacked over the insulator.

The insulator 220, the insulator 222, and the insulator 224 each have a function of a gate insulator.

Here, for the insulator 224 in contact with the oxide 230, an oxide insulator that contains more oxygen than that in the stoichiometric composition is preferably used. That is, an excess-oxygen region is preferably formed in the insulator 224. When such an insulator containing excess oxygen is provided in contact with the oxide 230, oxygen vacancies in the oxide 230 can be reduced and the reliability of the transistor 200 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0\times10^{18}$ atoms/cm$^3$, preferably greater than or equal to $1.0\times10^{19}$ atoms/cm$^3$, more preferably greater than or equal to $2.0\times10^{19}$ atoms/cm$^3$ or greater than or equal to $3.0\times10^{20}$ atoms/cm$^3$ in thermal desorption spectroscopy analysis (TDS analysis). Note that the temperature of the film surface in the TDS analysis is preferably higher than or equal to 100° C. and lower than or equal to 700° C., or higher than or equal to 100° C. and lower than or equal to 400° C.

In the case where the insulator 224 includes an excess-oxygen region, it is preferable that the insulator 222 have a function of inhibiting diffusion of oxygen (e.g., at least one of oxygen atoms and oxygen molecules) (that the insulator 222 do not easily transmit the above oxygen).

When the insulator 222 has a function of inhibiting diffusion of oxygen, oxygen in the excess-oxygen region included the insulator 224 is not diffused to the insulator 220 side and thus can be supplied to the oxide 230 efficiently. Furthermore, the conductor 205 can be inhibited from reacting with oxygen from the excess-oxygen region included in the insulator 224.

For example, a single layer or a stacked layer of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) is preferably used for the insulator 222. With miniaturization and high integration of a transistor, a problem such as leakage current may arise because of a thinner gate insulator. When a high-k material is used for an insulator functioning as the gate insulator, a gate potential during operation of the transistor can be reduced while the physical thickness of the gate insulator is kept.

It is particularly preferable to use an insulator containing an oxide of one or both of aluminum and hafnium, which is an insulating material having a function of inhibiting diffusion of impurities, oxygen, and the like (through which the above oxygen is less likely to pass). As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, to the insulator of these, aluminum oxide, bismuth oxide, germanium oxide, niobium oxide, silicon oxide, titanium oxide, tungsten oxide, yttrium oxide, or zirconium oxide may be added, for example. Alternatively, the insulator of these may be subjected to nitriding treatment. Silicon oxide, silicon oxynitride, or silicon nitride may be stacked over the insulator.

It is preferable that the insulator 220 be thermally stable. For example, silicon oxide and silicon oxynitride, which have thermal stability, are preferable. Furthermore, when an insulator which is a high-k material is combined with silicon oxide or silicon oxynitride, the insulator 220 having a stacked-layer structure that has thermal stability and a high dielectric constant can be obtained.

Note that the insulator 220, the insulator 222, and the insulator 224 may each have a stacked-layer structure of two or more layers. In that case, without limitation to a stacked-layer structure formed of the same material, a stacked-layer structure formed of different materials may be employed.

The oxide 230 includes the oxide 230a, the oxide 230b over the oxide 230a, and the oxide 230c over the oxide 230b. When the oxide 230a is provided below the oxide 230b, impurities can be inhibited from being diffused into the oxide 230b from the components formed below the oxide 230a. When the oxide 230c is provided over the oxide 230b, impurities can be inhibited from being diffused into the oxide 230b from the components formed above the oxide 230c.

Note that the oxide 230 preferably has a stacked-layer structure of oxides which differ in the atomic ratio of metal elements. Specifically, the atomic proportion of the element M in constituent elements in the metal oxide used for the oxide 230a is preferably greater than the atomic proportion of the element Min constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

The energy level of the conduction band minimum gradually changes at a junction portion of the oxide 230a, the oxide 230b, and the oxide 230c. In other words, the energy level of the conduction band minimum at a junction portion of each of the oxide 230a, the oxide 230b, and the oxide 230c continuously changes or is continuously connected. To obtain this, the density of defect states in a mixed layer formed at an interface between the oxide 230a and the oxide 230b, and an interface between the oxide 230b and the oxide 230c is preferably made low.

Specifically, when the oxide 230a and the oxide 230b, or the oxide 230b and the oxide 230c contain the same element (as a main component) in addition to oxygen, a mixed layer with a low density of defect states can be formed. For example, in the case where the oxide 230b is an In—Ga—Zn oxide, an In—Ga—Zn oxide, a Ga—Zn oxide, gallium oxide, or the like is preferably used for the oxide 230a and the oxide 230c.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have a high on-state current.

Figure 32:
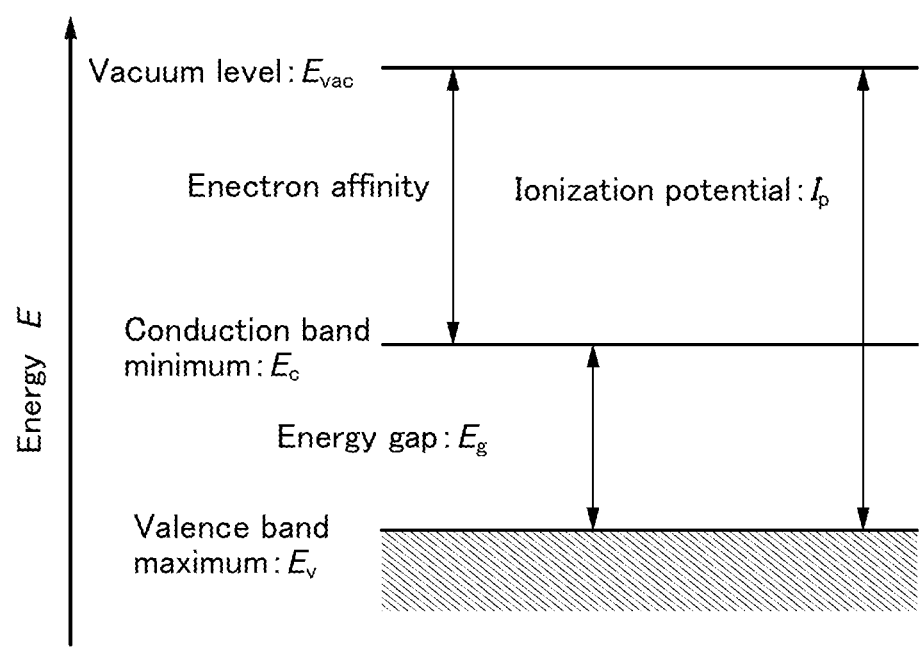
FIG. 32 A diagram illustrating an energy band structure of an oxide semiconductor.

As shown in FIG. 32, the electron affinity or the energy level $E_c$ of the conduction band minimum can be obtained from a band gap $E_g$ and an ionization potential $I_p$, which is a difference between a vacuum level $E_{vac}$ and an energy $E_v$ of the valence band maximum. The ionization potential $I_p$ can be measured using, for example, an ultraviolet photoelectron spectroscopy (UPS) apparatus. The energy gap $E_g$ can be measured using, for example, a spectroscopic ellipsometer.

The oxide 230 includes the region 231 and the region 234. Thus, when the transistor 200 is turned on, the region 231a or the region 231b functions as the source region or the drain region. At least part of the region 234 functions as the region where a channel is formed.

In the transistor 200, a region with a higher resistance than the region 231 is not formed between the region 231 functioning as the source region and the drain region and the region 234 where a channel is formed, so that the on-state current and the mobility of the transistor can be increased. Since the source region and the drain region do not overlap with the first gate electrode (the conductor 260), formation of unnecessary capacitance between them can be inhibited.

A metal oxide functioning as an oxide semiconductor (hereinafter also referred to as an oxide semiconductor) is preferably used as the oxide 230. For example, as the metal oxide to be the region 234, it is preferable to use one having a band gap of 2 eV or more, preferably 2.5 eV or more. With the use of a metal oxide having such a wide band gap, the off-state current of the transistor can be reduced.

A transistor using an oxide semiconductor has an extremely low leakage current in a non-conduction state; thus, a semiconductor device with low power consumption can be provided. An oxide semiconductor can be deposited by a sputtering method or the like, and thus can be used for a transistor constituting a highly integrated semiconductor device.

The insulator 250 functions as a gate insulator. The insulator 250 is preferably positioned in contact with the top surface of the oxide 230c. The insulator 250 is preferably formed using an insulator from which oxygen is released by heating. The insulator 250 is, for example, an oxide film in which the amount of released oxygen converted into oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy analysis (TDS analysis). Note that the temperature of the film surface in the TDS analysis is preferably higher than or equal to 100° C. and lower than or equal to 700° C.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

When an insulator that releases oxygen by heating is provided for the insulator 250 in contact with the top surface of the oxide 230c, oxygen can be efficiently supplied to the region 234 of the oxide 230b from the insulator 250. Furthermore, as in the insulator 224, the concentration of an impurity such as water or hydrogen in the insulator 250 is preferably reduced. The film thickness of the insulator 250 is preferably greater than or equal to 1 nm and less than or equal to 20 nm.

Furthermore, in order to supply excess oxygen contained in the insulator 250 to the oxide 230 efficiently, a metal oxide may be provided over the insulator 250. In that case, the metal oxide preferably inhibits diffusion of oxygen from the insulator 250. Provision of the metal oxide that inhibits diffusion of oxygen inhibits diffusion of excess oxygen from the insulator 250 to the conductor 260. That is, a reduction in the amount of excess oxygen supplied to the oxide 230 can be inhibited. Moreover, oxidization of the conductor 260 due to excess oxygen can be suppressed.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. With such a stacked-layer structure, the stacked-layer structure can be thermally stable and have a high dielectric constant. Thus, a gate potential that is applied during operation of the transistor can be reduced while the physical thickness of the gate insulator is kept. In addition, the equivalent oxide thickness (EOT) of the insulator functioning as the gate insulator can be reduced.

The metal oxide may function as part of the first gate electrode. For example, an oxide semiconductor that can be used for the oxide 230 can be used as the metal oxide. In that case, when the conductor 260 is deposited by a sputtering method, the metal oxide can have a reduced electric resistance to be a conductor. This can be referred to as an OC (Oxide Conductor) electrode. With the metal oxide, the on-state current of the transistor 200 can be increased without a reduction in the influence of the electric field from the conductor 260.

Since the distance between the conductor 260 and the oxide 230 is kept by the physical thicknesses of the insulator 250 and the metal oxide, a leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

Specifically, as the metal oxide, a metal oxide containing one or more kinds selected from hafnium, aluminum, gallium, yttrium, zirconium, tungsten, titanium, tantalum, nickel, germanium, magnesium, and the like can be used. Furthermore, the oxide semiconductor that can be used for the oxide 230 can also be used for the metal oxide when the resistance thereof is reduced.

It is particularly preferable to use an insulator containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step.

The conductor 260 functioning as the first gate electrode includes the conductor 260a and the conductor 260b over the conductor 260a. Like the first conductor of the conductor 205, the conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of oxygen atoms, oxygen molecules, and the like).

When the conductor 260a has a function of inhibiting diffusion of oxygen, the conductivity of the conductor 260b can be inhibited from being lowered because of oxidization due to excess oxygen contained in the insulator 250 and the metal oxide. As a conductive material having a function of inhibiting diffusion of oxygen, for example, tantalum, tantalum nitride, ruthenium, or ruthenium oxide is preferably used.

Furthermore, the conductor 260b is preferably formed using a conductive material containing tungsten, copper, or aluminum as its main component. The conductor 260 functions as a wiring and thus is preferably formed using a conductor having high conductivity. For example, a conductive material containing tungsten, copper, or aluminum as its main component can be used. The conductor 260b may have a stacked-layer structure, for example, a stacked layer of any of the above conductive materials and titanium or titanium nitride.

In the case where the conductor 205 extends to a region outside an end portion of the region 234 of the oxide 230 that intersects with the channel width direction as illustrated in FIG. 1(C), the conductor 260 preferably overlaps with the conductor 205 with the insulator 250 therebetween in the region. That is, a stacked-layer structure of the conductor 205, the insulator 250, and the conductor 260 is preferably formed outside the side surface of the oxide 230.

With the above structure, in the case where potentials are applied to the conductor 260 and the conductor 205, an electric field generated from the conductor 260 and an electric field generated from the conductor 205 are connected, so that the channel formation region formed in the oxide 230 can be electrically surrounded.

That is, the channel formation region in the region 234 can be electrically surrounded by the electric field of the conductor 260 having a function of the first gate electrode and the electric field of the conductor 205 having a function of the second gate electrode.

In addition, the insulator 280 functioning as an interlayer film is preferably provided to cover the oxide 230 and the insulator 273. As in the insulator 224 or the like, the concentration of impurities such as water and hydrogen in the film of the insulator 280 is preferably reduced. The insulator 280 preferably contains excess oxygen as described above. Note that the insulator 282 similar to the insulator 210 may be provided over the insulator 280. When the insulator 282 is deposited by a sputtering method, impurities in the insulator 280 can be reduced. Furthermore, the insulator 283 similar to the insulator 280 may be provided over the insulator 282.

The conductor 240a and the conductor 240b are positioned in the openings formed in the insulator 283, the insulator 282, the insulator 280, and the insulator 273. The conductor 240a and the conductor 240b are provided to face each other with the conductor 260 sandwiched therebetween. Note that the top surfaces of the conductor 240a and the conductor 240b may be on the same surface as the top surface of the insulator 283.

The conductor 240a is in contact with the region 231a functioning as one of the source region and the drain region of the transistor 200, and the conductor 240b is in contact with the region 231b functioning as the other of the source region and the drain region of the transistor 200. Thus, the conductor 240a can function as one of a source electrode and a drain electrode, and the conductor 240b can function as the other of the source electrode and the drain electrode.

Note that the conductor 240a is formed in contact with the inner wall of the opening in the insulator 283, the insulator 282, the insulator 280, and the insulator 273. The region 231a of the oxide 230 is positioned on at least part of a bottom of the opening, and thus the conductor 240a is in contact with the region 231a. Similarly, the conductor 240b is formed in contact with the inner wall of the opening in the insulator 280 and the insulator 273. The region 231b of the oxide 230 is positioned on at least part of a bottom of the opening, and thus the conductor 240b is in contact with the region 231b.

FIG. 3 includes cross-sectional views of a portion indicated by a dashed-dotted line A5-A6 in FIG. 1(A) and is a cross-sectional view of a region in the channel width direction of the transistor 200, where the conductor 240a is in contact with the oxide 230. Note that a region where the conductor 240b is in contact with the oxide 230 has a similar structure.

Figure 3A:
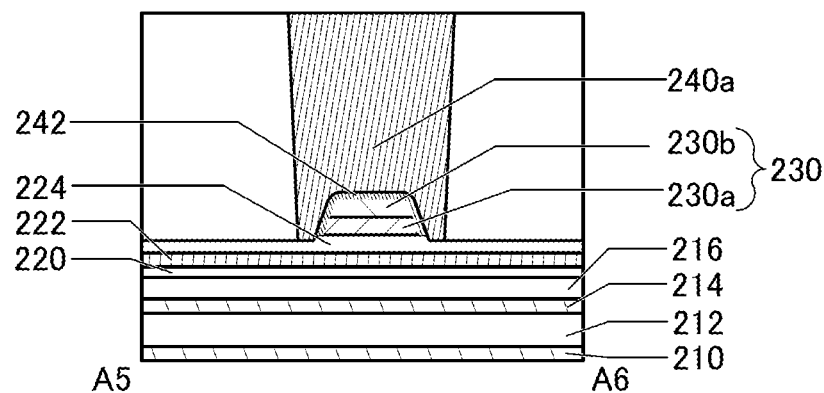
FIGS. 3A to 3C Cross-sectional views of a semiconductor device of one embodiment of the present invention.
Figure 3B:
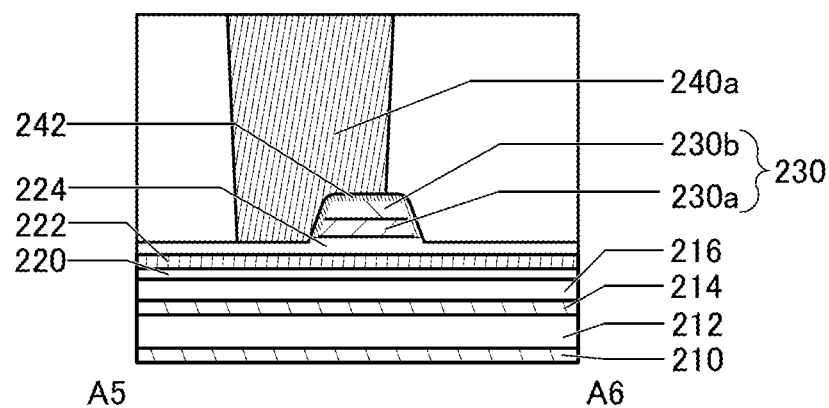
Figure 3C:
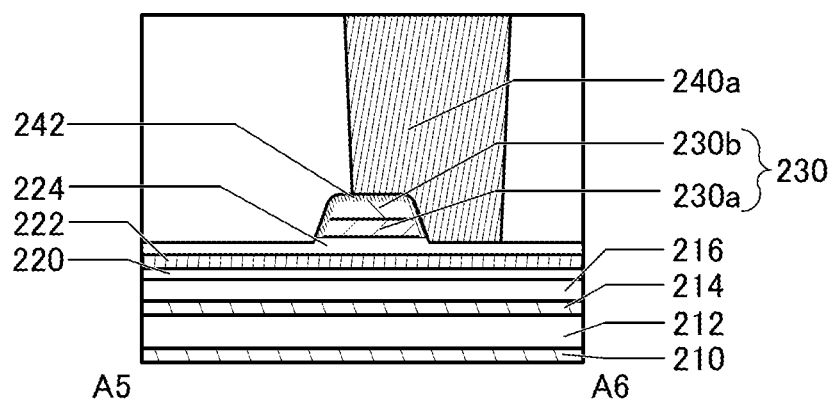

As illustrated in FIG. 3(A), the conductor 240a is in contact with at least the top surface of the oxide 230, and preferably further in contact with the side surface of the oxide 230. It is particularly preferable that the conductor 240a be in contact with one or both of the side surface on the A5 side and the side surface thereof on the A6 side, which intersect with the channel width direction of the oxide 230. In other words, the region where the conductor 240a is in contact with the oxide 230 may have a cross-sectional shape like a saddle (such a structure can be referred to as a saddle-surface contact). Moreover, a structure may be employed in which the conductor 240a is in contact with the side surface on the A1 side, which intersects with the channel length direction of the oxide 230. Note that the region where the conductor 240a is in contact with the oxide 230 is not limited to the example of FIG. 3(A); for example, as illustrated in FIG. 3(B), a region where the conductor 240a is in contact with the top surface of the oxide 230 and the side surface of the oxide 230 on the A5 side may be included. Moreover, a structure may be employed in which the conductor 240a is in contact with the side surface on the A1 side, which intersects with the channel length direction of the oxide 230. Furthermore, as illustrated in FIG. 3(C), the conductor 240a may include a region in contact with the side surface of the oxide 230 on the A6 side. With such a structure, the area of the region where the conductor 240a is in contact with the oxide 230 can be increased and the contact resistance between the conductor 240a and the oxide 230 can be reduced, which is preferable. Thus, miniaturization of the source electrode and the drain electrode of the transistor can be achieved and, in addition, the on-state current can be increased. For the conductor 240a, a conductive material containing tungsten, copper, or aluminum as its main component is preferably used. The conductor 240a may have a stacked-layer structure.

Here, when the opening is formed in the insulator 283, the insulator 282, the insulator 280, and the insulator 273, for example, the layer 242, which is the low-resistance region of the region 231 of the oxide 230, may be removed. In that case, for a conductor used for the conductor 240, it is preferably to use a metal film, a nitride film containing a metal element, or an oxide film containing a metal element. That is, the oxide 230 and the conductor 240 are in contact with each other, whereby another low-resistance region is formed in the oxide 230. Owing to formation of the low-resistance region, the contact resistance between the oxide 230 and the conductor 240 can be reduced. The conductor 240 preferably contains a metal element such as aluminum, ruthenium, titanium, tantalum, or tungsten, for example.

In the case where the conductor 240 has a stacked-layer structure, a conductive material having a function of inhibiting the passage of impurities such as water and hydrogen is preferably used for a conductor in contact with the insulator 283, the insulator 282, the insulator 280, and the insulator 273, like the first conductor of the conductor 205, for example. For example, tantalum, tantalum nitride, titanium, titanium nitride, ruthenium, ruthenium oxide, or the like is preferably used. A single layer or a stacked layer of the conductive material having a function of inhibiting the passage of impurities such as water and hydrogen may be used. With the use of the conductive material, impurities such as hydrogen and water can be inhibited from entering the oxide 230 through the conductor 240a and the conductor 240b from a layer above the insulator 283.

Although not illustrated, a conductor functioning as a wiring may be positioned in contact with the top surface of the conductor 240a and the top surface of the conductor 240b. For the conductor functioning as a wiring, a conductive material containing tungsten, copper, or aluminum as its main component is preferably used. The conductor may have a stacked-layer structure, for example, a stacked layer of any of the above conductive materials and titanium or titanium nitride. Note that like the conductor 203 or the like, the conductor may be formed to be embedded in an opening provided in an insulator.

<Structure Example 2 of Semiconductor Device>

FIG. 4 includes a top view and cross-sectional views of a transistor 200a and a transistor 200b of one embodiment of the present invention and the periphery of the transistors.

Figure 4A:
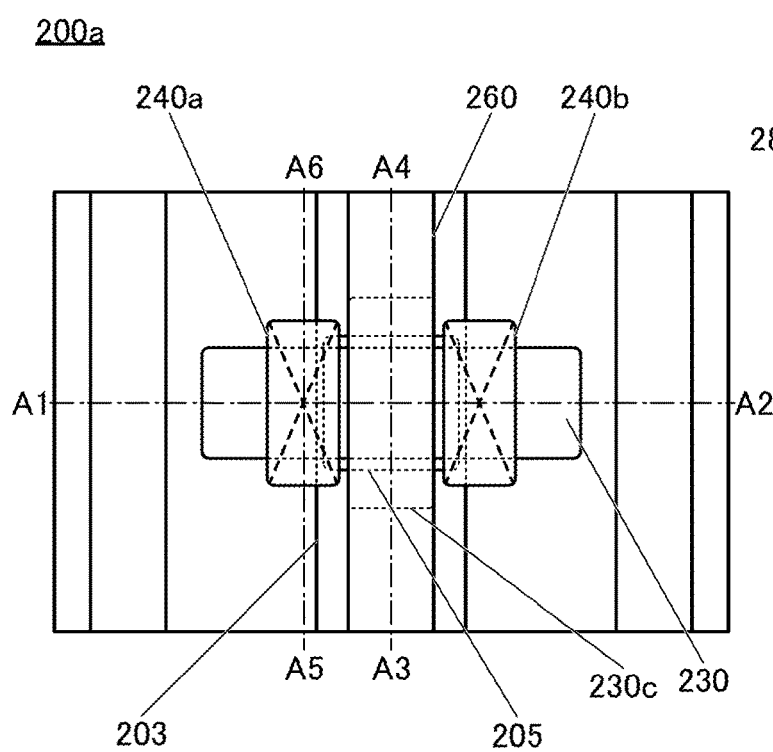
FIGS. 4A to 4C A top view and cross-sectional views of a semiconductor device of one embodiment of the present invention.
Figure 4C:
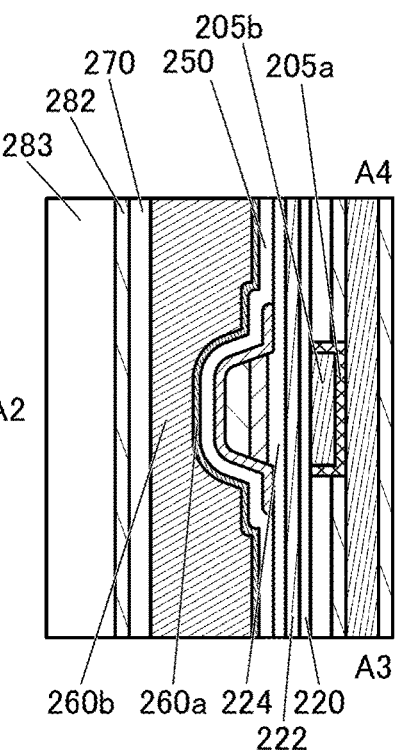
Figure 4B:
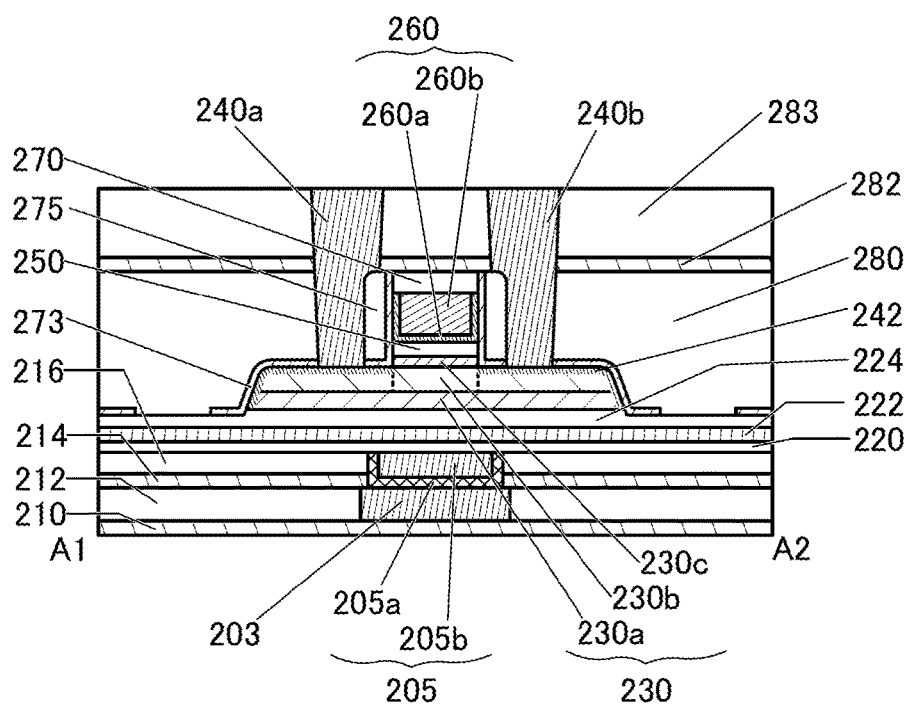

FIG. 4(A) is a top view of a semiconductor device including the transistor 200a. FIG. 4(B) and FIG. 4(C) are cross-sectional views of the semiconductor device. Here, FIG. 4(B) is a cross-sectional view of a portion indicated by a dashed-dotted line A1-A2 in FIG. 4(A), and is a cross-sectional view in the channel length direction of the transistor 200a. FIG. 4(C) is a cross-sectional view of a portion indicated by a dashed-dotted line A3-A4 in FIG. 4(A), and is a cross-sectional view in the channel width direction of the transistor 200a. Note that for simplification of the drawing, some components are not illustrated in the top view in FIG. 4(A).

The semiconductor device of one embodiment of the present invention includes the transistor 200a, and the insulator 210, the insulator 212, the insulator 280, the insulator 282, and the insulator 283 functioning as interlayer films. The semiconductor device also includes the conductor 203 functioning as a wiring and the conductor 240 functioning as a plug, which are electrically connected to the transistor 200a.

Note that the conductor 203 is formed to be embedded in the insulator 212. The level of the top surface of the conductor 203 and the level of the top surface of the insulator 212 can be substantially the same. Note that although a structure in which the conductor 203 is a single layer is illustrated, the present invention is not limited thereto. For example, the conductor 203 may have a stacked-layer structure of two or more layers. Note that in the case where a structure body has a stacked-layer structure, the layers may be distinguished by ordinal numbers corresponding to the formation order.

The conductor 240 is formed in contact with an inner wall of an opening in an insulator 273, the insulator 280, the insulator 282, and the insulator 283. Here, the level of the top surface of the conductor 240 and the level of the top surface of the insulator 283 can be substantially the same. Although a structure in which the conductor 240 of the transistor 200a is a single layer is illustrated, the present invention is not limited thereto. For example, the conductor 240 may have a stacked-layer structure of two or more layers. In addition, the level of the top surface of the conductor 260 and the level of the top surface of the insulator 280 are substantially the same.

[Transistor 200a]

As illustrated in FIG. 4, the transistor 200a includes the insulator 214 and the insulator 216 positioned over a substrate (not illustrated); the conductor 205 positioned to be embedded in the insulator 214 and the insulator 216; the insulator 220 positioned over the insulator 216 and the conductor 205; the insulator 222 positioned over the insulator 220; the insulator 224 positioned over the insulator 222; the oxide 230 (the oxide 230a, the oxide 230b, and the oxide 230c) positioned over the insulator 224; the insulator 250 positioned over the oxide 230; the conductor 260 (the conductor 260a and the conductor 260b) positioned over the insulator 250; an insulator 270 positioned over the conductor 260; an insulator 273 positioned in contact with the top surface of the insulator 224, side surfaces of the oxide 230a, side surfaces of the oxide 230b, the top surface of the oxide 230b, side surfaces of the oxide 230c, the side surfaces of the insulator 250, the side surfaces of the conductor 260, and side surfaces of the insulator 270; and an insulator 275 positioned at side surfaces of the conductor 260 with the insulator 273 therebetween. The insulator 273 includes an opening exposing the insulator 224, and the insulator 280 is in contact with the insulator 224 through the opening. The conductor 260 includes the conductor 260a and the conductor 260b, and the conductor 260a is positioned to cover the bottom surface and the side surfaces of the conductor 260b. Here, as illustrated in FIG. 4(B), a top surface of the insulator 270 is substantially aligned with a top surface of the insulator 273 and top surfaces of the insulator 275.

The transistor 200a is different from the aforementioned transistor 200 in including the insulator 270 and the insulator 275.

For the insulator 270 and the insulator 275, aluminum oxide, silicon oxide, silicon oxynitride, silicon nitride oxide, or silicon nitride can be used, for example.

In addition, the openings in the insulator 283, the insulator 282, the insulator 280, and the insulator 273 are formed to expose the side surfaces of the insulator 275. In order to form such openings, it is preferable that the etching rate of the insulator 275 be much lower than that of the insulator 280 at the time of forming the openings in the insulator 282 and the insulator 280. When the etching rate of the insulator 275 is set to 1, the etching rate of the insulator 280 is preferably set to 5 or more, further preferably 10 or more. In such a manner, the opening can be formed in a self-aligned manner, a margin for alignment of the opening and the gate electrode can be increased, and the distance between the opening and the gate electrode can be designed to be small; thus, the semiconductor device can be highly integrated. In the structure of the transistor 200a that is one embodiment of the present invention, for example, it is possible to prevent an electrical short circuit between the conductor 260 and the conductor 240a or the conductor 240b even in the case where the opening is shifted to a position overlapping with the top surface of the insulator 270 at the time of forming the opening. That is, the etching rate of the insulator 270 is preferably much lower than the etching rate of the insulator 280, similarly to that of the insulator 275, at the time of forming the opening. Thus, a material similar to that for the insulator 275 can be used for the insulator 270.

Here, the conductor 240a and the conductor 240b are positioned in the openings formed in the insulator 283, the insulator 282, the insulator 280, and the insulator 273. The conductor 240a and the conductor 240b are provided to face each other with the conductor 260 sandwiched therebetween. Note that the top surfaces of the conductor 240a and the conductor 240b may be on the same surface as the top surface of the insulator 283.

The conductor 240a is in contact with the region 231a functioning as one of the source region and the drain region of the transistor 200a, and the conductor 240b is in contact with the region 231b functioning as the other of the source region and the drain region of the transistor 200a. Thus, the conductor 240a can function as one of a source electrode and a drain electrode, and the conductor 240b can function as the other of the source electrode and the drain electrode.

Note that the conductor 240a is formed in contact with the inner wall of the opening in the insulator 283, the insulator 282, the insulator 280, and the insulator 273. The region 231a of the oxide 230 is positioned on at least part of a bottom of the opening, and thus the conductor 240a is in contact with the region 231a. Similarly, the conductor 240b is formed in contact with the inner wall of the opening in the insulator 283, the insulator 282, the insulator 280, and the insulator 273. The region 231b of the oxide 230 is positioned on at least part of a bottom of the opening, and thus the conductor 240b is in contact with the region 231b.

As illustrated in FIG. 4(B), parasitic capacitance is formed between the conductor 260 and the conductor 240a in the transistor 200a. Similarly, parasitic capacitance is formed between the conductor 260 and the conductor 240b. The parasitic capacitance is reduced by increasing the thickness of the insulator positioned between the conductor 260 and the conductor 240a (the conductor 240b) in the channel length direction.

Thus, the parasitic capacitance can be reduced by providing the insulator 275 as well as the insulator 273 in the transistor 200a. The sum of the thickness of the insulator 275 in the channel length direction and the thickness of the insulator 273 in the channel length direction, which is converted into the thickness of a silicon oxide film (EOT: Equivalent Oxide Thickness), is set to 10 nm or more and 50 nm or less, preferably 15 nm or more and 30 nm or less. Moreover, aluminum oxide, silicon oxide, silicon oxynitride, silicon nitride oxide, or silicon nitride can be used for the insulator 275, for example. The reduction in the parasitic capacitance leads to high-speed operation of the transistor 200a. The description of the transistor 200 can be referred to for the other components and effects of the transistor 200a.

<Constituent Material of Semiconductor Device>

Constituent materials that can be used for a semiconductor device will be described below.

<Substrate>

As a substrate over which the transistor 200 and the transistor 200a are formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Moreover, a semiconductor substrate in which an insulator region is included in the above semiconductor substrate, e.g., an SOI (Silicon On Insulator) substrate or the like is used. Examples of the conductor substrate include a graphite substrate, a metal substrate, an alloy substrate, and a conductive resin substrate. Alternatively, a substrate including a metal nitride, a substrate including a metal oxide, or the like is used. Moreover, an insulator substrate provided with a conductor or a semiconductor, a semiconductor substrate provided with a conductor or an insulator, a conductor substrate provided with a semiconductor or an insulator, or the like is used. Alternatively, any of these substrates provided with an element may be used. Examples of the element provided over the substrate include a capacitor, a resistor, a switching element, a light-emitting element, and a memory element.

Alternatively, a flexible substrate may be used as the substrate. Note that as a method for providing a transistor over a flexible substrate, there is a method in which a transistor is fabricated over a non-flexible substrate and then the transistor is separated from the non-flexible substrate and transferred to a substrate that is a flexible substrate. In that case, a separation layer is preferably provided between the non-flexible substrate and the transistor. In addition, the substrate may have elasticity. Furthermore, the substrate may have a property of returning to its original shape when bending or pulling is stopped. Alternatively, the substrate may have a property of not returning to its original shape. The substrate has a region with a thickness of, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate has a small thickness, the weight of the semiconductor device including the transistor can be reduced. Moreover, when the substrate has a small thickness, even in the case of using glass or the like, the substrate may have elasticity or a property of returning to its original shape when bending or pulling is stopped. Thus, an impact applied to a semiconductor device over the substrate, which is caused by dropping or the like, can be reduced. That is, a durable semiconductor device can be provided.

For the substrate that is a flexible substrate, for example, a metal, an alloy, a resin, glass, or fiber thereof can be used. Note that as the substrate, a sheet, a film, a foil, or the like that contains a fiber may be used. The substrate that is a flexible substrate preferably has a lower coefficient of linear expansion because deformation due to an environment is inhibited. For the substrate that is a flexible substrate, for example, a material whose coefficient of linear expansion is lower than or equal to $1\times10^{-3}$/K, lower than or equal to $5\times10^{-5}$/K, or lower than or equal to $1\times10^{-5}$/K may be used. Examples of the resin include polyester, polyolefin, polyamide (nylon, aramid, or the like), polyimide, polycarbonate, and acrylic. In particular, aramid is suitable for the substrate that is a flexible substrate because of its low coefficient of linear expansion.

<Insulator>

Examples of an insulator include an oxide, a nitride, an oxynitride, a nitride oxide, a metal oxide, a metal oxynitride, and a metal nitride oxide, each of which has an insulating property.

With miniaturization and high integration of a transistor, for example, a problem of leakage current or the like may arise because of a thinner gate insulator. When a high-k material is used for the insulator functioning as a gate insulator, the voltage when the transistor is operated can be reduced while the physical thickness of the gate insulator is kept. By contrast, when a material having a low dielectric constant is used for the insulator functioning as an interlayer film, the parasitic capacitance generated between wirings can be reduced. Thus, a material is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

In particular, silicon oxide and silicon oxynitride are thermally stable. Accordingly, a stacked-layer structure which is thermally stable and has a low dielectric constant can be obtained by combining silicon oxide or silicon oxynitride with a resin, for example. Examples of the resin include polyester, polyolefin, polyamide (e.g., nylon or aramid), polyimide, polycarbonate, and acrylic. A stacked-layer structure which is thermally stable and has a high dielectric constant can be obtained by combining silicon oxide and silicon oxynitride with an insulator having high dielectric constant.

The transistor using an oxide semiconductor is surrounded by an insulator having a function of inhibiting the passage of oxygen and impurities such as hydrogen, whereby the electrical characteristics of the transistor can be stable.

As an insulator having a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have a high barrier property. Therefore, the amount of added hydrogen and nitrogen can be adjusted appropriately by adjusting the thickness of hafnium oxide.

For example, the insulator 224 and the insulator 250 functioning as part of the gate insulator are each preferably an insulator including an excess-oxygen region. When a structure is employed in which silicon oxide or silicon oxynitride including an excess-oxygen region is in contact with the oxide 230, oxygen vacancies included in the oxide 230 can be compensated for.

For example, an insulator containing an oxide of one or a plurality of kinds of aluminum, hafnium, and gallium can be used for the insulator 222 functioning as part of the gate insulator. In particular, it is preferable to use aluminum oxide, hafnium oxide, an oxide containing aluminum and hafnium (hafnium aluminate), or the like as an insulator containing an oxide of one or both of aluminum and hafnium.

For example, silicon oxide or silicon oxynitride, which is thermally stable, is preferably used for the insulator 220. When the gate insulator has a stacked-layer structure of a thermally stable film and a film with a high dielectric constant, the equivalent oxide thickness (EOT) of the gate insulator can be reduced while the physical thickness of the gate insulator is kept.

With the above stacked-layer structure, on-state current can be increased without reduction in the influence of the electric field from the gate electrode. Since the distance between the gate electrode and the region where a channel is formed is kept by the physical thickness of the gate insulator, leakage current between the gate electrode and the channel formation region can be inhibited.

The insulator 212, the insulator 216, the insulator 270, the insulator 275, the insulator 280, and the insulator 283 each preferably include an insulator having a low dielectric constant. For example, the insulator 212, the insulator 216, the insulator 270 the insulator 275, the insulator 280, and the insulator 283 each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 212, the insulator 216, the insulator 270, the insulator 275, the insulator 280, and the insulator 283 each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (e.g., nylon or aramid), polyimide, polycarbonate, and acrylic.

For the insulator 210, the insulator 214, the insulator 222, the insulator 273, and the insulator 282, an insulator having a function of inhibiting the passage of oxygen and impurities such as hydrogen is used. For the insulator 210, the insulator 214, the insulator 222, the insulator 273, and the insulator 282, a metal oxide such as aluminum oxide, hafnium oxide, magnesium oxide, gallium oxide, germanium oxide, yttrium oxide, zirconium oxide, lanthanum oxide, neodymium oxide, or tantalum oxide, silicon nitride oxide, silicon nitride, or the like is used, for example.

<Conductor>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed.

Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used in the channel formation region of the transistor, a stacked-layer structure combining a material containing any of the above-described metal elements and a conductive material containing oxygen is preferably used for the conductor functioning as the gate electrode. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where a channel is formed can be trapped in some cases. Alternatively, hydrogen entering from an external insulator or the like can be captured in some cases.

For the conductor 260, the conductor 203, the conductor 205, and the conductor 240, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

<Metal Oxide>

As the oxide 230, a metal oxide functioning as an oxide semiconductor (hereinafter also referred to as an oxide semiconductor) is preferably used. A metal oxide that can be used for the oxide 230 of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or a plurality of kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer.

Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In some cases, IGZO has a stable structure when formed of smaller crystals (e.g., the above-described nanocrystals) rather than larger crystals (here, crystals with a size of several millimeters or several centimeters) because crystal growth tends to hardly occur particularly in the air.

An a-like OS is a metal oxide having a structure between those of the nc-OS and an amorphous oxide semiconductor.

The a-like OS includes a void or a low-density region. That is, the a-like OS has low crystallinity as compared with the nc-OS and the CAAC-OS.

An oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor will be described.

Note that when the above metal oxide is used in a channel formation region of a transistor, the transistor having high field-effect mobility can be achieved. In addition, the transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

Note that as a metal oxide used for a semiconductor of a transistor, a thin film having high crystallinity is preferably used. With the use of the thin film, the stability or the reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, the manufacturing cost is increased, and in addition, the throughput is decreased.

Non-Patent Document 1 and Non-Patent Document 2 have reported that an In—Ga—Zn oxide having a CAAC structure (referred to as CAAC-IGZO) was found in 2009. It has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, in 2013, an In—Ga—Zn oxide having an nc structure (referred to as nc-IGZO) was found (see Non-Patent Document 3). It has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown a change in average crystal size due to electron beam irradiation to thin films of the above CAAC-IGZO, the above nc-IGZO, and IGZO having low crystallinity. In the thin film of IGZO having low crystallinity, crystalline IGZO with a crystal size of approximately 1 nm was observed even before the electron beam irradiation. Thus, it has been reported that the existence of a completely amorphous structure was not observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for a semiconductor of a transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a low-power-consumption CPU utilizing a characteristic of low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as driving frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate enables the power consumption of the display device to be reduced. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the characteristics of a low leakage current of the transistor have been studied.

[Impurities]

Here, the influence of each impurity in the metal oxide will be described.

When silicon or carbon that is a Group 14 element is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier density. As a result, a transistor using a metal oxide containing nitrogen in its channel formation region is likely to have normally-on characteristics. Thus, nitrogen in the channel formation region in the metal oxide is preferably reduced as much as possible. For example, the nitrogen concentration in the metal oxide is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Hydrogen contained in a metal oxide forms shallow defect states (sDOS: shallow level Density of States) in the metal oxide in some cases. Shallow defect states refer to interface states near the conduction band minimum. Shallow defect states probably exist near the boundary between a high-density region and a low-density region in the metal oxide. Here, the high-density region and the low-density region in the metal oxide are distinguished by the amount of hydrogen contained in the region. That is, the high-density region is a region that contains more hydrogen than the low-density region. It is probable that near the boundary between the high-density region and the low-density region in the metal oxide, stress distortion between the regions easily causes minute cracks, oxygen vacancies and dangling bonds of indium are generated near the cracks, and impurities such as hydrogen and water are localized there to form shallow defect states.

The high-density region in the metal oxide sometimes has higher crystallinity than the low-density region. Furthermore, the high-density region in the metal oxide sometimes has higher film density than the low-density region. When the metal oxide has a composition including indium, gallium, and zinc, the high-density region contains indium, gallium, and zinc and the low-density region contains indium and zinc, in some cases. In other words, the proportion of gallium in the low-density region is lower than that in the high-density region in some cases.

Note that such shallow defect states probably result from oxygen vacancies. When the oxygen vacancies in the metal oxide increase, the density of deep defect states (dDOS: deep level Density of States) as well as the density of shallow defect states probably increase. This is probably because deep defect states also result from oxygen vacancies. Note that deep defect states refer to defect states that are located around the center of the band gap.

Therefore, a reduction in the number of oxygen vacancies in the metal oxide can lead to a reduction in both densities of states: shallow defect states and deep defect states. Furthermore, shallow defect states can probably be controlled to some extent by adjusting the temperature at the time of deposition of the metal oxide. Specifically, the temperature at the time of deposition of the metal oxide is set to 170° C. or its vicinity, preferably 130° C. or its vicinity, further preferably room temperature, whereby the density of shallow defect states can be reduced.

Shallow defect states in a metal oxide affect the electrical characteristics of a transistor using the metal oxide as a semiconductor. In other words, owing to shallow defect states, the drain current $I_d$ changes gently with respect to the gate voltage $V_g$ in the drain current-gate voltage ($I_d$-$V_g$) characteristics of the transistor, worsening the S value (also referred to as Subthreshold Swing or SS), which is one of criteria for judging the rising characteristics of a transistor from an off state to an on state. This is probably because electrons are trapped by shallow defect states.

Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

[Effect of Vacuum Baking]

Here, a weak Zn—O bond included in the metal oxide will be described and an example of a method for reducing the number of oxygen atoms and zinc atoms which form the bond will be shown.

In a transistor using a metal oxide, oxygen vacancies are given as an example of a defect which leads to poor electrical characteristics of the transistor. For example, the threshold voltage of a transistor using a metal oxide which includes oxygen vacancies in the film tends to shift in the negative direction, and thus the transistor tends to have normally-on characteristics. This is because a donor caused by oxygen vacancies included in the metal oxide is generated and the carrier concentration increases. The transistor having normally-on characteristics causes various problems; for example, a malfunction is likely to occur in an operation state and power consumption in a non-operation state is increased.

Furthermore, there are problems of degradation of the electrical characteristics of the transistor, such as variation in the threshold voltage and an increase in parasitic resistance due to thermal budget in the step of forming the connection wiring in fabricating a module, and an increase in variation in the electrical characteristics due to such degradation. Since these problems directly lead to a decrease in manufacturing yield, it is important to consider countermeasures. Furthermore, degradation of the electrical characteristics of the transistor occurs through a stress test, which can evaluate a change in transistor characteristics by long-term use (i.e., a change over time) in a short time. The degradation of the electrical characteristics is presumably caused by oxygen vacancies in the metal oxide due to high-temperature treatment performed in the manufacturing process or electrical stress applied during the stress test.

In the metal oxide, there is an oxygen atom which weakly bonds to a metal atom and thus is likely to form an oxygen vacancy. In particular, in the case where the metal oxide is an In—Ga—Zn oxide, a zinc atom and an oxygen atom are likely to form a weak bond (also referred to as a weak Zn—O bond). Here, the weak Zn—O bond means a bond generated between a zinc atom and an oxygen atom, which is weak enough to be broken by high-temperature treatment performed in the manufacturing process or electrical stress applied during the stress test. When the weak Zn—O bond exists in the metal oxide, the bond is broken by thermal budget or current stress, so that an oxygen vacancy is formed. The formation of the oxygen vacancy decreases the stability of the transistor such as resistance to thermal budget and resistance to electrical stress.

The bond generated between an oxygen atom bonded to many zinc atoms and the zinc atoms is the weak Zn—O bond in some cases. A zinc atom bonds to an oxygen atom more weakly than a gallium atom does. Thus, an oxygen atom bonded to many zinc atoms is likely to form a vacancy. That is, it is supposed that the bond generated between a zinc atom and an oxygen atom is weaker than the bond between an oxygen atom and other metal.

It is also supposed that the weak Zn—O bond is likely to be formed when impurities exist in the metal oxide. Examples of the impurities in the metal oxide include a water molecule and hydrogen. When a water molecule or hydrogen exists in the metal oxide, the hydrogen atom bonds to an oxygen atom included in the metal oxide (such a bond is also referred to as an OH bond) in some cases. In the case where the In—Ga—Zn oxide is a single crystal, an oxygen atom included in the metal oxide is bonded to four metal atoms included in the metal oxide. However, an oxygen atom bonded to the hydrogen atom is bonded to two or three metal atoms in some cases. When the number of metal atoms bonded to the oxygen atom is decreased, the oxygen atom is likely to form a vacancy. Note that when a zinc atom is bonded to an oxygen atom which forms an OH bond, the bond between the oxygen atom and the zinc atom is probably weak.

Note that the weak Zn—O bond is sometimes formed in a distortion that exists in a region where a plurality of nanocrystals are connected. Although nanocrystal is basically a hexagon, a pentagonal lattice arrangement, a heptagonal lattice arrangement, or the like is included in the distortion. It is supposed that the weak Zn—O bond is formed in the distortion because the bond distances between atoms are not uniform therein.

It is also supposed that the weak Zn—O bond is likely to be formed in the case where the metal oxide has low crystallinity. In the case where the metal oxide has high crystallinity, a zinc atom included in the metal oxide is bonded to four or five oxygen atoms. However, when the crystallinity of the metal oxide becomes lower, the number of oxygen atoms bonded to a zinc atom tends to decrease. When the number of oxygen atoms bonded to a zinc atom decreases, the zinc atom is likely to form a vacancy. That is, a bond generated between the zinc atom and the oxygen atom is probably weaker than that generated in a single crystal.

The number of oxygen atoms and zinc atoms which form the weak Zn—O bonds is reduced, whereby formation of oxygen vacancies due to the thermal budget or the electrical stress can be inhibited, leading to an improvement in stability of a transistor. Note that in the case where only the number of oxygen atoms that form the weak Zn—O bonds is reduced and the number of zinc atoms that form the weak Zn—O bonds is not reduced, a weak Zn—O bond is formed again in some cases when an oxygen atom is supplied to the vicinity of the zinc atom. Therefore, it is preferable to reduce the number of zinc atoms and oxygen atoms that form the weak Zn—O bonds.

As a method for reducing the number of oxygen atoms and zinc atoms that form the weak Zn—O bonds, a method in which vacuum baking is performed after the formation of a metal oxide can be given. Note that the vacuum baking is heat treatment performed under a vacuum atmosphere. A vacuum atmosphere is kept by evacuation with a turbo-molecular pump or the like. The pressure in the treatment chamber is preferably lower than or equal to $1 \times 10^{-2}$ Pa, further preferably lower than or equal to $1 \times 10^{-3}$ Pa. The substrate temperature in the heat treatment is higher than or equal to 300° C., preferably higher than or equal to 400° C.

Performing the vacuum baking can reduce the number of oxygen atoms and zinc atoms that form the weak Zn—O bonds. Furthermore, since the metal oxide is heated by vacuum baking, atoms included in the metal oxide are rearranged after the number of oxygen atoms and zinc atoms that form the weak Zn—O bonds is reduced, so that the number of oxygen atoms each bonded to four metal atoms is increased. Accordingly, the number of oxygen atoms and zinc atoms that form the weak Zn—O bonds can be reduced, and a weak Zn—O bond can be inhibited from being formed again.

Furthermore, when impurities exist in the metal oxide, performing the vacuum baking can release water molecules or hydrogen in the metal oxide, so that the number of OH bonds can be reduced. When the number of OH bonds in the metal oxide is reduced, the proportion of the oxygen atoms each bonded to four metal atoms is increased. Furthermore, atoms included in the metal oxide are rearranged when water molecules or hydrogen is released, so that the number of the oxygen atoms each bonded to four metal atoms is increased. Thus, a weak Zn—O bond can be inhibited from being formed again.

As described above, when vacuum baking is performed after the metal oxide is deposited, the number of oxygen atoms and zinc atoms that form the weak Zn—O bonds can be reduced. Thus, stability of the transistor can be improved through the step. Furthermore, when the stability of the transistor is improved, materials and formation methods can be selected more freely.

<Method 1 for Fabricating Semiconductor Device>

Next, a method for fabricating a semiconductor device including the transistor 200 of the present invention, which is illustrated in FIG. 1, will be described with reference to FIG. 6 to FIG. 20. In FIG. 6 to FIG. 20, (A) of each drawing is a top view. Moreover, (B) of each drawing is a cross-sectional view corresponding to a portion indicated by a dashed-dotted line A1-A2 in (A), and is also a cross-sectional view in the channel length direction of the transistor 200. Furthermore, (C) of each drawing is a cross-sectional view corresponding to a portion indicated by a dashed-dotted line A3-A4 in (A), and is also a cross-sectional view in the channel width direction of the transistor 200. Note that for simplification of the drawings, some components are not illustrated in the top view of (A) of each drawing.

First, a substrate (not illustrated) is prepared and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object. For example, a wiring, an electrode, an element (e.g., transistor or capacitor), or the like included in a semiconductor device might be charged up by receiving charges from plasma. In this case, accumulated charges might break the wiring, electrode, element, or the like included in the semiconductor device. By contrast, in the case of a thermal CVD method that does not use plasma, such plasma damage is not caused and the yield of the semiconductor device can be increased. Furthermore, a thermal CVD method does not cause plasma damage during deposition, so that a film with few defects can be obtained.

An ALD method is also a deposition method which enables less plasma damage to an object. An ALD method also does not cause plasma damage during deposition, so that a film with few defects can be obtained. Note that a precursor used in an ALD method sometimes contains impurities such as carbon. Thus, a film provided by an ALD method contains impurities such as carbon in a larger amount than a film provided by another deposition method, in some cases. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and thus is suitable for covering a surface of an opening with a high aspect ratio, for example. On the other hand, an ALD method has a relatively low deposition rate; thus, it is sometimes preferable to combine an ALD method with another deposition method with a high deposition rate such as a CVD method.

A CVD method and an ALD method enable control of the composition of a film to be obtained with a flow rate ratio of the source gases. For example, by a CVD method or an ALD method, a film with a certain composition can be deposited depending on a flow rate ratio of the source gases. Moreover, by a CVD method or an ALD method, by changing the flow rate ratio of the source gases during the deposition, a film whose composition is continuously changed can be deposited. In the case of depositing while changing the flow rate ratio of the source gases, as compared with the case of depositing with the use of a plurality of deposition chambers, time taken for the deposition can be shortened because time taken for transfer and pressure adjustment is omitted. Thus, productivity of semiconductor devices can be improved in some cases.

In this embodiment, for the insulator 210, aluminum oxide is deposited by a sputtering method. The insulator 210 may have a multilayer structure. For example, a structure may be employed in which aluminum oxide is deposited by a sputtering method and another aluminum oxide is deposited over the aluminum oxide by an ALD method. Alternatively, a structure may be employed in which aluminum oxide is deposited by an ALD method and another aluminum oxide is deposited over the aluminum oxide by a sputtering method.

Then, a conductive film to be the conductor 203 is deposited over the insulator 210. The conductive film to be the conductor 203 can be deposited by a sputtering method, a CVD method, an MBE method, a PLD method, an ALD method, or the like. The conductive film to be the conductor 203 can be a multilayer film. In this embodiment, tungsten is deposited as the conductive film to be the conductor 203.

Next, the conductive film to be the conductor 203 is processed by a lithography method, so that the conductor 203 is formed.

In the lithography method, first, a resist is exposed to light through a mask. Next, a region exposed to light is removed or left using a developing solution, so that a resist mask is formed. Then, etching treatment through the resist mask is conducted, whereby a conductor, a semiconductor, an insulator, or the like can be processed into a desired shape. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

A hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 203, forming a resist mask thereover, and then etching the hard mask material. The etching of the conductive film to be the conductor 203 may be performed after removal of the resist mask or with the resist mask remaining. In the latter case, the resist mask sometimes disappears during the etching. The hard mask may be removed by etching after the etching of the conductive film to be the conductor 203. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may employed in which different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is deposited over the insulator 210 and the conductor 203. The insulator to be the insulator 212 can be deposited by a sputtering method, a CVD method, an MBE method, a PLD method, an ALD method, or the like. In this embodiment, as the insulating film to be the insulator 212, silicon oxide is deposited by a CVD method.

Here, the thickness of the insulating film to be the insulator 212 is preferably greater than or equal to the thickness of the conductor 203. For example, when the thickness of the conductor 203 is 1, the thickness of the insulating film to be the insulator 212 is greater than or equal to 1 and less than or equal to 3. In this embodiment, the thickness of the thickness of the conductor 203 is 150 nm and the thickness of the thickness of the insulating film to be the insulator 212 is 350 nm.

Next, CMP (Chemical Mechanical Polishing) treatment is performed on the insulating film to be the insulator 212, so that part of the insulating film to be the insulator 212 is removed and a surface of the conductor 203 is exposed. Thus, the conductor 203 and the insulator 212 whose top surfaces are flat can be formed (see FIG. 6).

Here, a method for forming the conductor 203 that is different from the above is described below.

The insulator 212 is deposited over the insulator 210. The insulator 212 can be deposited by a sputtering method, a CVD method, an MBE method, a PLD method, an ALD method, or the like.

Then, an opening reaching the insulator 210 is formed in the insulator 212. Examples of the opening include a groove and a slit. A region where the opening is formed may be referred to as an opening portion. Wet etching can be used for the formation of the openings; however, dry etching is preferably used for microfabrication. As the insulator 210, it is preferable to select an insulator that functions as an etching stopper film used in forming the groove by etching the insulator 212. For example, in the case where a silicon oxide film is used as the insulator 212 in which the groove is to be formed, a silicon nitride film, an aluminum oxide film, or a hafnium oxide film is preferably used as the insulator 210.

After the formation of the opening, the conductive film to be the conductor 203 is deposited. The conductive film desirably includes a conductor that has a function of inhibiting the passage of oxygen. For example, tantalum nitride, tungsten nitride, or titanium nitride can be used. Alternatively, a stacked film of the conductor and tantalum, tungsten, titanium, molybdenum, aluminum, copper, or a molybdenum-tungsten alloy can be used. The conductive film to be the conductor 203 can be deposited by a sputtering method, a CVD method, an MBE method, a PLD method, an ALD method, or the like.

In this embodiment, the conductive film to be the conductor 203 has a multilayer structure. First, tantalum nitride is deposited by a sputtering method. Alternatively, a film in which titanium nitride is stacked over the tantalum nitride is deposited. With the use of such metal nitride for a lower layer of the conductive film to be the conductor 203, a metal that is easily diffused, such as copper, can be prevented from diffusing to the outside from the conductor 203 even when the metal is used for an upper layer of the conductive film to be the conductor 203 that is described below.

Next, a conductive film of the upper layer of the conductive film to be the conductor 203 is deposited. The conductive film can be deposited by a plating method, a sputtering method, a CVD method, an MBE method, a PLD method, an ALD method, or the like. In this embodiment, for the conductive film of the upper layer of the conductive film to be the conductor 203, a low-resistance conductive material such as copper is deposited.

Next, CMP treatment is performed to remove parts of the upper layer of the conductive film to be the conductor 203 and the lower layer of the conductive film to be the conductor 203, so that the insulator 212 is exposed. As a result, the conductive film to be the conductor 203 remains only in the opening portion. Thus, the conductor 203 whose top surface is flat can be formed. Note that the insulator 212 is partly removed by the CMP treatment in some cases. The above is the different method for forming the conductor 203.

Next, the insulator 214 is deposited over the insulator 212 and the conductor 203. The insulator 214 can be deposited by a sputtering method, a CVD method, an MBE method, a PLD method, an ALD method, or the like. In this embodiment, for the insulator 214, silicon nitride is deposited by a CVD method. As described here, an insulator through which copper is less likely to pass, such as silicon nitride, is used for the insulator 214; accordingly, even when a metal that is easily diffused, such as copper, is used for the second conductor of the conductor 203, the metal can be inhibited from being diffused into layers above the insulator 214.

Next, the insulator 216 is deposited over the insulator 214. The insulator 216 can be deposited by a sputtering method, a CVD method, an MBE method, a PLD method, an ALD method, or the like. In this embodiment, for the insulator 216, silicon oxide is deposited by a CVD method.

Next, an opening reaching the conductor 203 is formed in the insulator 214 and the insulator 216. A wet etching method may be used for the formation of the opening; however, a dry etching method is preferably used for microfabrication.

After the formation of the opening, a conductive film to be the conductor 205a is deposited. The conductive film to be the conductor 205a preferably includes a conductive material that has a function of inhibiting the passage of oxygen. For example, tantalum nitride, tungsten nitride, or titanium nitride can be used. Alternatively, a stacked film of the conductor and tantalum, tungsten, titanium, molybdenum, aluminum, copper, or a molybdenum-tungsten alloy can be used. The conductive film to be the conductor 205a can be deposited by a sputtering method, a CVD method, an MBE method, a PLD method, an ALD method, or the like.

In this embodiment, for the conductive film to be the conductor 205a, tantalum nitride is deposited by a sputtering method.

Next, a conductive film to be the conductor 205b is deposited over the conductive film to be the conductor 205a. The conductive film can be deposited by a sputtering method, a CVD method, an MBE method, a PLD method, an ALD method, or the like.

In this embodiment, for the conductive film to be the conductor 205b, titanium nitride is deposited by a CVD method and tungsten is deposited by a CVD method over the titanium nitride.

Next, CMP treatment is performed to remove parts of the conductive film to be the conductor 205a and the conductive film to be the conductor 205b, so that the insulator 216 is exposed. As a result, the conductive film to be the conductor 205a and the conductive film to be the conductor 205b remain only in the opening portion. Thus, the conductor 205 including the conductor 205a and the conductor 205b, which has a flat top surface, can be formed (see FIG. 6). Note that the insulator 216 is partly removed by the CMP treatment in some cases.

Next, the insulator 220 is deposited over the insulator 216 and the conductor 205. The insulator 220 can be deposited by a sputtering method, a CVD method, an MBE method, a PLD method, an ALD method, or the like. In this embodiment, for the insulator 220, silicon oxide is deposited by a CVD method.

Next, the insulator 222 is deposited over the insulator 220. An insulator containing an oxide of one or both of aluminum and hafnium is preferably deposited for the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in structure bodies provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Then, an insulating film 224A is deposited over the insulator 222. The insulating film 224A can be deposited by a sputtering method, a CVD method, an MBE method, a PLD method, an ALD method, or the like (see FIG. 6). In this embodiment, for the insulator film 224A, silicon oxide is deposited by a CVD method.

Sequentially, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen atmosphere, an inert gas atmosphere, or an atmosphere containing an oxidizing gas at 10 ppm or more, 1% or more, or 10% or more. Alternatively, the heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen.

In this embodiment, heat treatment is performed at 400° C. in a nitrogen atmosphere for one hour after the deposition of the insulating film 224A. By the heat treatment, impurities such as hydrogen and water contained in the insulating film 224A can be removed, for example.

This heat treatment can also be performed after the deposition of the insulator 220 and after the deposition of the insulator 222. Although the conditions for the above-described heat treatment can be used for the heat treatment, the heat treatment after the deposition of the insulator 220 is preferably performed in an atmosphere containing nitrogen.

Here, in order to form an excess-oxygen region in the insulating film 224A, plasma treatment containing oxygen may be performed under a reduced pressure. The plasma treatment containing oxygen is preferably performed using an apparatus including a power source for generating high-density plasma using microwaves, for example. Alternatively, a power source for applying an RF (Radio Frequency) to a substrate side may be included. The use of high-density plasma enables high-density oxygen radicals to be produced, and RF application to the substrate side allows the oxygen radicals generated by the high-density plasma to be efficiently introduced into the insulating film 224A. Alternatively, after plasma treatment containing an inert gas is performed with this apparatus, plasma treatment containing oxygen may be performed to compensate for released oxygen. Note that impurities such as hydrogen and water contained in the insulating film 224A can be removed by selecting the conditions for the plasma treatment appropriately. In that case, the heat treatment is not necessarily performed.

Figure 6A:
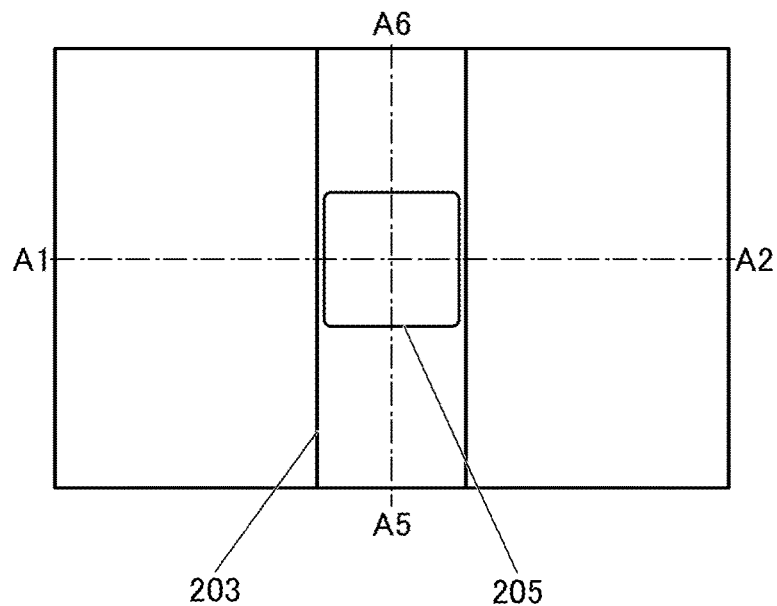
FIGS. 6A to 6C A top view and cross-sectional views illustrating a method for fabricating a semiconductor device of one embodiment of the present invention.
Figure 6C:
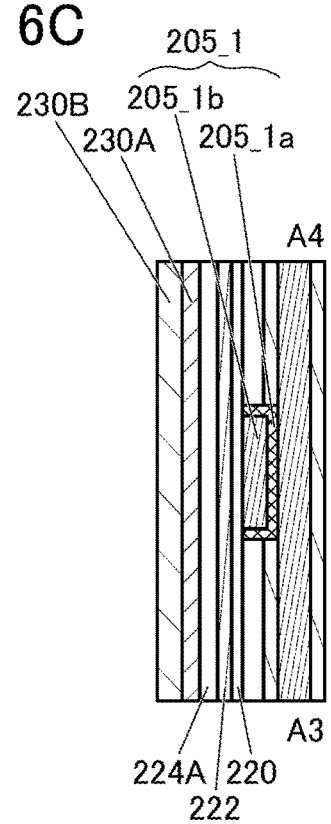
Figure 6B:
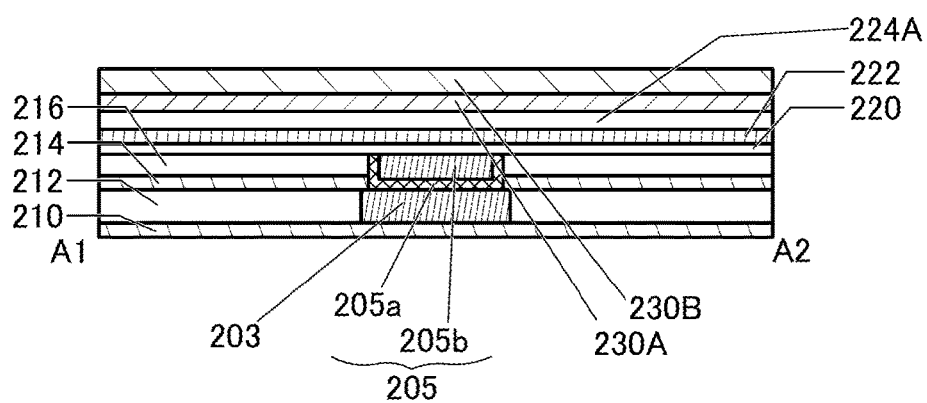
Figure 7A:
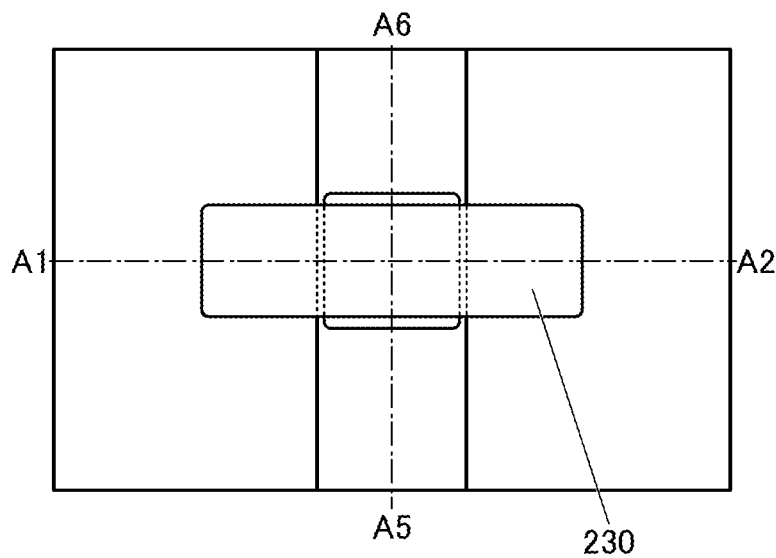
FIGS. 7A to 7C A top view and cross-sectional views illustrating a method for fabricating a semiconductor device of one embodiment of the present invention.
Figure 7C:
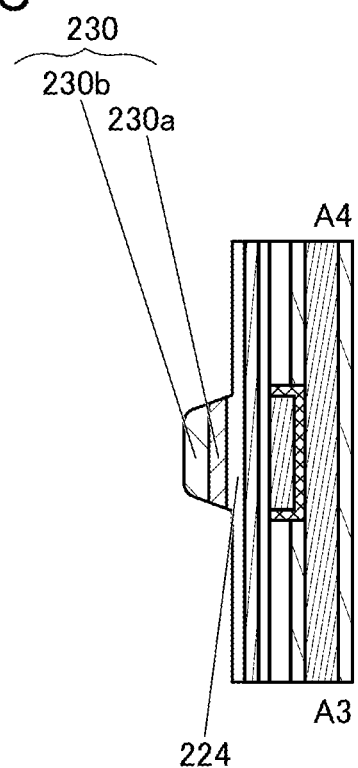
Figure 7B:
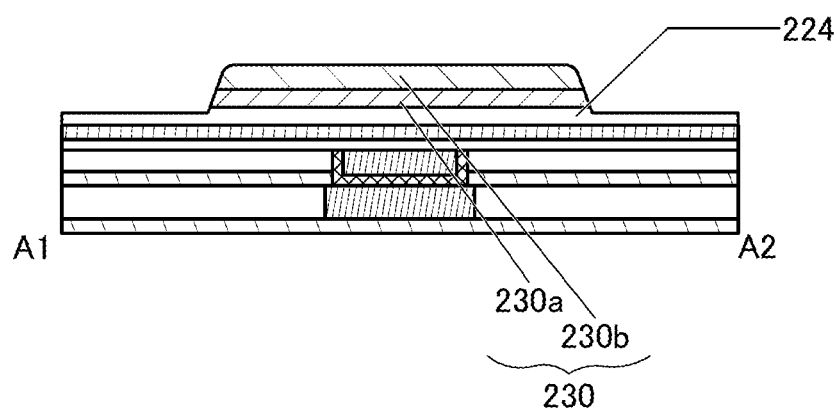

Next, an oxide film 230A and an oxide film 230B are deposited in this order over the insulating film 224A (see FIG. 6). Note that the oxide films are preferably deposited successively without being exposed to an air atmosphere. By the deposition without exposure to the air, impurities or moisture from the air atmosphere can be prevented from being attached to the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. By increasing the proportion of oxygen contained in the sputtering gas, excess oxygen in the oxide films to be deposited can be increased. In the case where the above oxide films are deposited by a sputtering method, the above In-M-Zn oxide target can be used.

In particular, when the oxide film 230A is deposited, part of oxygen contained in the sputtering gas is supplied to the insulating film 224A in some cases. Therefore, the proportion of oxygen contained in the sputtering gas for the oxide film 230A is preferably 70% or higher, further preferably 80% or higher, still further preferably 100%.

In the case where the oxide film 230B is formed by a sputtering method, when the proportion of oxygen contained in the sputtering gas is 1% or higher and 30% or lower, preferably 5% or higher and 20% or lower during the deposition, an oxygen-deficient oxide semiconductor is formed. In a transistor using an oxygen-deficient oxide semiconductor for its channel formation region, relatively high field-effect mobility can be obtained.

In this embodiment, the oxide film 230A is deposited by a sputtering method using a target with In:Ga:Zn=1:1:0.5 [atomic ratio] (2:2:1 [atomic ratio]). The oxide film 230B is deposited by a sputtering method using a target with In:Ga:Zn=4:2:2 [atomic ratio], 4:2:1 [atomic ratio], or 4:2:0 [atomic ratio] (In:Ga=4:2 [atomic ratio]). Note that each of the oxide films is preferably formed in accordance with characteristics required for the oxide 230 by appropriate selection of deposition conditions and an atomic ratio.

Next, heat treatment may be performed. For the heat treatment, the conditions for the above-described heat treatment can be used. Through the heat treatment, impurities such as hydrogen and water in the oxide film 230A and the oxide film 230B can be removed, for example. In this embodiment, treatment is performed at 400° C. in a nitrogen atmosphere for one hour, and successively another treatment is performed at 400° C. in an oxygen atmosphere for one hour.

Next, the oxide film 230A and the oxide film 230B are processed into island shapes to form the oxide 230a and the oxide 230b. Note that in the step, the insulator 224 may be formed so that the thickness of the insulating film 224A in a region not overlapping with the oxide 230a is smaller than that of the insulating film 224A in a region overlapping with the oxide 230a (see FIG. 7).

Here, the oxide 230a and the oxide 230b are formed to at least partly overlap with the conductor 205. It is preferable that the side surfaces of the oxide 230a and the oxide 230b be substantially perpendicular to a top surface of the insulator 222. When the side surfaces of the oxide 230a and the oxide 230b are substantially perpendicular to the top surface of the insulator 222, the plurality of transistors 200 can be provided in a smaller area and at a higher density. Alternatively, a structure may be employed in which an angle formed by the side surfaces of the oxide 230a and the oxide 230b and the top surface of the insulator 222 is an acute angle. In that case, the angle formed by the side surfaces of the oxide 230a and the oxide 230b and the top surface of the insulator 222 is preferably greater than or equal to 60° and less than 70°. With such a shape, the coverage with the insulator 273 and the like can be improved in a later step, so that defects such as a void can be reduced.

There is a curved surface between the side surfaces of the oxide 230a and the oxide 230b and the top surface of the oxide 230b. That is, an end portion of the side surface and an end portion of the top surface are preferably curved (hereinafter such a curved shape is also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm, for example. When the end portions are not angular, the coverage with films deposited in a later step can be improved.

Note that for the processing of the oxide films, a lithography method can be employed. The processing can be performed by a dry etching method or a wet etching method. The processing by a dry etching method is suitable for microfabrication.

In some cases, the treatment such as dry etching causes the attachment or diffusion of impurities due to an etching gas or the like to a surface or an inside of the oxide 230a, the oxide 230b, or the like. Examples of the impurities include fluorine and chlorine.

In order to remove the above impurities and the like, cleaning is performed. Examples of the cleaning method include wet cleaning using a cleaning solution, plasma treatment using plasma, and cleaning by heat treatment, and any of these cleanings may be performed in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, the ultrasonic cleaning using pure water or carbonated water is performed.

Sequentially, heat treatment may be performed. For the heat treatment, the conditions for the above-described heat treatment can be used.

Next, an oxide film to be an oxide film 230C is deposited over the insulator 224, the oxide 230a, and the oxide 230b.

The oxide film to be the oxide film 230C can be deposited by a sputtering method, a CVD method, an MBE method, a PLD method, an ALD method, or the like. The oxide film to be the oxide film 230C may be deposited by a deposition method similar to that for the oxide film 230A or the oxide film 230B in accordance with characteristics required for the oxide 230c. In this embodiment, the oxide film to be the oxide film 230C is deposited by a sputtering method using a target with In:Ga:Zn=1:3:4 [atomic ratio].

Figure 8A:
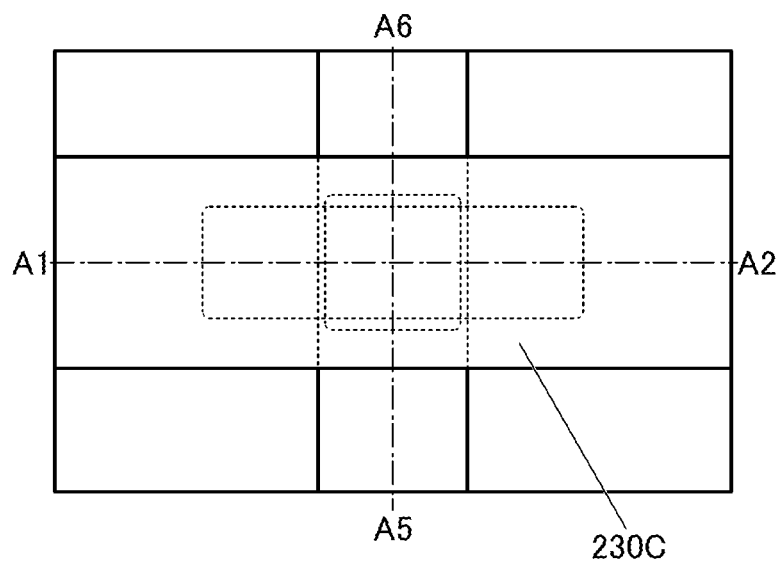
FIGS. 8A to 8C A top view and cross-sectional views illustrating a method for fabricating a semiconductor device of one embodiment of the present invention.
Figure 8C:
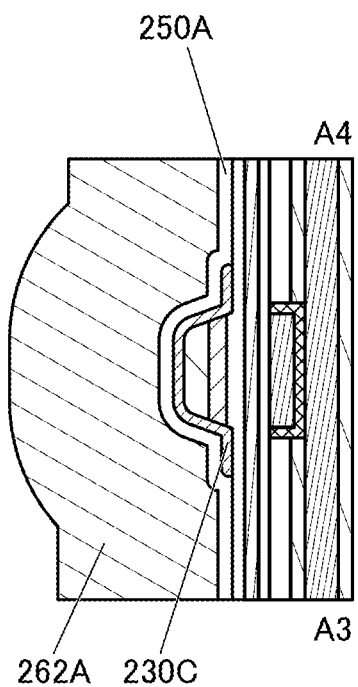
Figure 8B:
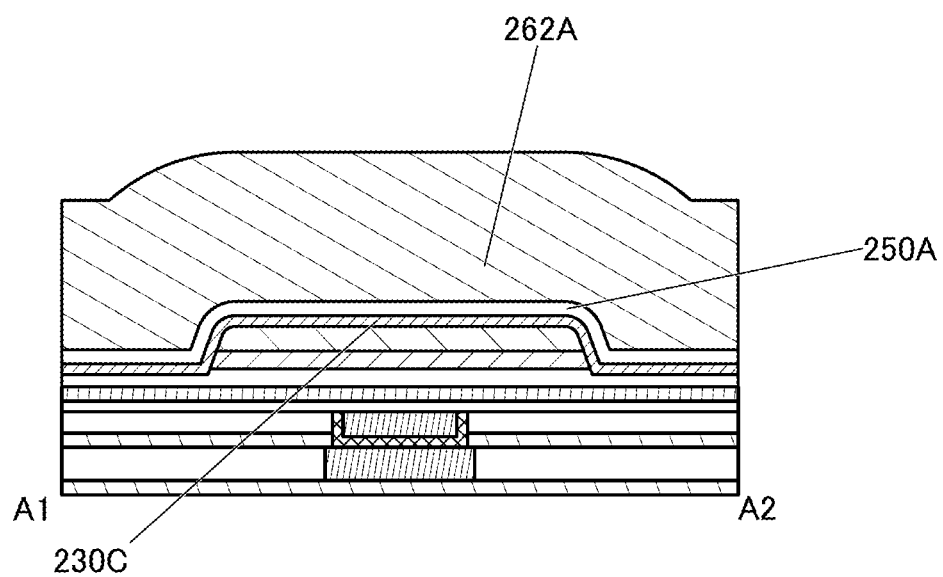

Next, the oxide film to be the oxide film 230C is processed by a lithography method to form the oxide film 230C (see FIG. 8).

Then, an insulating film 250A and a dummy gate film 262A are deposited in this order over the oxide film 230C (see FIG. 8).

First, the insulating film 250A is deposited. The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulating film having few impurities can be deposited.

Note that oxygen is excited by microwaves to generate high-density oxygen plasma, and the insulating film 250A is exposed to the oxygen plasma, whereby oxygen can be introduced into the insulating film 250A.

Furthermore, heat treatment may be performed. For the heat treatment, the conditions for the above-described heat treatment can be used. The heat treatment can reduce the moisture concentration and the hydrogen concentration in the insulating film 250A.

The dummy gate film 262A is processed to be used as a dummy gate. The dummy gate is an interim gate electrode. That is, the dummy gate film 262A is processed to form an interim gate electrode, the dummy gate is removed in a later step, and a gate electrode is formed using a conductive film or the like instead. Thus, a film that is easily processed minutely and easily removed is preferably used as the dummy gate film 262A.

The dummy gate film 262A can be deposited by a sputtering method, a CVD method, an MBE method, a PLD method, an ALD method, or the like. An insulator, a semiconductor, or a conductor can be used, for example. Specifically, silicon such as polysilicon, microcrystalline silicon, or amorphous silicon, or a metal film of aluminum, titanium, tungsten, or the like is used, for example. Alternatively, a resin film may be formed by a coating method. Examples of the resin include a photoresist, polyester, polyolefin, polyamide (nylon, aramid, or the like), polyimide, polycarbonate, and acrylic. When the resin film is formed by a coating method, a surface of the dummy gate film 262A can be flat. In this manner, when having a flat surface, the dummy gate film 262A can be easily processed minutely and easily removed.

The dummy gate film 262A can be a multilayer film using different kinds of films. For example, the dummy gate film 262A can have a two-layer structure in which a conductive film and a resin film over the conductive film are formed. When the dummy gate film has such a structure, the conductive film functions as a stopper film for CMP treatment in a later CMP process in some cases, for example. Alternatively, the end of the CMP treatment can be detected in some cases, so that processing variation can be reduced in some cases.

Figure 9A:
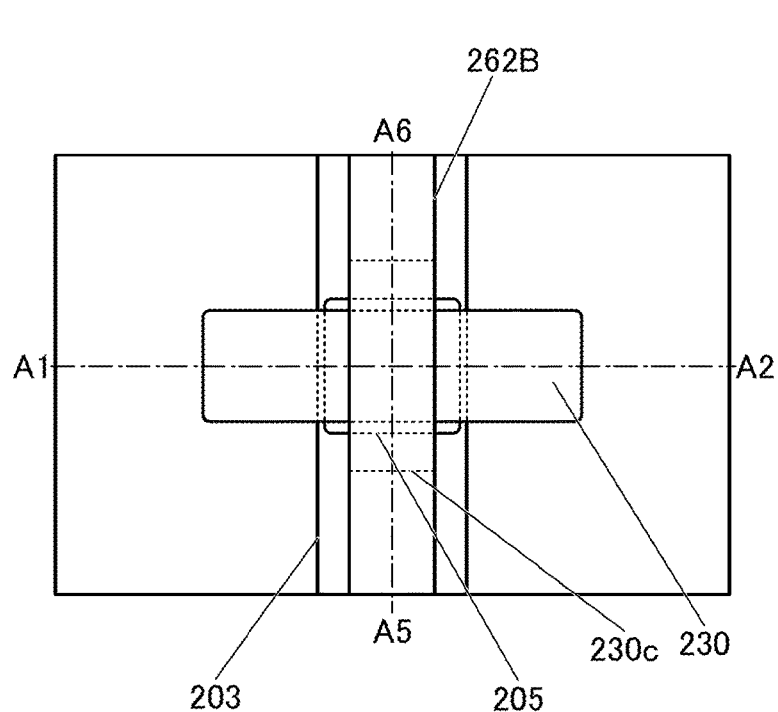
FIGS. 9A to 9C A top view and cross-sectional views illustrating a method for fabricating a semiconductor device of one embodiment of the present invention.
Figure 9C:
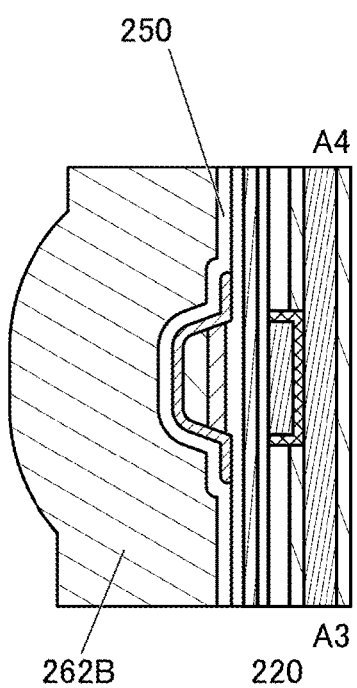
Figure 9B:
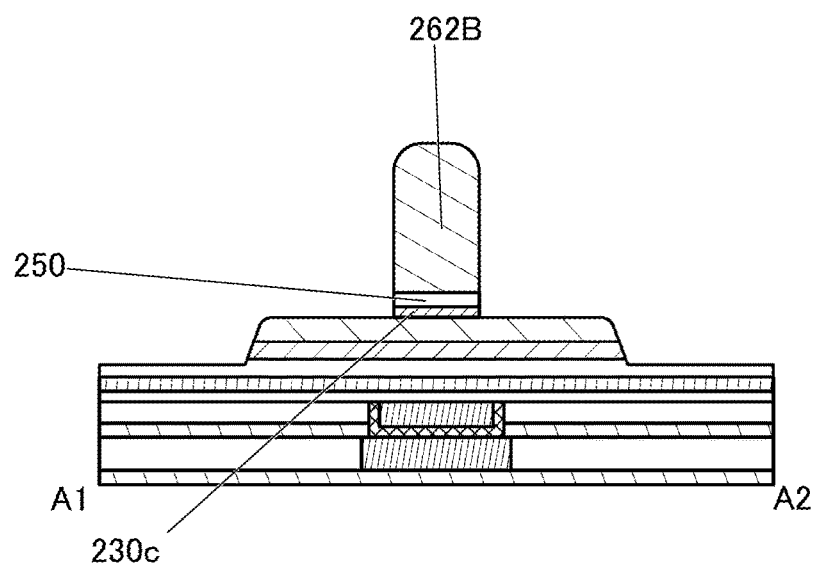

Next, the oxide film 230C, the insulating film 250A, and the dummy gate film 262A are etched by a lithography method to form the oxide 230c, the insulator 250, and a dummy gate layer 262B (see FIG. 9). The oxide 230c, the insulator 250, and the dummy gate layer 262B are formed to at least partly overlap with the conductor 205 and oxide 230.

It is preferable that the side surface of the oxide 230c, a side surface of the insulator 250, and a side surface of the dummy gate layer 262B be on the same plane.

It is preferable that the plane shared by the side surface of the oxide 230c, the side surface of the insulator 250, and the side surface of the dummy gate layer 262B be substantially perpendicular to a top surface of the substrate. That is, in a cross section, the angles of the oxide 230c, the insulator 250, and the dummy gate layer 262B with respect to the top surface of the substrate are preferably around 90°.

Figure 10A:
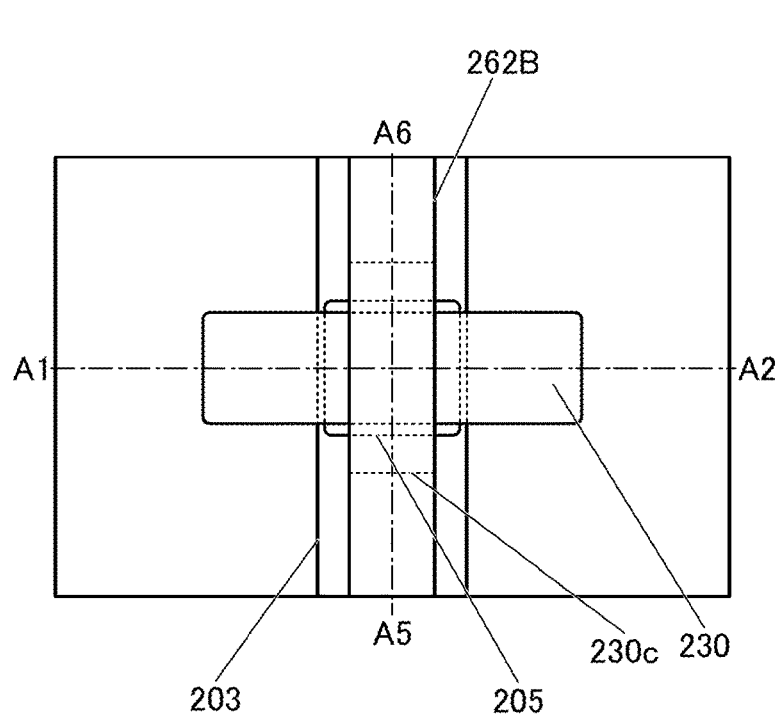
FIGS. 10A to 10C A top view and cross-sectional views illustrating a method for fabricating a semiconductor device of one embodiment of the present invention.
Figure 10C:
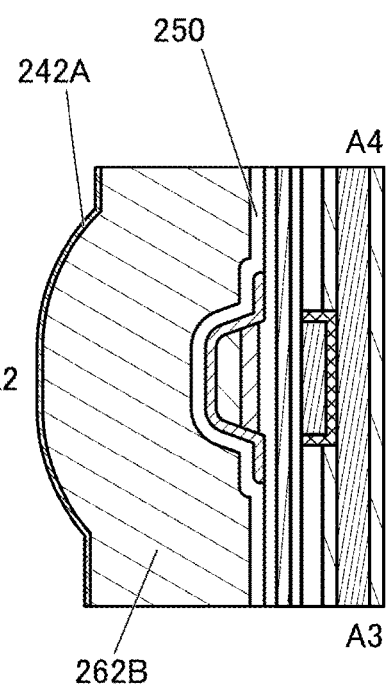
Figure 10B:
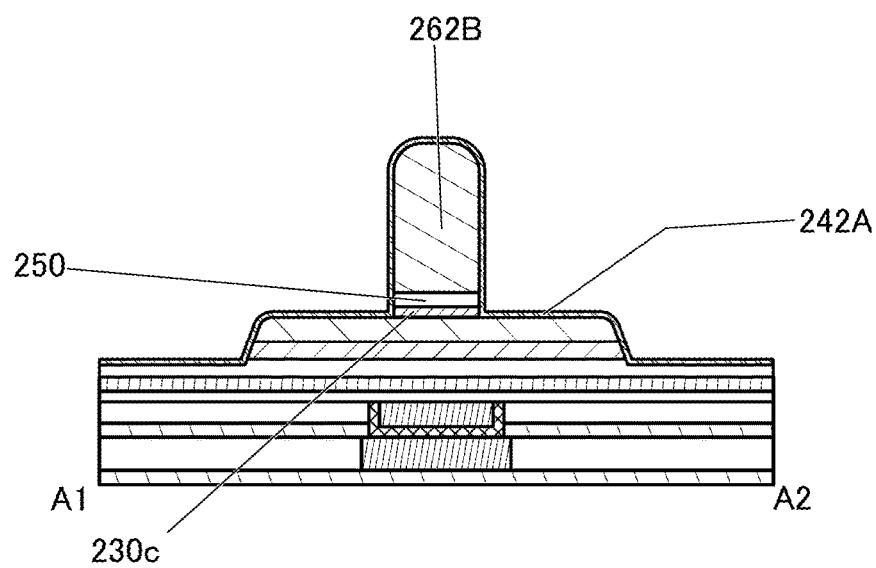
Figure 11A:
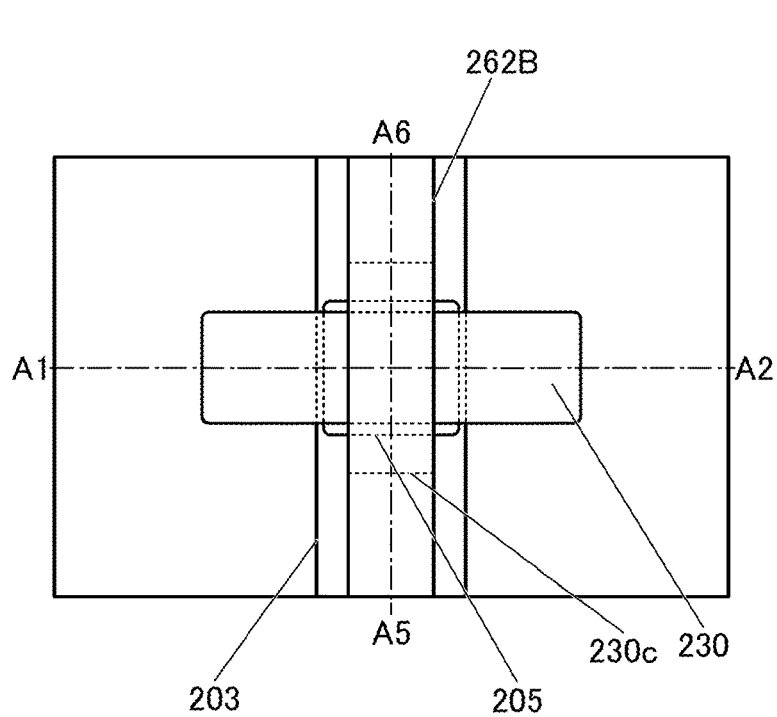
FIGS. 11A to 11C A top view and cross-sectional views illustrating a method for fabricating a semiconductor device of one embodiment of the present invention.
Figure 11C:
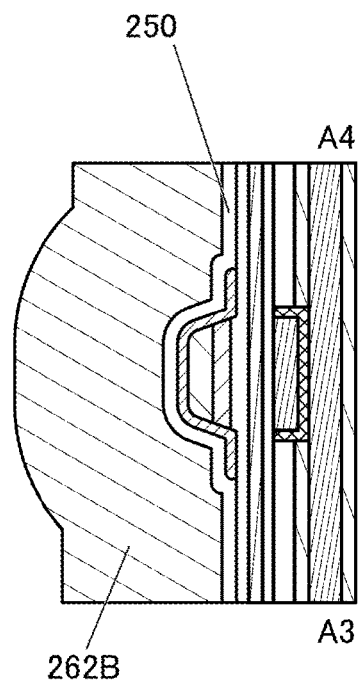
Figure 11B:
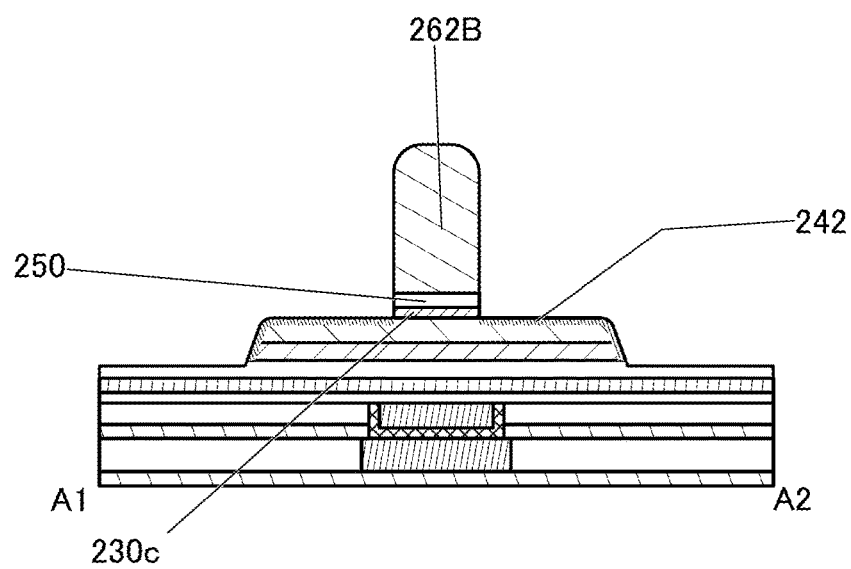

Next, a film 242A is deposited to cover the insulator 224, the oxide 230, the insulator 250, and the dummy gate layer 262B (see FIG. 10). Note that the thickness of the film 242A is preferably greater than or equal to 0.5 nm and less than or equal to 5 nm, further preferably greater than or equal to 1 nm and less than or equal to 3 nm. As the film 242A, a metal film, a nitride film containing a metal element, or an oxide film containing a metal element is used. For example, the film 242A is a film containing a metal element such as aluminum, ruthenium, titanium, tantalum, tungsten, or chromium. Note that the film 242A can be deposited by a sputtering method, a CVD method, an MBE method, a PLD method, an ALD method, or the like.

Sequentially, heat treatment is performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The heat treatment is performed in a nitrogen atmosphere or an inert gas atmosphere. Alternatively, the heat treatment may be performed under a reduced pressure. For example, the heat treatment is performed at 400° C. in a nitrogen atmosphere for one hour after the deposition of the film 242A.

By the heat treatment in the atmosphere containing nitrogen, the above-described metal element is diffused from the film 242A into the oxide 230; thus, the metal element can be added to the oxide 230. Moreover, oxygen in the oxide 230 in the vicinity of the interface with the film 242A may be absorbed by the film 242A. As a result, the oxide 230 in the vicinity of the interface with the film 242A becomes a metal compound and the resistance thereof is reduced. Note that at this time, part of the oxide 230 may be alloyed with the above-described metal element. When part of the oxide 230 is alloyed with the metal element, the metal element added to the oxide 230 is brought into a relatively stable state; therefore, a highly reliable semiconductor device can be provided.

In the case where hydrogen in the oxide 230 is diffused into the region 231 and enters an oxygen vacancy in the region 231, the hydrogen is brought into a relatively stable state. Hydrogen in an oxygen vacancy in the region 234 is released from the oxygen vacancy by heat treatment at 250° C. or higher, is diffused into the region 231, enters an oxygen vacancy in the region 231, and is brought into a relatively stable state. Thus, by the heat treatment, the resistance of the region 231 is further reduced, and the region 234 is highly purified (a reduction in impurities such as water and hydrogen) and the resistance is further increased.

Alternatively, heat treatment may be performed in a nitrogen atmosphere or an inert gas atmosphere, and then another heat treatment may be performed in an atmosphere containing an oxidizing gas at 10 ppm or more, 1% or more, or 10% or more. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C.

In the case where a region having conductivity remains in the film 242A, heat treatment in an oxidization atmosphere oxidizes the region having conductivity, whereby the film 242A becomes an insulator and the resistance thereof is increased. The film 242A that remains as an insulator can function as an interlayer film.

In the deposition step of the film 242A or by the heat treatment, oxygen in the oxide 230 is absorbed by the film 242A and accordingly an oxygen vacancy is generated in the region 231 in some cases. Entry of hydrogen in the oxide 230 to the oxygen vacancy increases the carrier density of the region 231. Thus, the region 231 of the oxide 230 becomes n-type and has a reduced resistance.

Then, the film 242A is removed. Note that the metal film, the oxide film containing the metal element, or the nitride film containing the metal element is not necessarily removed. In the case where the metal film, the oxide film containing the metal element, or the nitride film containing the metal element is oxidized by oxygen absorbed from the oxide 230 to be a high-resistance insulator, for example, the film may be left. In that case, the film may function as an interlayer film. A dry etching method or a wet etching method can be used in this step. At the same time as the film 242A is removed, hydrogen absorbed by the film 242A from the oxide 230 can be removed. Thus, hydrogen, which is an impurity in the transistor 200, can be reduced. Note that the vicinity of the region of the oxide 230 with reduced resistance is indicated as the layer 242 by diagonal lines (see FIG. 11).

Figure 12A:
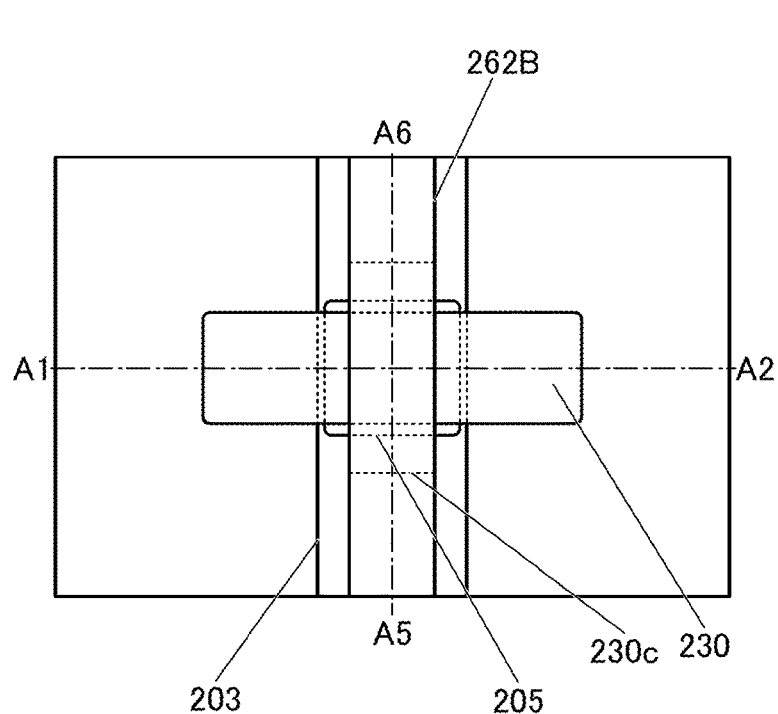
FIGS. 12A to 12C A top view and cross-sectional views illustrating a method for fabricating a semiconductor device of one embodiment of the present invention.
Figure 12C:
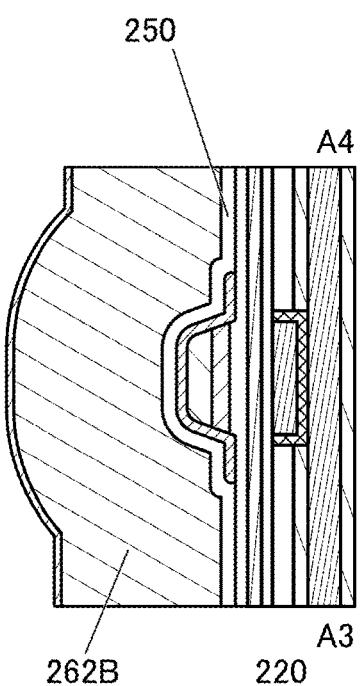
Figure 12B:
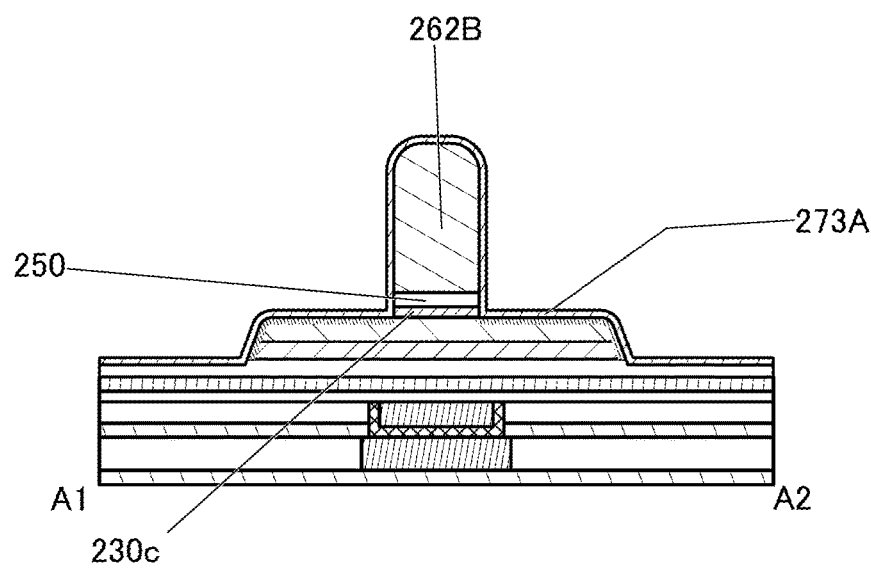

Next, an insulating film 273A is deposited (see FIG. 12). The insulating film 273A can be deposited by a sputtering method, a CVD method, an MBE method, a PLD method, an ALD method, or the like.

The insulating film 273A is preferably deposited by an ALD method which enables good coverage. With the use of an ALD method, the insulating film 273A having a uniform thickness can be formed on the side surfaces of the oxide 230c, the insulator 250, and the dummy gate layer 262B even at a step portion formed by the dummy gate layer 262B or the like. With the use of an ALD method, a dense thin film can be deposited.

The insulating film 273A preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable.

Alternatively, aluminum oxide having a barrier property or the like may be provided for the insulating film 273A. In the case where the conductor 260 is a metal film that is easily oxidized, for example, the use of an insulator having a barrier property can inhibit oxidization of the conductor 260 due to oxygen from the outside of the insulator 273. This can suppress an increase in the resistance value of the conductor 260.

In the case where aluminum oxide is provided by an ALD method for the insulating film 273A, the insulating film 273A has a thickness of greater than or equal to 0.5 nm and less than or equal to 20 nm, preferably greater than or equal to 1 nm and less than or equal to 10 nm.

Figure 13A:
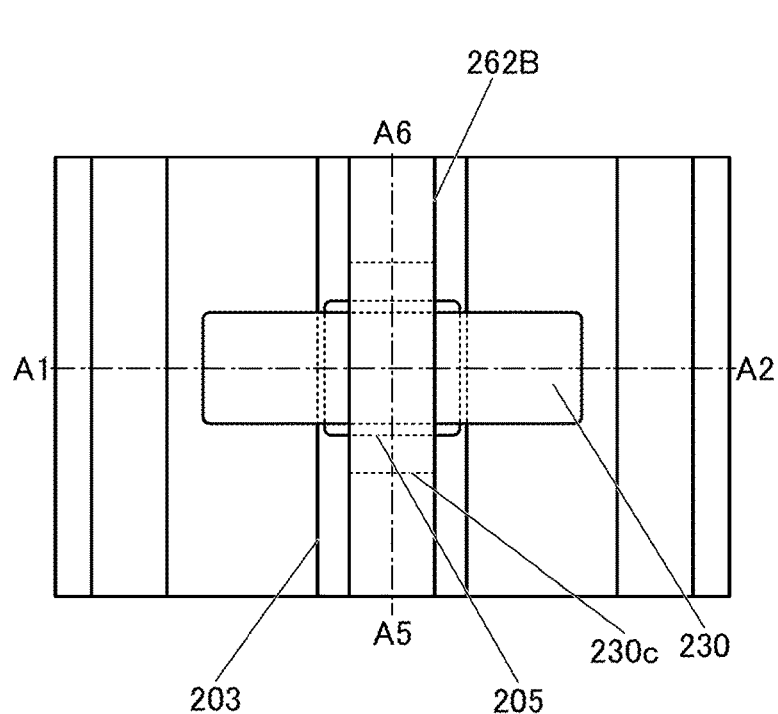
FIGS. 13A to 13C A top view and cross-sectional views illustrating a method for fabricating a semiconductor device of one embodiment of the present invention.
Figure 13C:
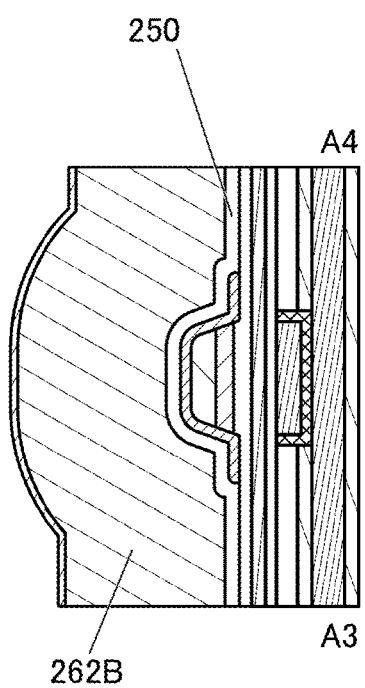
Figure 13B:
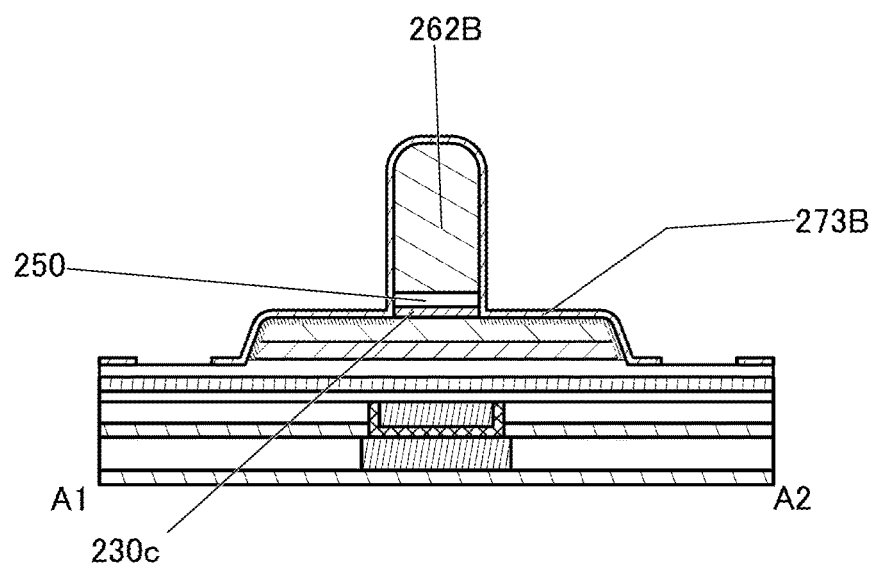

Then, the insulating film 273A is processed by a lithography method to form an insulator 273B including openings (see FIG. 13).

Next, an insulating film to be the insulator 280 is deposited over the insulator 273B. The insulating film to be the insulator 280 can be deposited by a sputtering method, a CVD method, an MBE method, a PLD method, an ALD method, or the like.

Figure 14A:
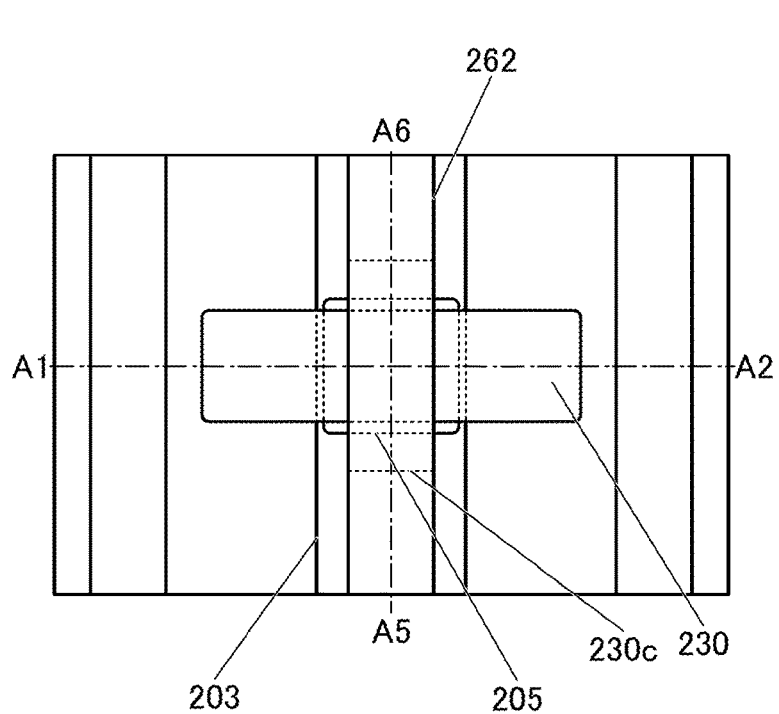
FIGS. 14A to 14C A top view and cross-sectional views illustrating a method for fabricating a semiconductor device of one embodiment of the present invention.
Figure 14C:
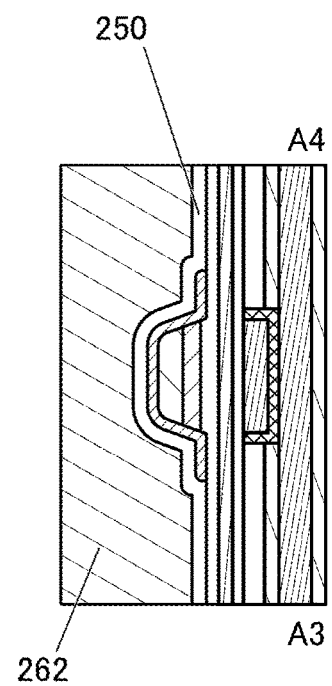
Figure 14B:
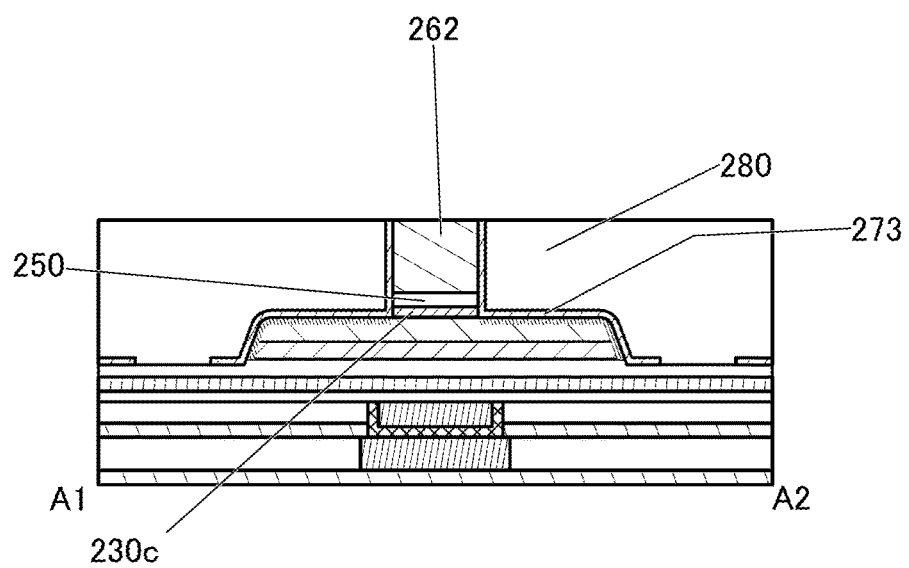
Figure 15A:
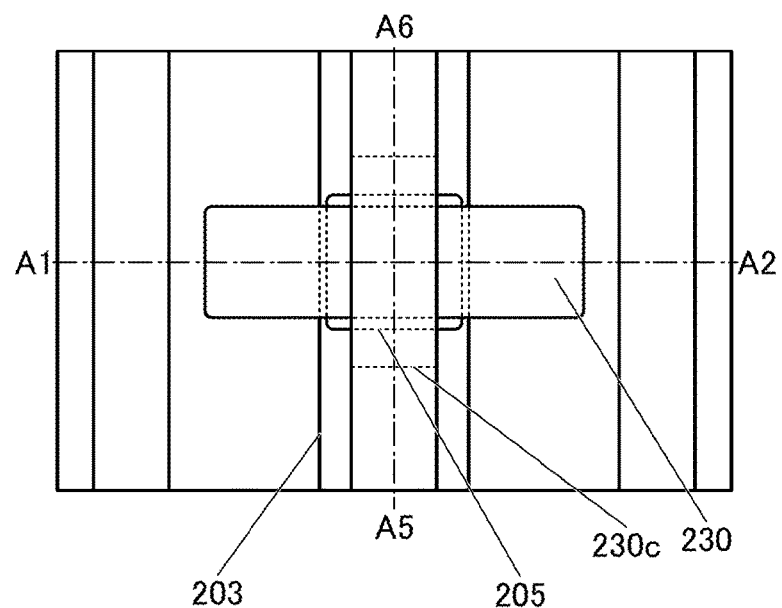
FIGS. 15A to 15C A top view and cross-sectional views illustrating a method for fabricating a semiconductor device of one embodiment of the present invention.
Figure 15C:
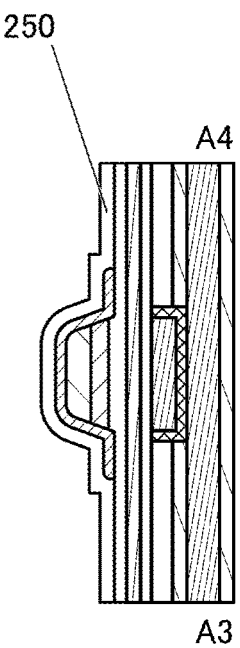
Figure 15B:
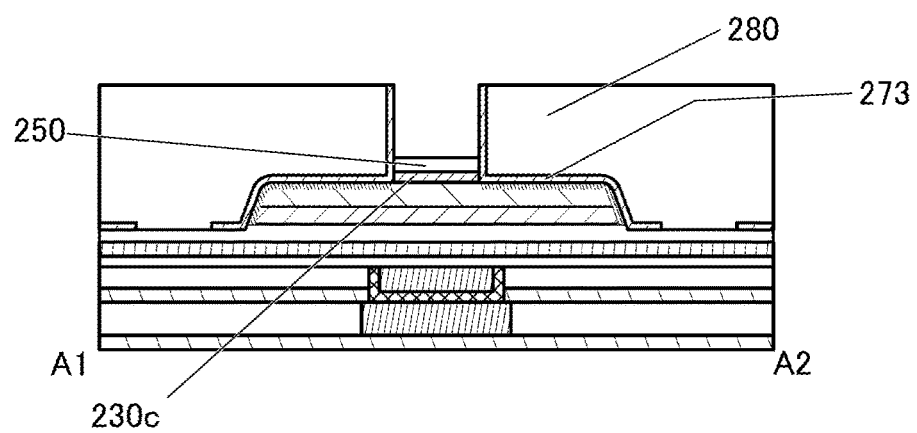
Figure 16A:
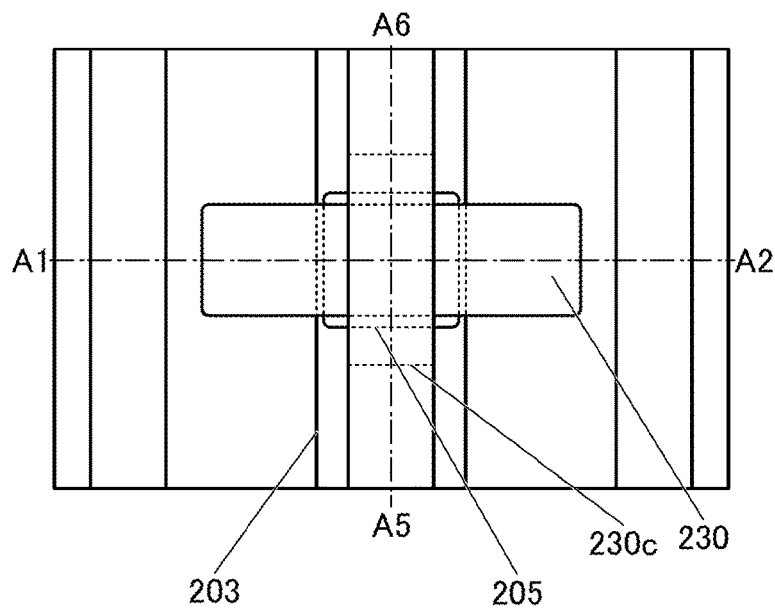
FIGS. 16A to 16C A top view and cross-sectional views illustrating a method for fabricating a semiconductor device of one embodiment of the present invention.
Figure 16C:
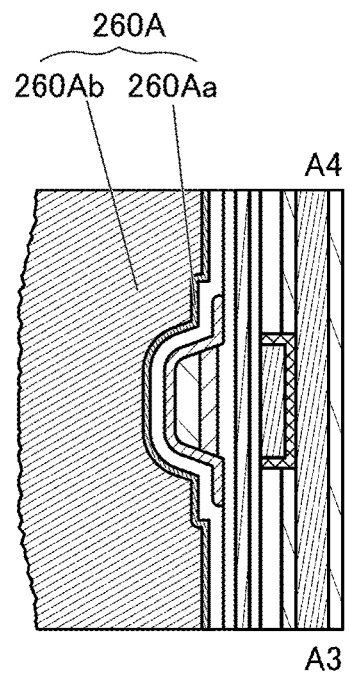
Figure 16B:
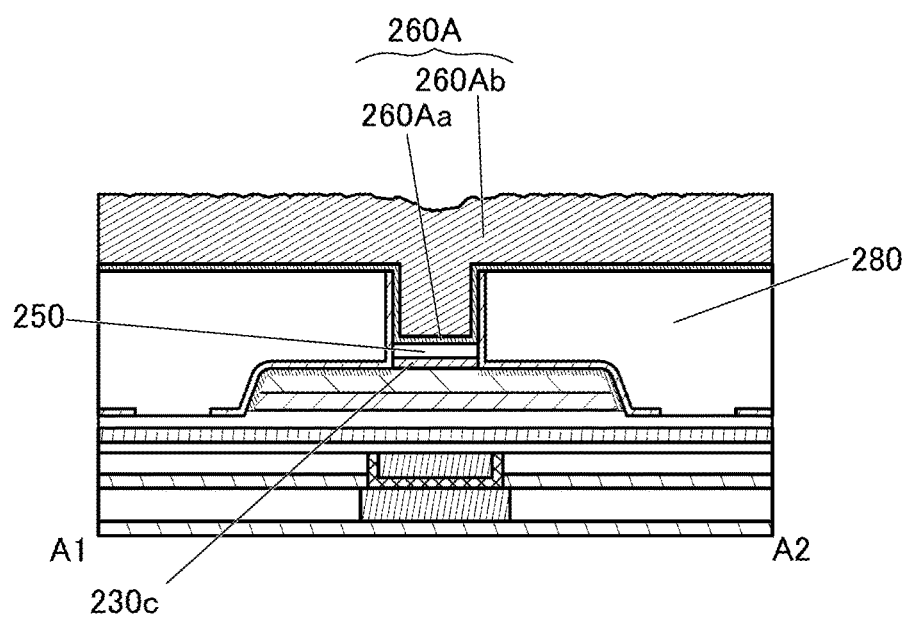

Next, the insulating film to be the insulator 280, the dummy gate layer 262B, and the insulator 273B are partly removed until part of the dummy gate layer 262B is exposed, whereby the insulator 280, a dummy gate 262, and the insulator 273 are formed (see FIG. 14). CMP treatment is preferably employed for forming the insulator 280, the dummy gate 262, and the insulator 273.

As mentioned above, when the dummy gate film 262A has a two-layer structure in which a conductive film and a resin film over the conductive film are formed, for example, in CMP treatment, the conductive film functions as a stopper film for the CMP treatment in some cases. Alternatively, the end of the CMP treatment can be detected with the conductive film in some cases, so that variation in the height of the dummy gate 262 can be reduced in some cases. As illustrated FIG. 14, a top surface of the dummy gate 262 is substantially aligned with top surfaces of the insulator 273 and the insulator 280.

Next, the dummy gate 262 is removed. The dummy gate 262 can be removed by wet etching, dry etching, ashing, or the like. Alternatively, a plurality of the above treatments may be performed in combination as appropriate. For example, wet etching treatment may be performed after ashing treatment. By the removal of the dummy gate 262, the surface of the insulator 250 is exposed (see FIG. 15).

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 16).

Figure 17A:
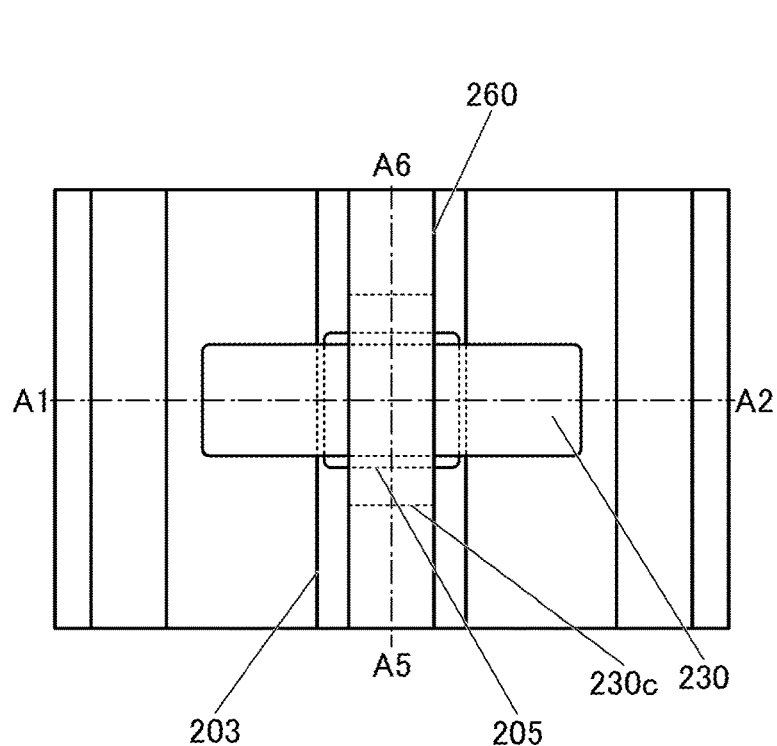
FIGS. 17A to 17C A top view and cross-sectional views illustrating a method for fabricating a semiconductor device of one embodiment of the present invention.
Figure 17C:
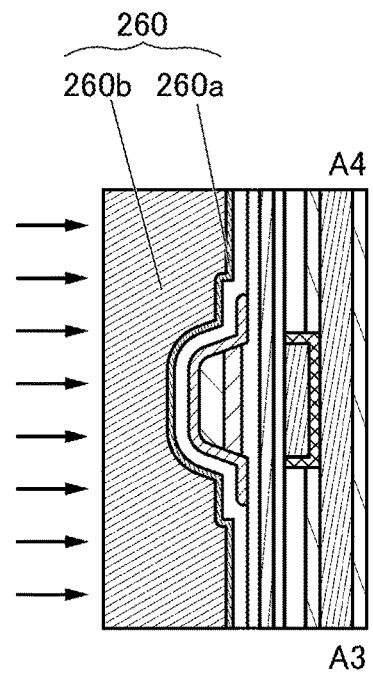
Figure 17B:
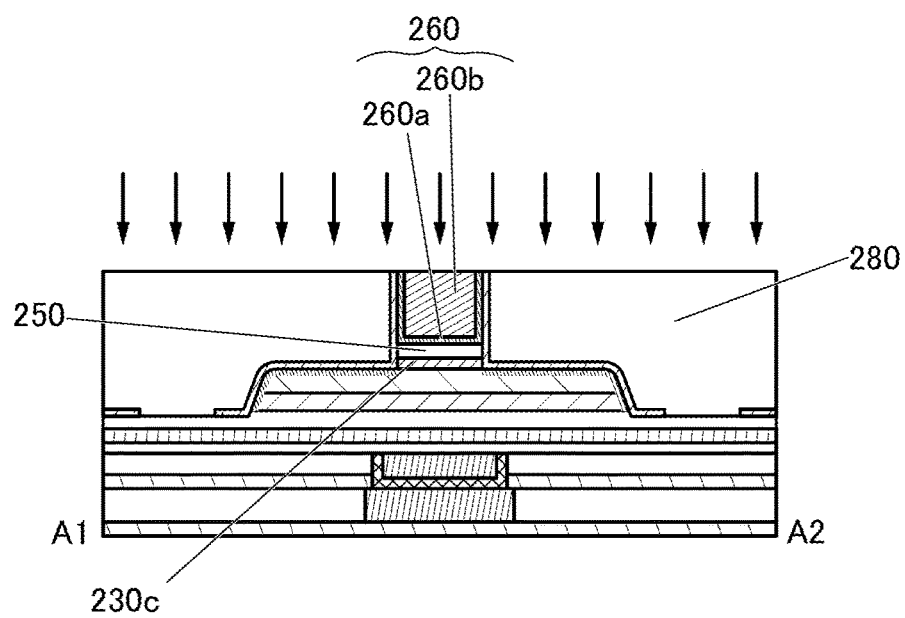
Figure 18A:
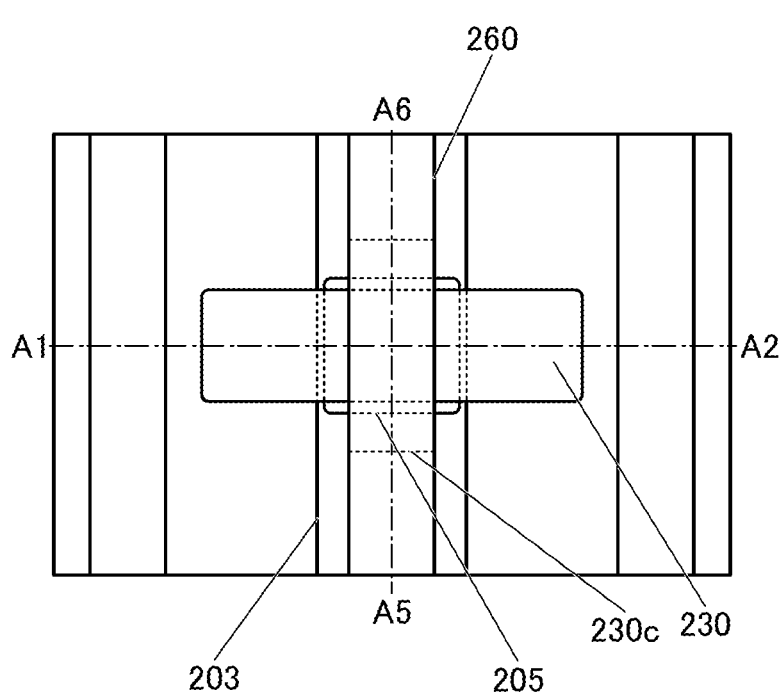
FIGS. 18A to 18C A top view and cross-sectional views illustrating a method for fabricating a semiconductor device of one embodiment of the present invention.
Figure 18C:
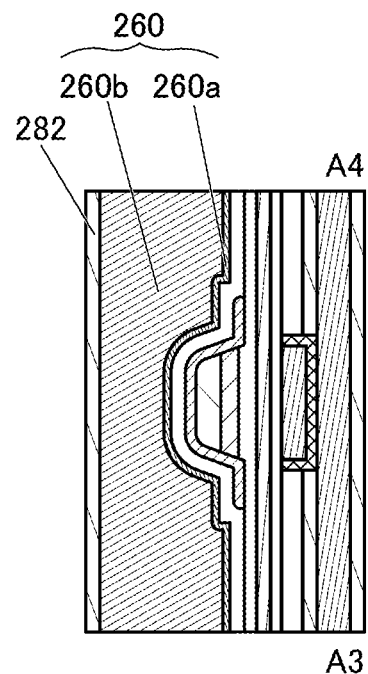
Figure 18B:
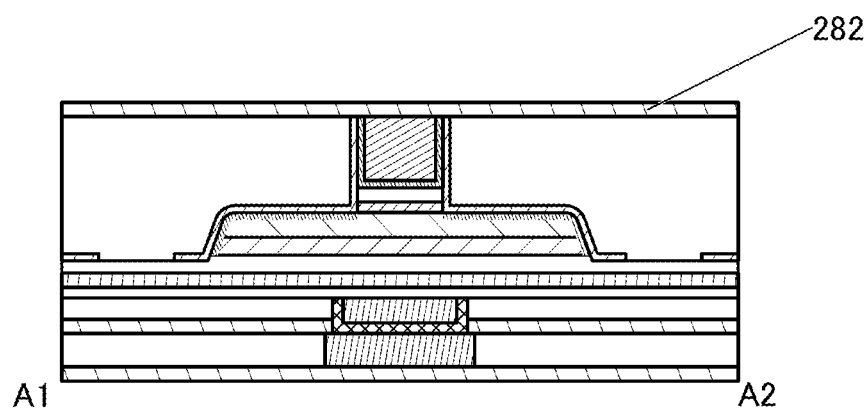
Figure 19A:
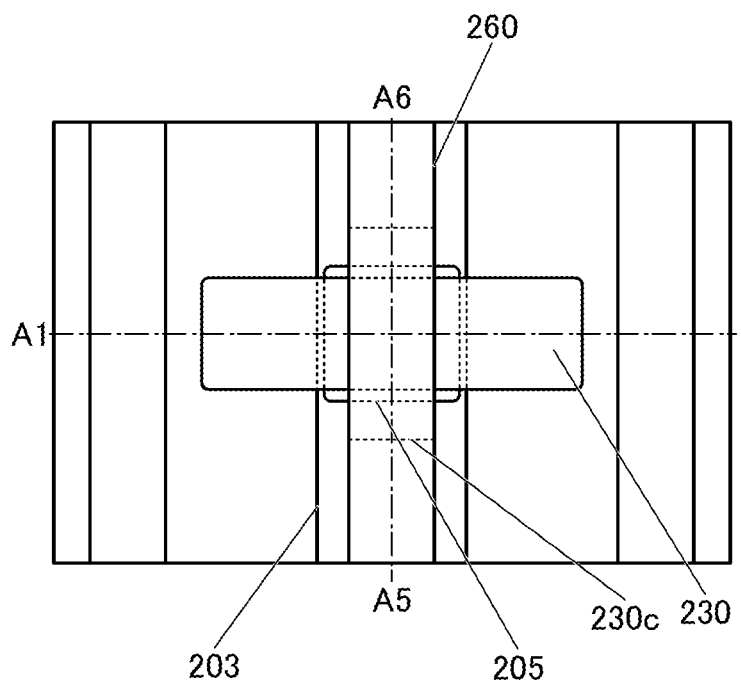
FIGS. 19A to 19C A top view and cross-sectional views illustrating a method for fabricating a semiconductor device of one embodiment of the present invention.
Figure 19C:
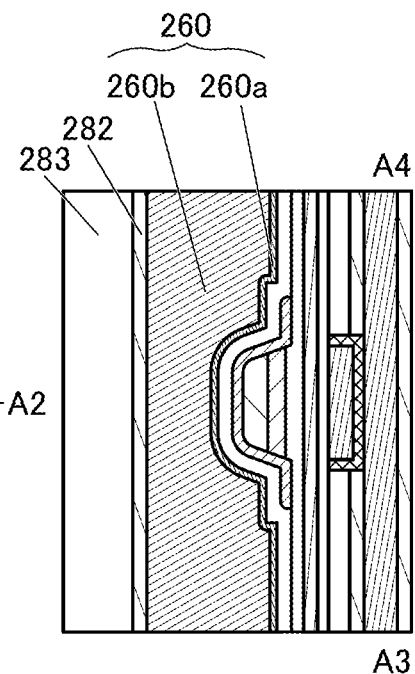
Figure 19B:
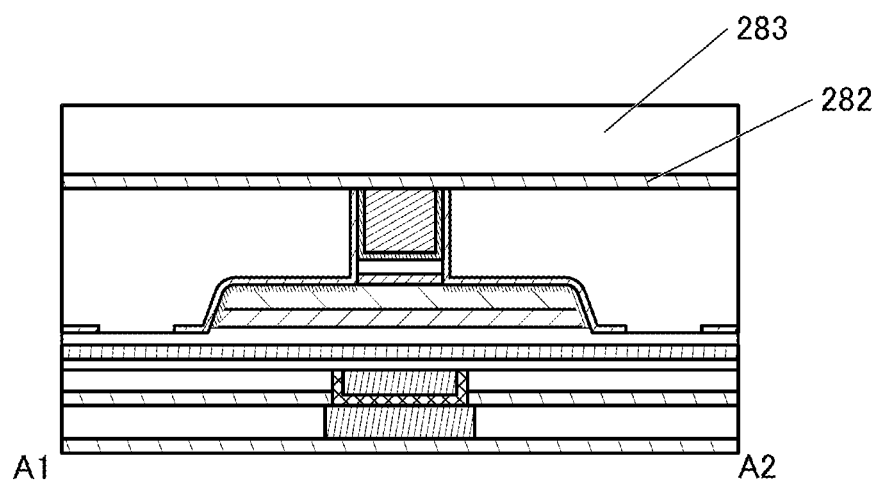

Then, the conductive film 260Aa and the conductive film 260Ab are polished by CMP treatment until the insulator 280 is exposed, whereby the conductor 260 including the conductor 260$a$ and the conductor 260$b$ is formed (see FIG. 17).

Next, treatment for injecting oxygen into the insulator 280 may be performed. As the treatment for injecting oxygen, plasma treatment using a gas containing oxygen, treatment for injecting oxygen ions with an ion implantation apparatus, or the like can be given. Oxygen can be injected into the insulator 280 by plasma irradiation using a gas containing oxygen with an apparatus including a high-density plasma source, for example. In this embodiment, oxygen ions are injected with an ion implantation apparatus (see FIG. 17).

In particular, ion implantation with an ion implantation apparatus can control the amount of ion implantation and the depth of ion implantation independently, which is preferable. That is, an optimal amount of oxygen can be injected into the insulator 280 at an optimal depth, so that a semiconductor device including a high-performance transistor with small variation in performance can be manufactured. The implantation amount and the implantation depth can be optimized as appropriate depending on the thickness of the insulator 280, the size of the transistor, the arrangement density of the transistor, and the arrangement of the transistor.

An insulating film to be the insulator 282 may be formed over the insulator 280 to inject oxygen into the insulator 280. The insulating film to be the insulator 282 can be deposited by a sputtering method, a CVD method, an MBE method, a PLD method, an ALD method, or the like. An aluminum oxide film is preferably deposited as the insulating film to be the insulator 282 by a sputtering method, for example. When an aluminum oxide film is deposited by a sputtering method using a gas containing oxygen, oxygen can be injected into the insulator 280. That is, the insulator 280 contains excess oxygen. Furthermore, the hydrogen contained in the insulator 280 can be inhibited from being diffused into the oxide 230 in some cases (see FIG. 18).

Heat treatment may be performed in the following steps. By the heat treatment, excess oxygen contained in the insulator 280 can be injected into the oxide 230 through the openings in the insulator 273 and then through the insulator 224. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is preferably performed in an atmosphere containing an oxygen gas. Alternatively, the heat treatment may be performed under a reduced pressure. For example, the heat treatment is performed at 400° C. in an atmosphere containing oxygen for one hour.

Next, an insulator to be the insulator 283 may be deposited over the insulator 282. The insulating film to be the insulator 283 can be deposited by a sputtering method, a CVD method, an MBE method, a PLD method, an ALD method, or the like (see FIG. 19).

Figure 20A:
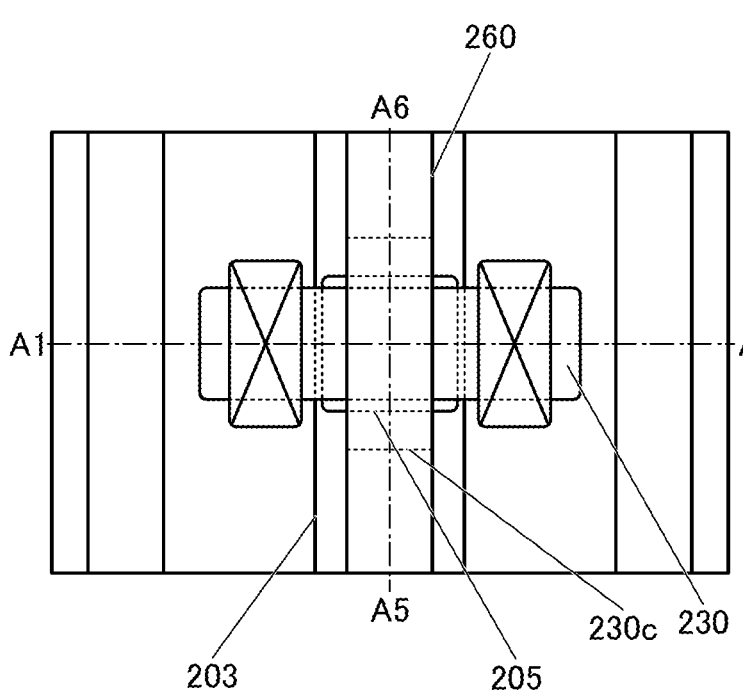
FIGS. 20A to 20C A top view and cross-sectional views illustrating a method for fabricating a semiconductor device of one embodiment of the present invention.
Figure 20C:
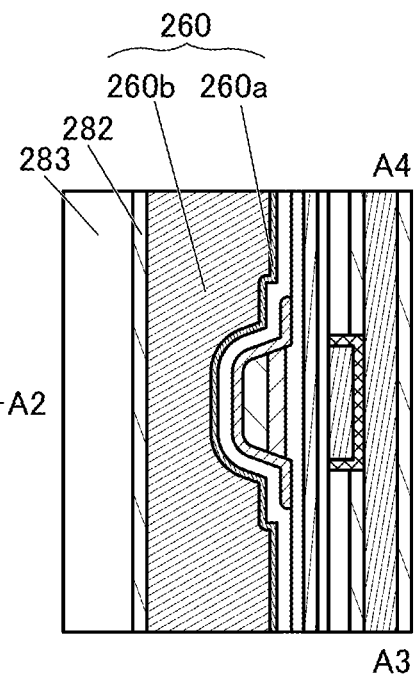
Figure 20B:
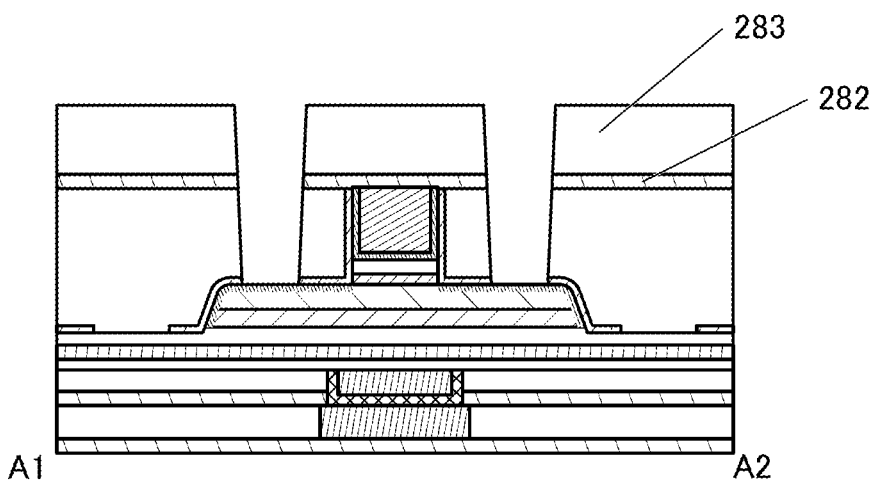
Figure 21A:
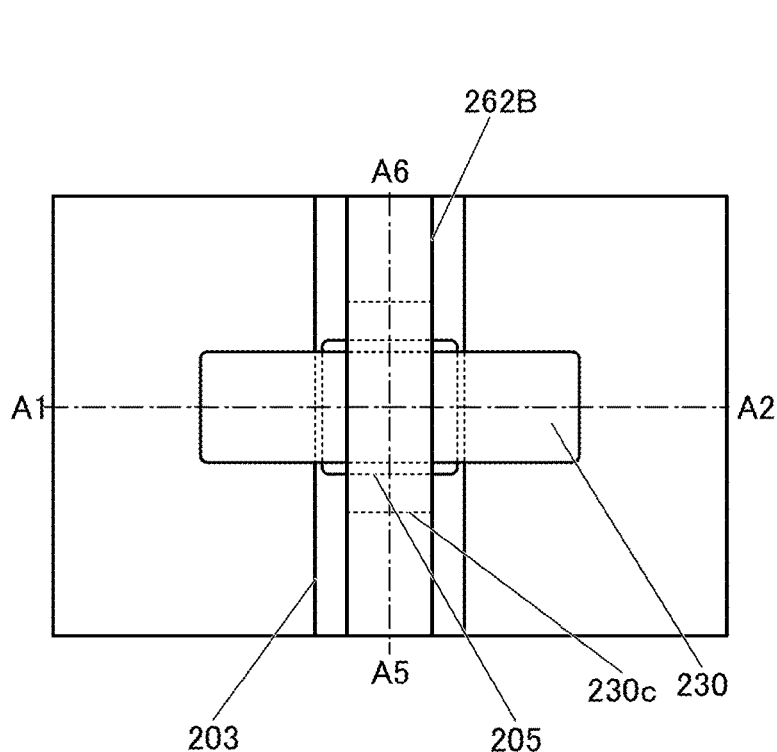
FIGS. 21A to 21C A top view and cross-sectional views illustrating a method for fabricating a semiconductor device of one embodiment of the present invention.
Figure 21C:
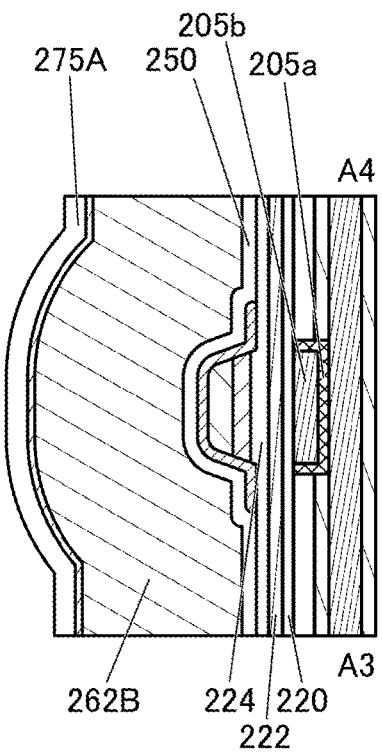
Figure 21B:
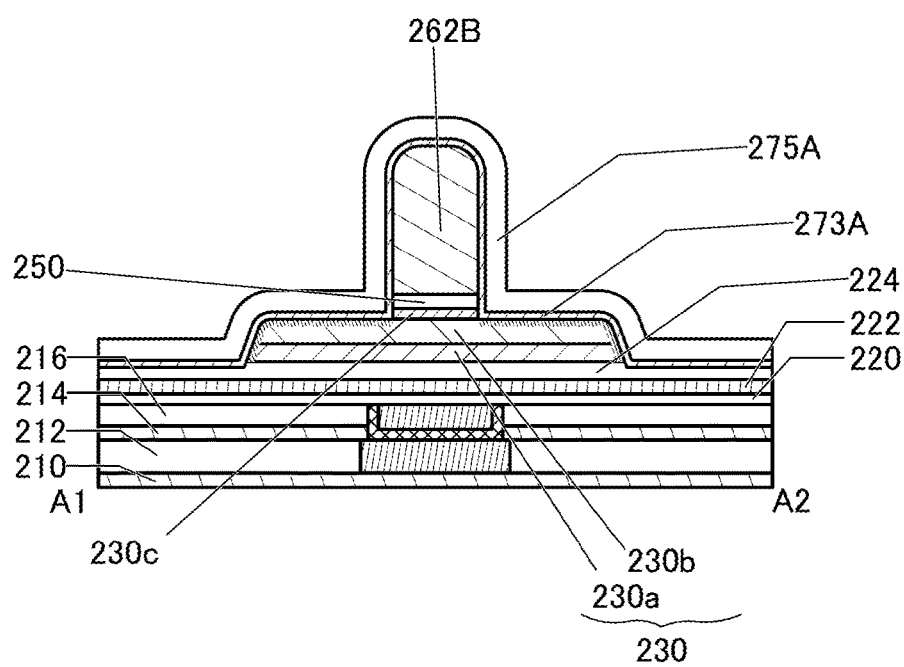

Next, openings reaching the region 231 of the oxide 230 are formed in the insulator 273, the insulator 280, the insulator 282, and the insulator 283 (see FIG. 20). The openings may be formed by a lithography method.

Next, a conductive film to be the conductor 240$a$ and the conductor 240$b$ is deposited. The conductive film to be the conductor 240$a$ and the conductor 240$b$ desirably has a stacked-layer structure which includes a conductor having a function of inhibiting the passage of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Here, when the openings are formed in the insulator 273, the insulator 280, the insulator 282, and the insulator 283, for example, the low-resistance region of the region 231 of the oxide 230 may be removed. When the conductive film to be the conductor 240$a$ and the conductor 240$b$ is deposited in the openings, there are regions where the oxide 230 is in contact with the conductive film to be the conductor 240$a$ and the conductor 240$b$; accordingly, a metal compound or an oxygen vacancy is formed in the regions, and thus the resistances of the contact regions between the oxide 230 and the conductive film to be the conductor 240$a$ and the conductor 240$b$ can be reduced. When the resistances of the contact regions are reduced, sufficient ohmic contacts between the oxide 230 and each of the conductor 240$a$ and the conductor 240$b$ can be made. Therefore, the conductive film to be the conductor 240$a$ and the conductor 240$b$ preferably contains a metal element such as aluminum, ruthenium, titanium, tantalum, tungsten, or chromium.

Next, CMP treatment is performed to remove part of the conductive film to be the conductor 240$a$ and the conductor 240$b$, so that the insulator 283 is exposed. As a result, the conductive film remains only in the openings, so that the conductor 240*a* and the conductor 240*b* having flat top surfaces can be formed (see FIG. 1).

The conductor 240*a* and the conductor 240*b* may be formed after aluminum oxide is formed on side wall portions of the openings. By forming aluminum oxide on the side wall portions of the openings, the passage of oxygen from the outside can be inhibited and oxidation of the conductor 240*a* and the conductor 240*b* can be prevented. Furthermore, impurities such as water and hydrogen can be prevented from being diffused from the conductor 240*a* and the conductor 240*b* to the outside. The aluminum oxide can be formed by depositing aluminum oxide in the openings by an ALD method or the like and then performing anisotropic etching.

Thus, by the method for fabricating a semiconductor device described with reference to FIG. 6 to FIG. 20, the semiconductor device including the transistor 200 illustrated in FIG. 1 can be fabricated.

<Method 2 for Fabricating Semiconductor Device>

Next, a method for fabricating a semiconductor device including the transistor 200*a* of the present invention, which is illustrated in FIG. 4, will be described with reference to FIG. 21 to FIG. 31. In FIG. 21 to FIG. 31, (A) of each drawing is a top view. Moreover, (B) of each drawing is a cross-sectional view corresponding to a portion indicated by dashed-dotted line A1-A2 in (A). Furthermore, (C) of each drawing is a cross-sectional view corresponding to a portion indicated by dashed-dotted line A3-A4 in (A). Note that for simplification of the drawings, some components are not illustrated in the top view of (A) of each drawing.

For the steps up to the deposition of the insulating film 273A illustrated in FIG. 12, the method for fabricating the semiconductor device including the transistor 200 described in the above <Method 1 for fabricating semiconductor device> is referred to.

Then, an insulating film 275A is deposited over the insulating film 273A. The insulating film 275A can be deposited by a sputtering method, a CVD method, an MBE method, a PLD method, an ALD method, or the like (see FIG. 21).

Figure 22A:
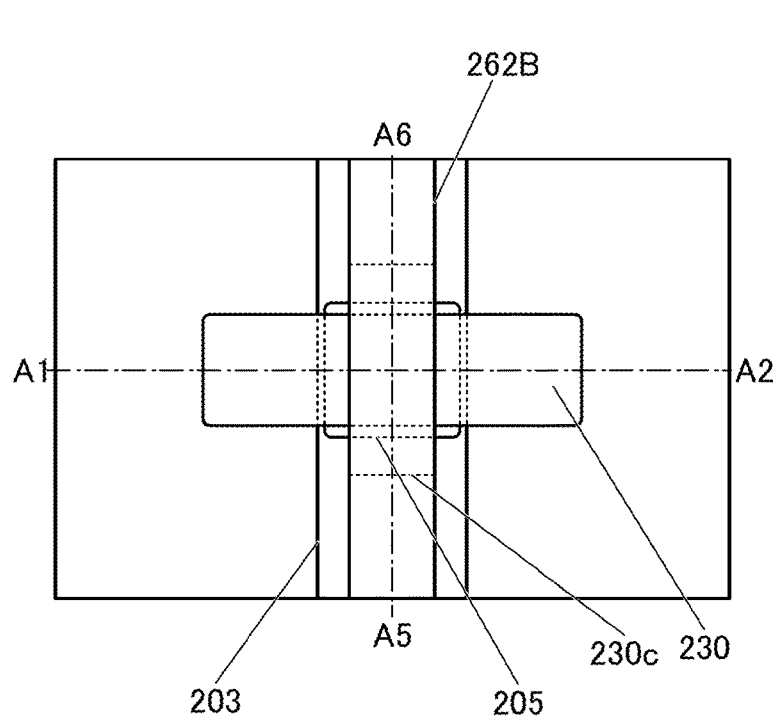
FIGS. 22A to 22C A top view and cross-sectional views illustrating a method for fabricating a semiconductor device of one embodiment of the present invention.
Figure 22C:
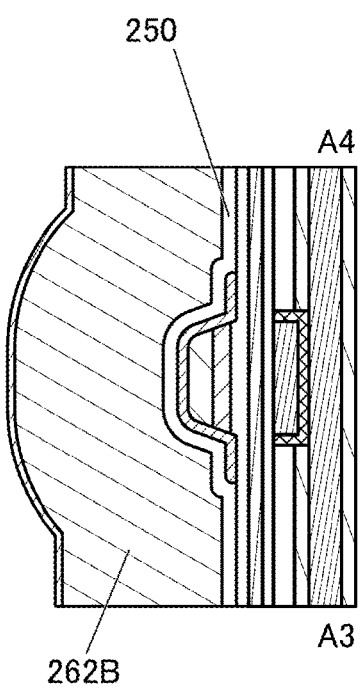
Figure 22B:
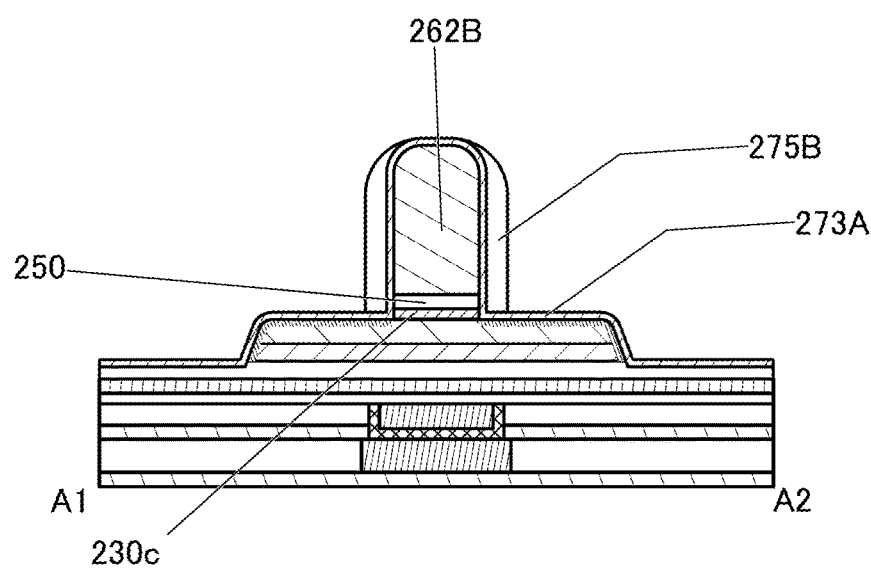

Next, the insulating film 275A is subjected to anisotropic etching treatment to form an insulator 275B (see FIG. 22).

Dry etching treatment is preferably performed as the above anisotropic etching treatment. In this manner, the insulating film deposited on the plane substantially parallel to the substrate surface can be removed, so that the insulator 275B can be formed in a self-aligned manner.

Figure 23A:
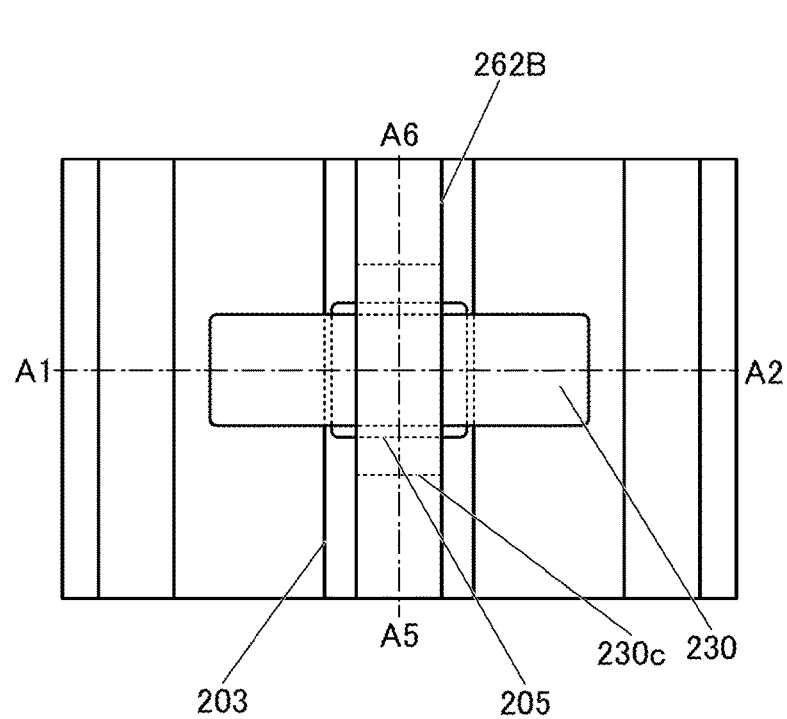
FIGS. 23A to 23C A top view and cross-sectional views illustrating a method for fabricating a semiconductor device of one embodiment of the present invention.
Figure 23C:
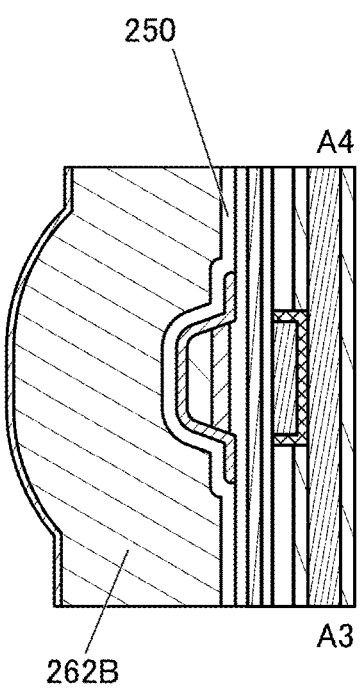
Figure 23B:
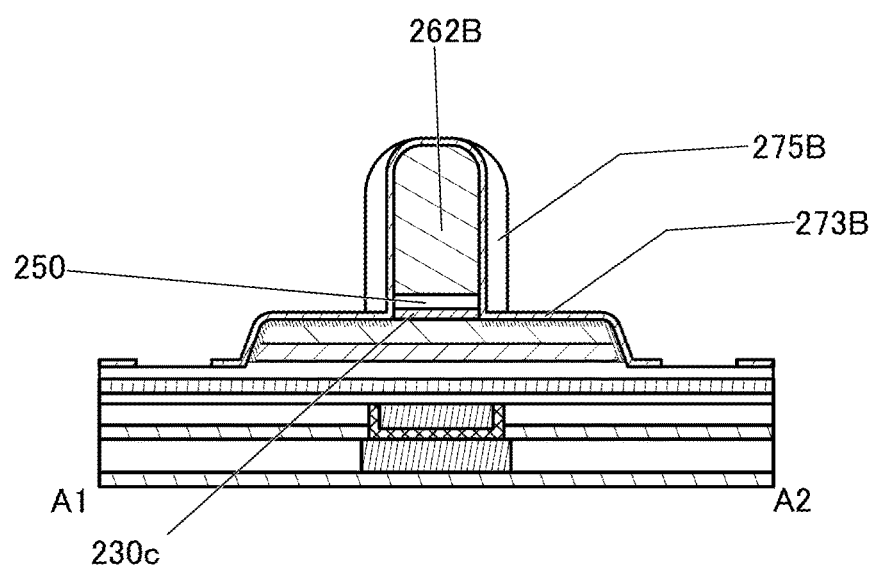

Then, the insulating film 273A is processed by a lithography method to form an insulator 273B including openings (see FIG. 23).

Next, an insulating film to be the insulator 280 is deposited to cover the insulator 273B, the oxide 230, the insulator 275B, and the dummy gate layer 262B. The insulating film to be the insulator 280 can be deposited by a sputtering method, a CVD method, an MBE method, a PLD method, an ALD method, or the like.

Figure 24A:
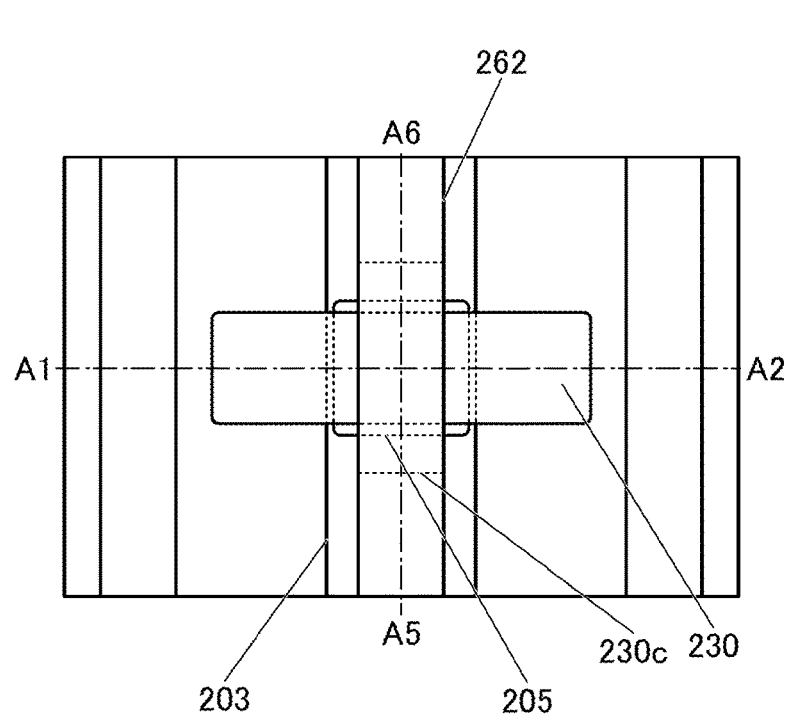
FIGS. 24A to 24C A top view and cross-sectional views illustrating a method for fabricating a semiconductor device of one embodiment of the present invention.
Figure 24C:
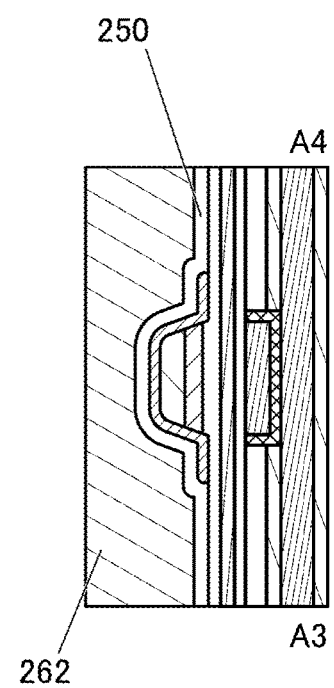
Figure 24B:
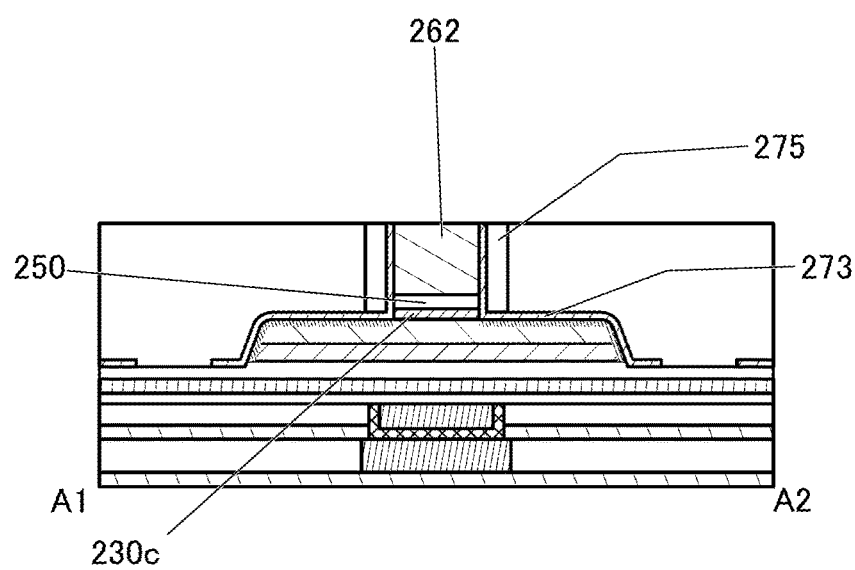
Figure 25A:
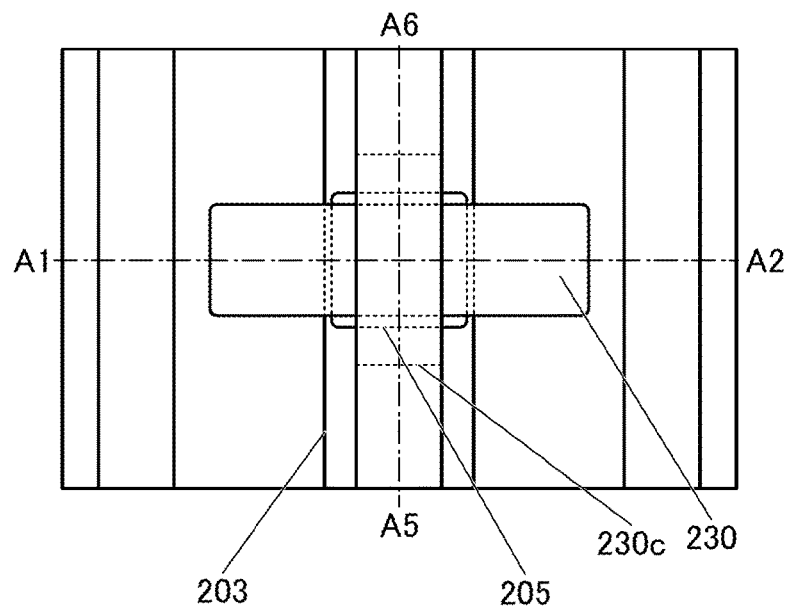
FIGS. 25A to 25C A top view and cross-sectional views illustrating a method for fabricating a semiconductor device of one embodiment of the present invention.
Figure 25C:
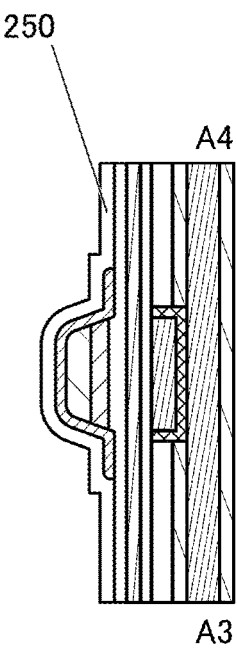
Figure 25B:
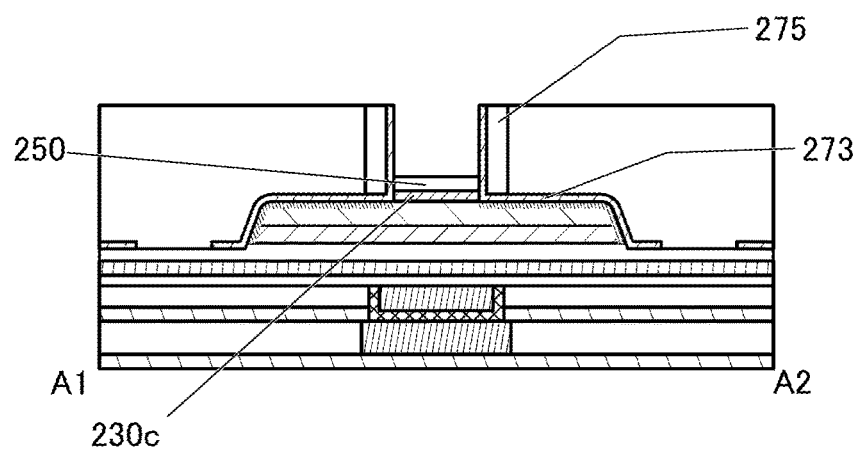
Figure 26A:
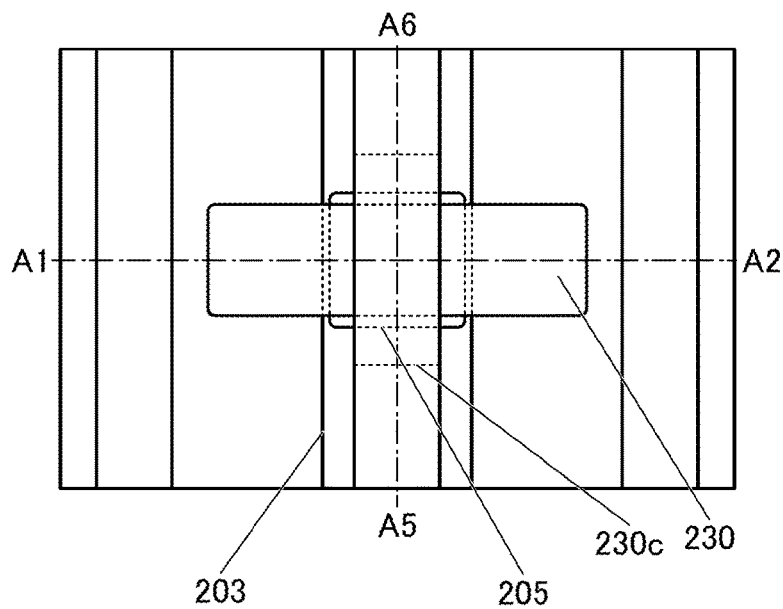
FIGS. 26A to 26C A top view and cross-sectional views illustrating a method for fabricating a semiconductor device of one embodiment of the present invention.
Figure 26C:
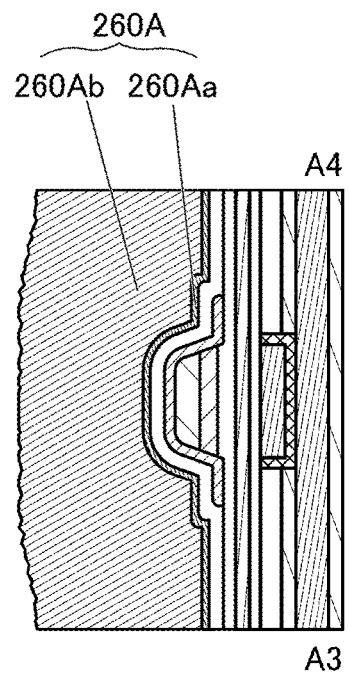
Figure 26B:
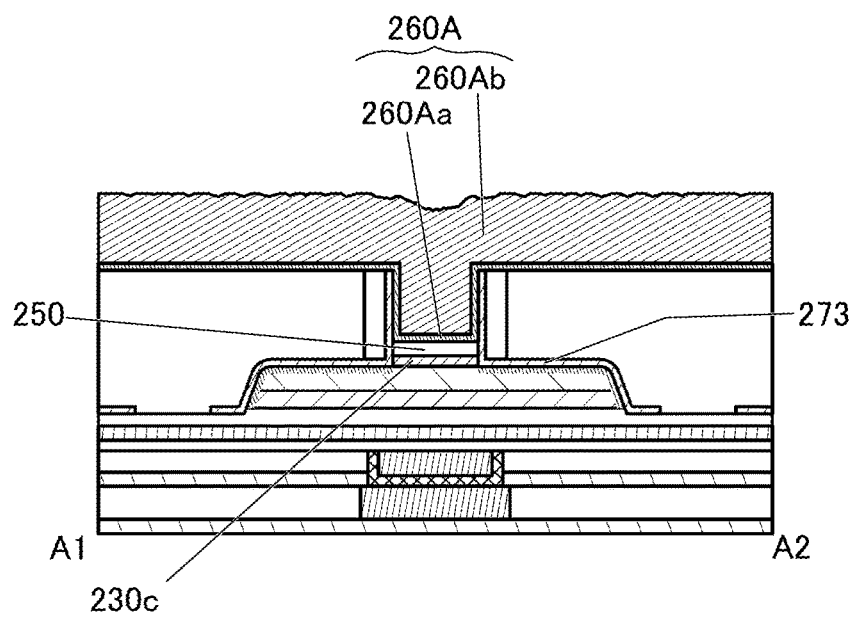

Next, the insulating film to be the insulator 280, the dummy gate layer 262B, the insulator 273B, and the insulator 275B are partly removed until part of the dummy gate layer 262B is exposed, whereby the insulator 280, the dummy gate 262, the insulator 273, and the insulator 275 are formed (see FIG. 24). CMP treatment is preferably employed for forming the insulator 280, the dummy gate 262, the insulator 273, and the insulator 275.

As mentioned above, when the dummy gate film 262A has a two-layer structure in which a conductive film and a resin film over the conductive film are formed, for example, in CMP treatment, the conductive film functions as a stopper film for the CMP treatment in some cases. Alternatively, the end of the CMP treatment can be detected with the conductive film in some cases, so that variation in the height of the dummy gate 262 can be reduced in some cases. As illustrated in the drawing, the top surface of the dummy gate 262 is substantially aligned with the top surfaces of the insulator 273 and the insulator 280.

Next, the dummy gate 262 is removed. The dummy gate 262 can be removed by wet etching, dry etching, ashing, or the like. Alternatively, a plurality of the above treatments may be performed in combination as appropriate. For example, wet etching treatment may be performed after ashing treatment. By the removal of the dummy gate 262, the surface of the insulator 250 is exposed (see FIG. 25).

Next, the conductive film 260Aa and the conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 26).

Figure 27A:
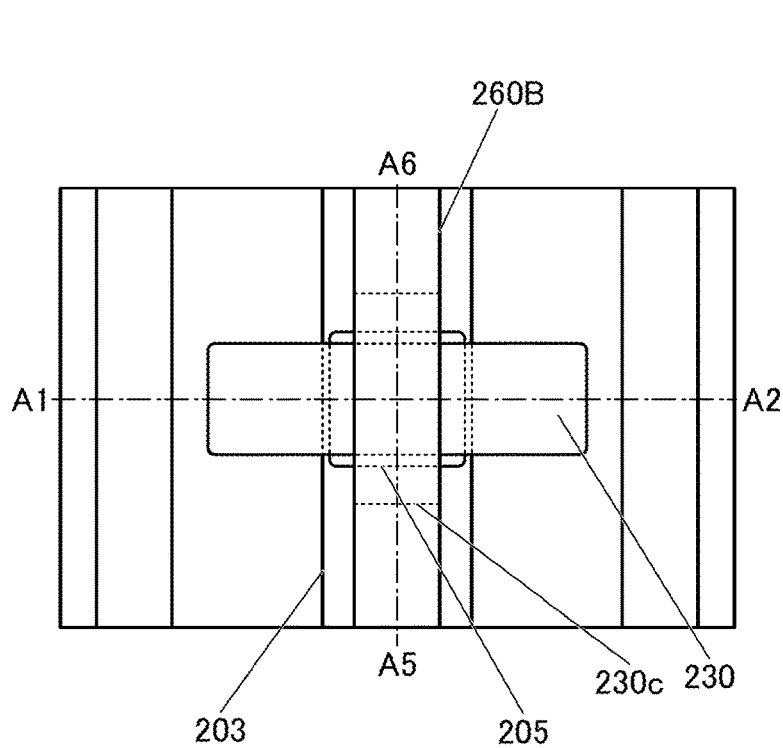
FIGS. 27A to 27C A top view and cross-sectional views illustrating a method for fabricating a semiconductor device of one embodiment of the present invention.
Figure 27C:
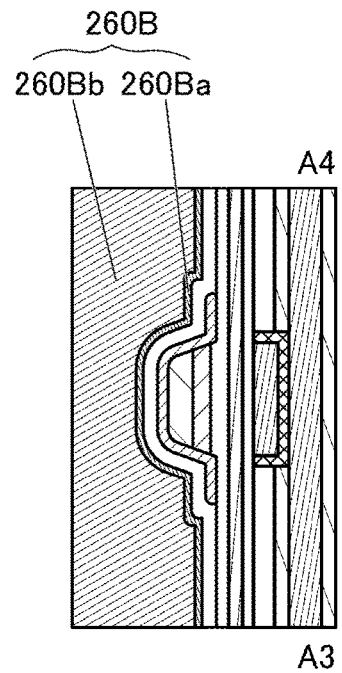
Figure 27B:
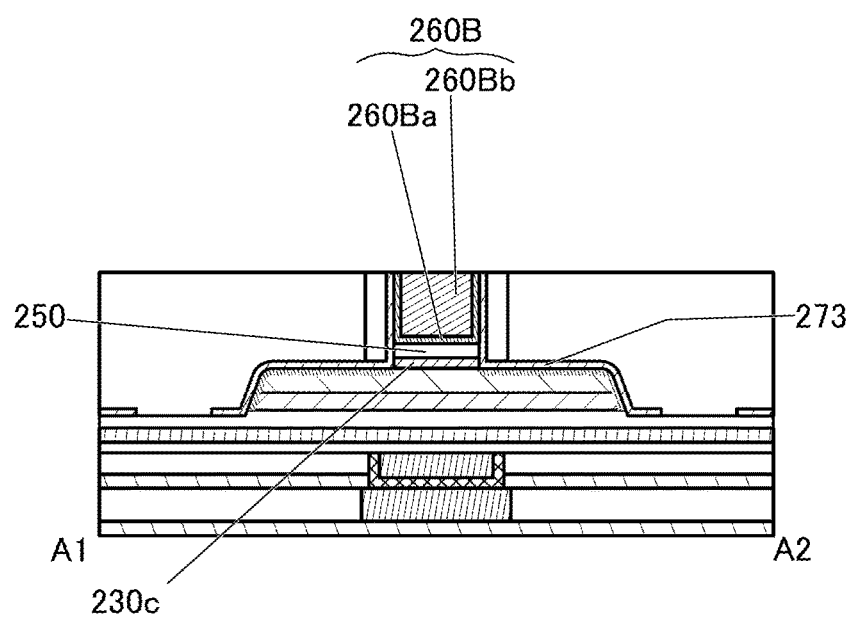

Then, the conductive film 260Aa and the conductive film 260Ab are polished by CMP treatment until the insulator 280 is exposed, whereby a conductor 260B including a conductor 260Ba and a conductor 260Bb is formed (see FIG. 27).

Next, the conductor 260Ba and the conductor 260Bb are partly removed, so that the thickness of the conductor 260B is reduced; thus, the conductor 260*a* and the conductor 260*b* are formed. For the reduction in thickness, wet etching or dry etching can be used. It is preferable that the amount of reduced thickness be approximately one fourth of the thickness of the conductor 260B (see FIG. 28).

Next, an insulating film to be the insulator 270 is deposited. The insulating film to be the insulator 270 can be deposited by a sputtering method, a CVD method, an MBE method, a PLD method, an ALD method, or the like. For example, a material similar to that for the insulator 275 is preferably used for the insulating film to be the insulator 270.

Figure 28A:
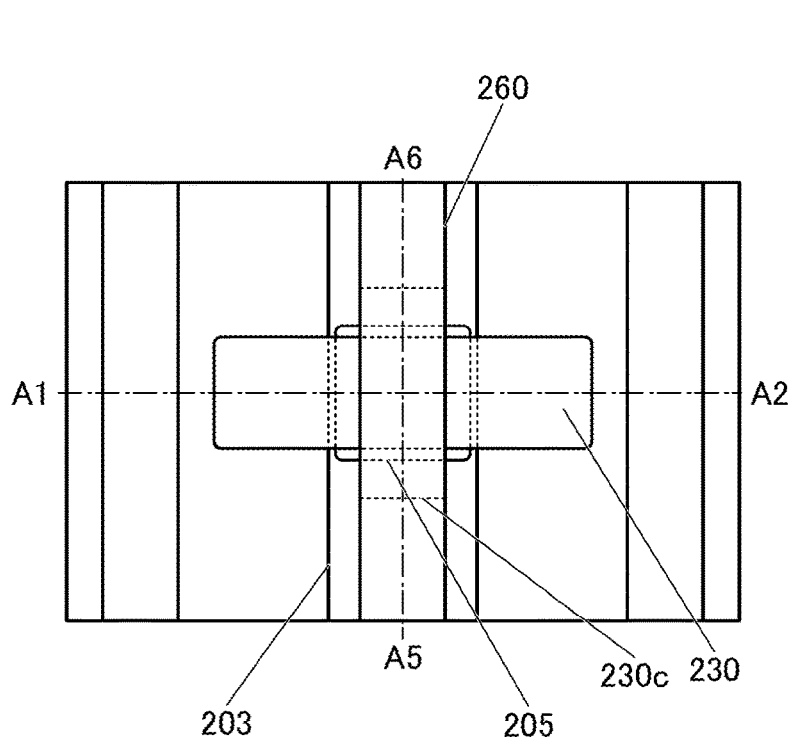
FIGS. 28A to 28C A top view and cross-sectional views illustrating a method for fabricating a semiconductor device of one embodiment of the present invention.
Figure 28C:
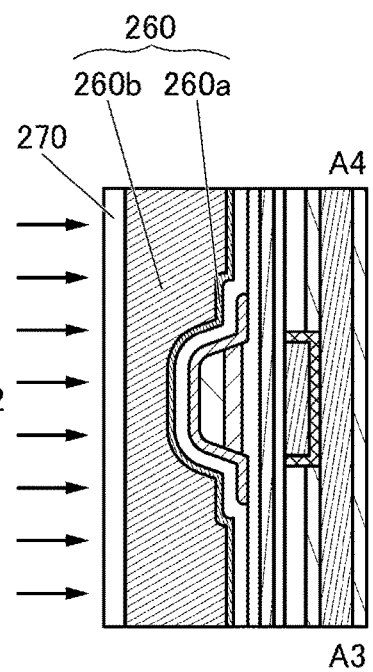
Figure 28B:
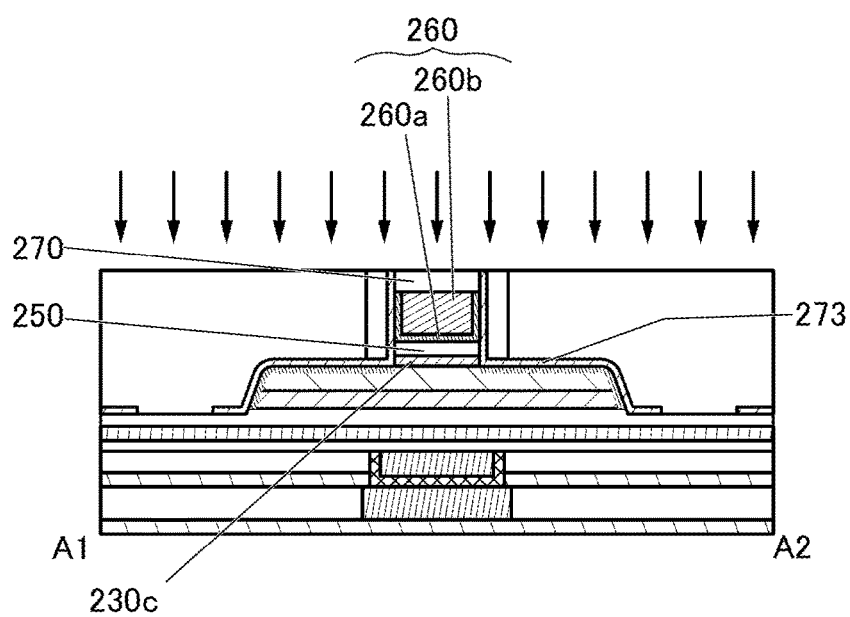
Figure 29A:
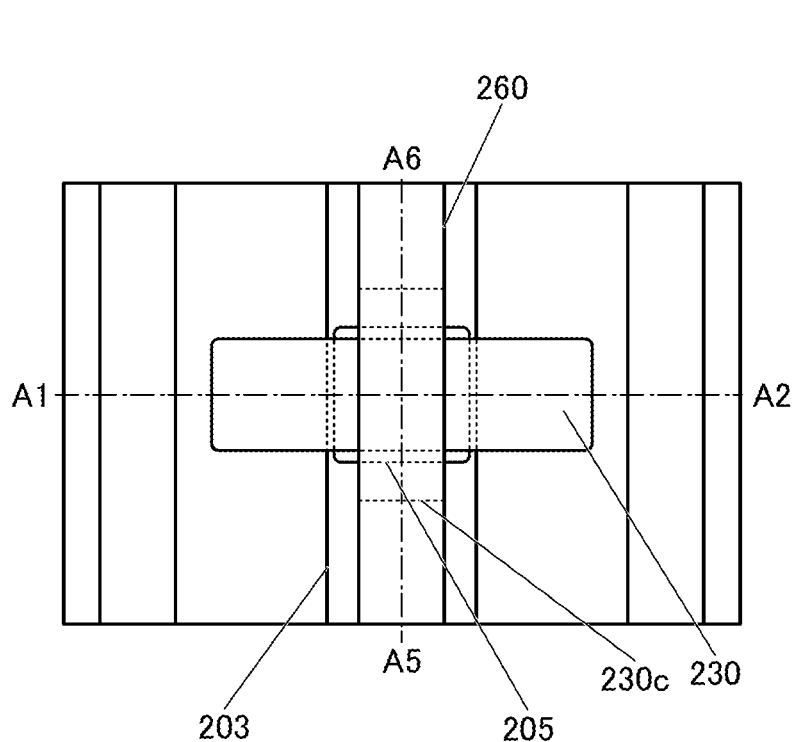
FIGS. 29A to 29C A top view and cross-sectional views illustrating a method for fabricating a semiconductor device of one embodiment of the present invention.
Figure 29C:
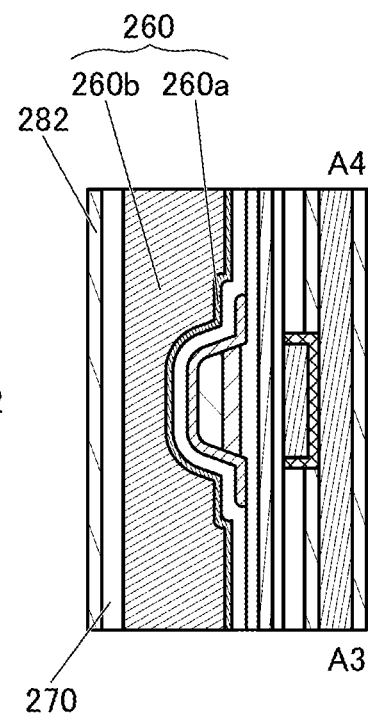
Figure 29B:
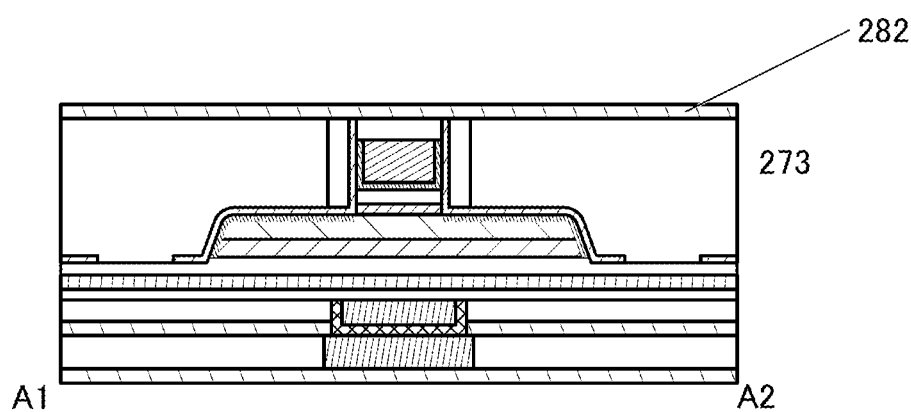
Figure 30A:
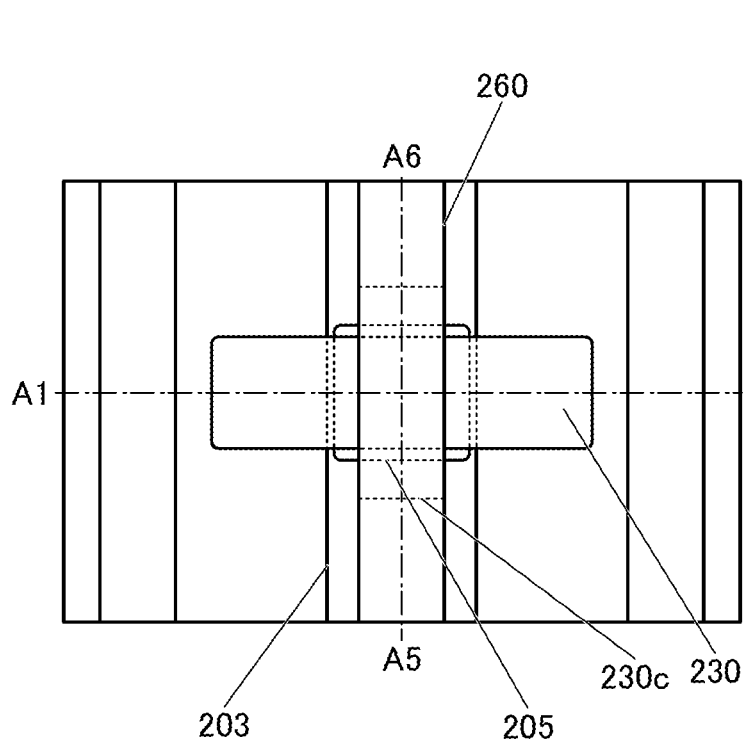
FIGS. 30A to 30C A top view and cross-sectional views illustrating a method for fabricating a semiconductor device of one embodiment of the present invention.
Figure 30C:
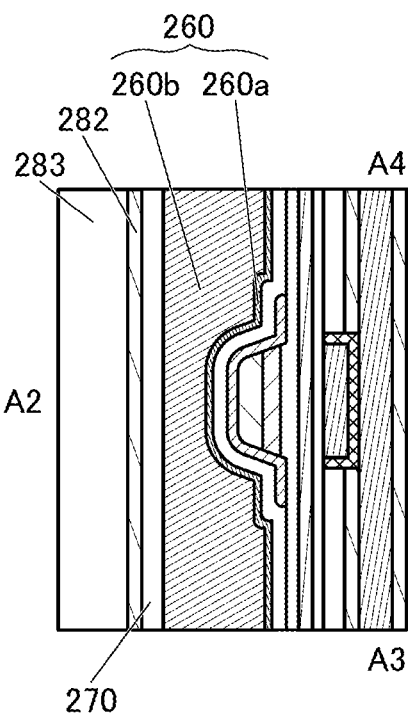
Figure 30B:
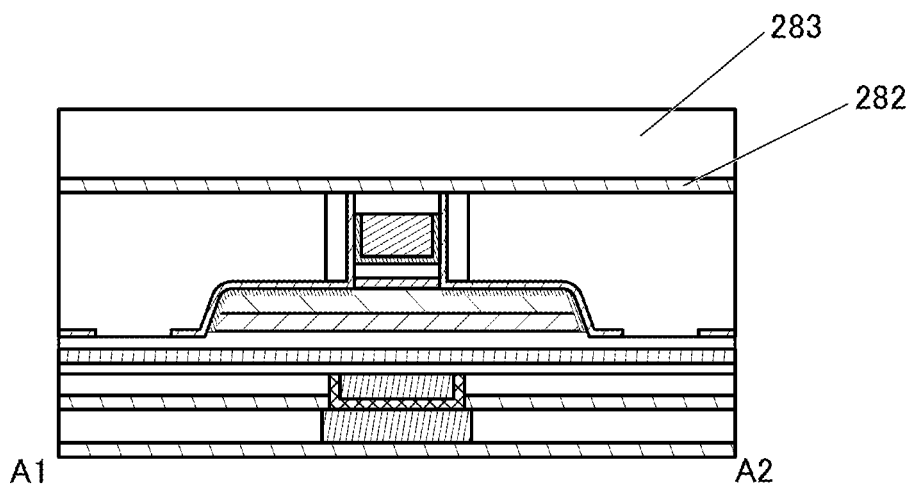

Next, the insulating film to be the insulator 270 is polished by CMP treatment until the insulator 280 is exposed, whereby the insulator 270 can be formed (see FIG. 28).

Next, treatment for injecting oxygen into the insulator 280 may be performed. As the treatment for injecting oxygen, plasma treatment using a gas containing oxygen, treatment for injecting oxygen ions with an ion implantation apparatus, or the like can be given. Oxygen can be injected into the insulator 280 by plasma irradiation using a gas containing oxygen with an apparatus including a high-density plasma source, for example. In this embodiment, oxygen ions are implanted with an ion implantation apparatus (FIG. 28).

In particular, ion implantation with an ion implantation apparatus can control the amount of ion implantation and the depth of ion implantation independently, which is preferable. That is, an optimal amount of oxygen can be injected into the insulator 280 at an optimal depth, so that a semiconductor device including a high-performance transistor with small variation in performance can be manufactured. The implantation amount and the implantation depth can be optimized as appropriate depending on the thickness of the insulator 280, the size of the transistor, the arrangement density of the transistor, and the arrangement of the transistor.

An insulating film to be the insulator 282 may be formed over the insulator 280 to inject oxygen into the insulator 280. The insulating film to be the insulator 282 can be deposited by a sputtering method, a CVD method, an MBE method, a PLD method, an ALD method, or the like. An aluminum oxide film is preferably deposited as the insulating film to be the insulator 282 by a sputtering method, for example. When aluminum oxide is deposited by a sputtering method using a gas containing oxygen, oxygen can be injected into the insulator 280. That is, the insulator 280 contains excess oxygen. Furthermore, the hydrogen contained in the insulator 280 can be inhibited from being diffused into the oxide 230 in some cases (see FIG. 29).

Heat treatment may be performed in the following steps. By the heat treatment, excess oxygen contained in the insulator 280 can be injected into the oxide 230 through the openings in the insulator 273 and the insulator 224. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is preferably performed in an atmosphere containing an oxygen gas. Alternatively, the heat treatment may be performed under a reduced pressure. For example, the heat treatment is performed at 400° C. in an atmosphere containing oxygen for one hour.

Next, the insulator to be the insulator 283 may be deposited over the insulator 282. The insulating film to be the insulator 283 can be deposited by a sputtering method, a CVD method, an MBE method, a PLD method, an ALD method, or the like (see FIG. 30).

Figure 31A:
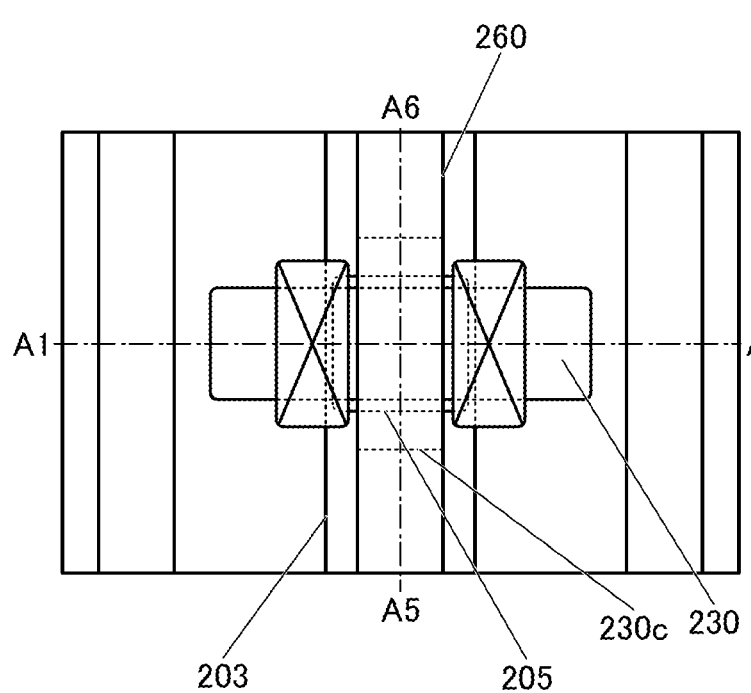
FIGS. 31A to 31C A top view and cross-sectional views illustrating a method for fabricating a semiconductor device of one embodiment of the present invention.
Figure 31C:
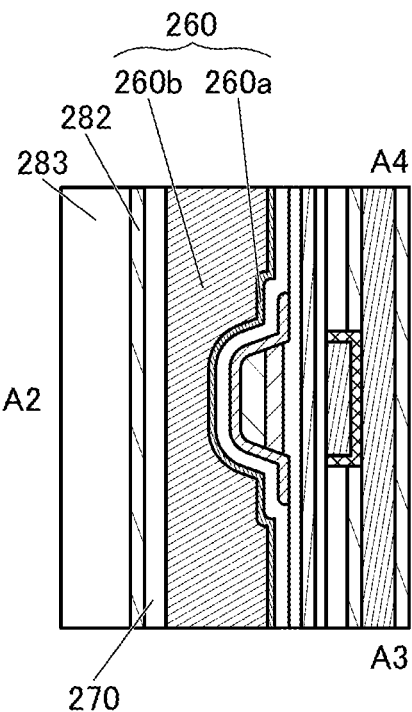
Figure 31B:
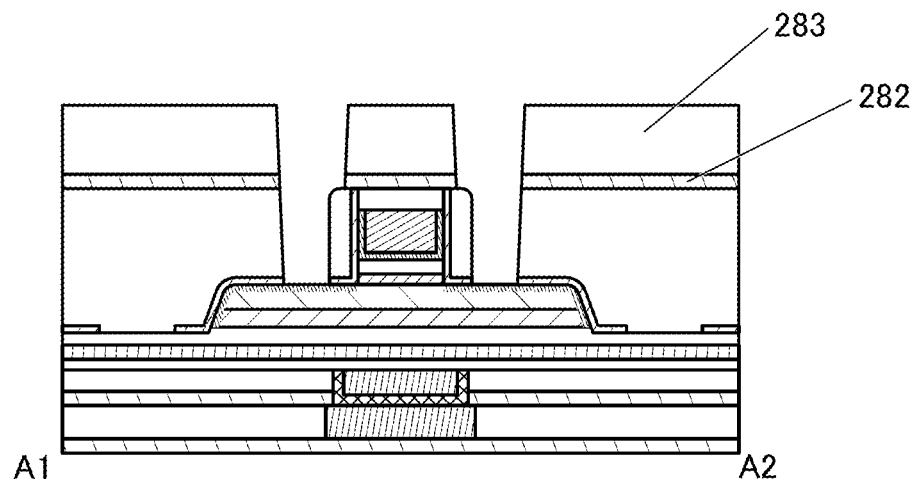

Next, openings reaching the region 231 of the oxide 230 are formed in the insulator 273, the insulator 280, the insulator 282, and the insulator 283 (see FIG. 31). The openings may be formed by a lithography method. Here, the openings are formed so that the conductor 240 is provided in contact with the side surface of the insulator 275. The openings are preferably formed under a condition where the insulator 275 is hardly etched, in other words, the etching rate of the insulator 280 is preferably higher than the etching rate of the insulator 275. When the etching rate of the insulator 275 is set to 1, the etching rate of the insulator 280 is preferably set to 5 or more, further preferably 10 or more. With such an opening condition, the opening portions can be positioned on the region 231 in a self-aligned manner; thus, a miniaturized transistor can be fabricated. For example, even in the case where the opening is misaligned to a position overlapping with the top surface of the insulator 270, the opening does not reach the conductor 260 when an opening condition is employed where the etching rate of the insulator 270, like that of the insulator 275, is much lower than the etching rate of the insulator 280. In other words, an electrical short-circuit between the conductor 260 and the conductor 240a or the conductor 240b can be prevented. Accordingly, tolerance for misalignment of the conductor 260 and the opening can be extended in a lithography process; thus, an increase in the yield can be expected.

Next, the conductive film to be the conductor 240a and the conductor 240b is deposited. The conductive film to be the conductor 240a and the conductor 240b desirably has a stacked-layer structure which includes a conductor having a function of inhibiting the passage of impurities such as water and hydrogen. For example, a stacked layer of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Here, when the openings are formed in the insulator 273, the insulator 280, the insulator 282, and the insulator 283, for example, the low-resistance region of the region 231 of the oxide 230 may be removed. When the conductive film to be the conductor 240a and the conductor 240b is deposited in the openings, there are regions where the oxide 230 is in contact with the conductive film to be the conductor 240a and the conductor 240b; accordingly, a metal compound or an oxygen vacancy is formed in the regions, and thus the resistances of the contact regions between the oxide 230 and the conductive film to be the conductor 240a and the conductor 240b can be reduced. When the resistances of the contact regions are reduced, sufficient ohmic contacts between the oxide 230 and each of the conductor 240a and the conductor 240b can be made. Therefore, the conductive film to be the conductor 240a and the conductor 240b preferably contains a metal element such as aluminum, ruthenium, titanium, tantalum, tungsten, or chromium.

Next, CMP treatment is performed to remove part of the conductive film to be the conductor 240a and the conductor 240b, so that the insulator 283 is exposed. As a result, the conductive film remains only in the openings, so that the conductor 240a and the conductor 240b having flat top surfaces can be formed (see FIG. 4).

The conductor 240a and the conductor 240b may be formed after aluminum oxide is formed on side wall portions of the openings. By forming aluminum oxide on the side wall portions of the openings, the passage of oxygen from the outside can be inhibited and oxidation of the conductor 240a and the conductor 240b can be prevented. Furthermore, impurities such as water and hydrogen can be prevented from being diffused from the conductor 240a and the conductor 240b to the outside. The aluminum oxide can be formed by depositing aluminum oxide in the openings by an ALD method or the like and then performing anisotropic etching.

Thus, by the method for fabricating a semiconductor device described with reference to FIG. 21 to FIG. 31, the semiconductor device including the transistor 200a illustrated in FIG. 4 can be fabricated.

According to one embodiment of the present invention, a semiconductor device having favorable electrical characteristics can be provided. Alternatively, according to one embodiment of the present invention, a semiconductor device having a low off-state current can be provided. Alternatively, according to one embodiment of the present invention, a semiconductor device having a high on-state current can be provided. Alternatively, according to one embodiment of the present invention, a highly reliable semiconductor device can be provided. Alternatively, according to one embodiment of the present invention, a semiconductor device that can be miniaturized or highly integrated can be provided. Alternatively, according to one embodiment of the present invention, a semiconductor device with low power consumption can be provided. Alternatively, according to one embodiment of the present invention, a semiconductor device with high productivity can be provided.

The structures and methods described in this embodiment can be used in an appropriate combination with any of the structures and methods described in the other embodiments.

<Modification Example of Semiconductor Device>

An example of a semiconductor device including the transistor 200 of one embodiment of the present invention which is different from the semiconductor device described in the above <Structure example 1 of semiconductor device> and <Structure example 2 of semiconductor device> will be described below with reference to FIG. 5.

Figure 5A:
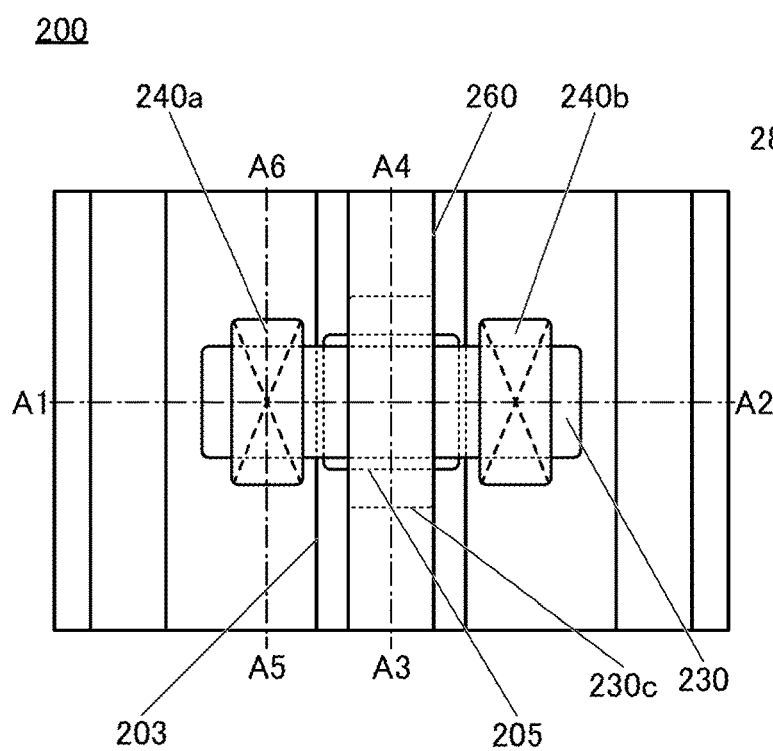
FIGS. 5A to 5C A top view and cross-sectional views illustrating a method for fabricating a semiconductor device of one embodiment of the present invention.
Figure 5C:
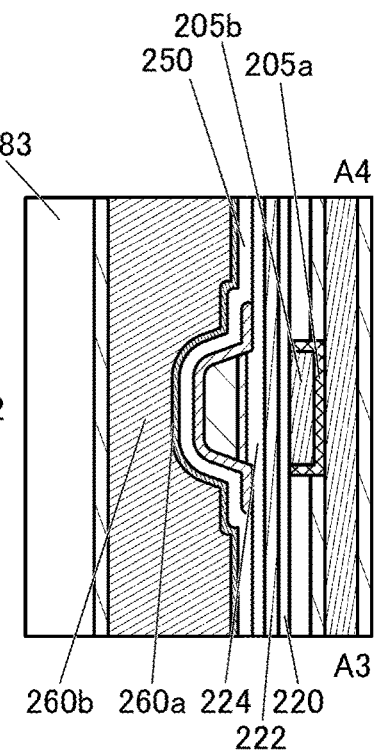
Figure 5B:
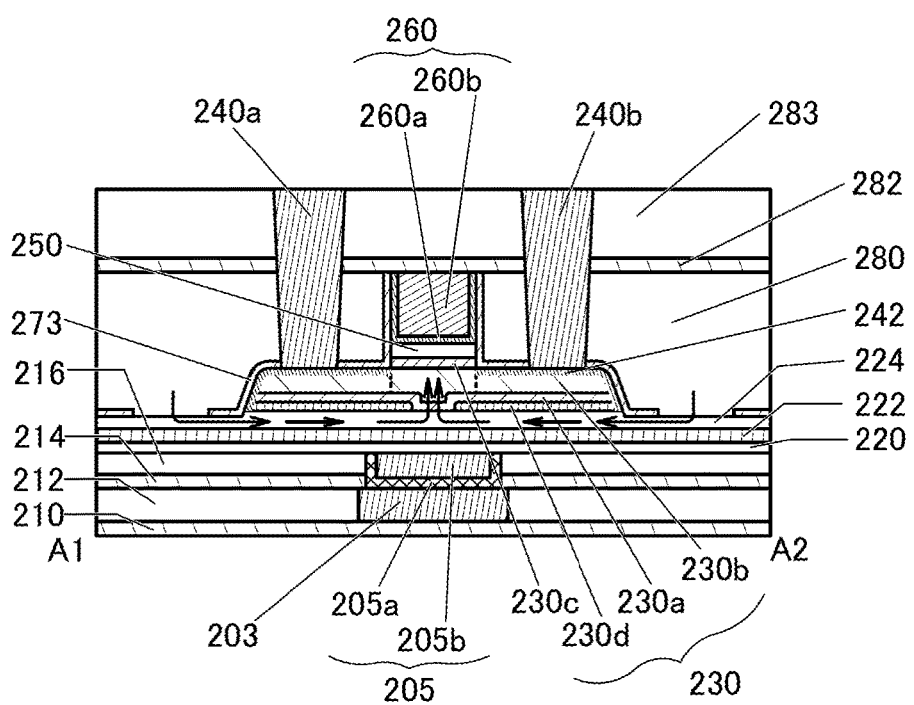

FIG. 5(A) is a top view of the semiconductor device including the transistor 200. FIG. 5(B) and FIG. 5(C) are cross-sectional views of the semiconductor device. Here, FIG. 5(B) is a cross-sectional view of a portion indicated by dashed-dotted line A1-A2 in FIG. 5(A) and is a cross-sectional view of the transistor 200 in the channel length direction. FIG. 5(C) is a cross-sectional view of a portion indicated by dashed-dotted line A3-A4 in FIG. 5(A) and is a cross-sectional view of the transistor 200 in the channel width direction. Note that for simplification of the drawing, some components are not illustrated in the top view in FIG. 5(A).

Note that in the semiconductor device illustrated in FIG. 5, components having the same functions as the components in the semiconductor device described in the above <Structure example 1 of semiconductor device> and <Structure example 2 of semiconductor device> (see FIG. 1 and FIG. 4) are denoted by the same reference numerals.

A structure of the transistor 200 will be described with reference to FIG. 5 below. Note that also in this section, the materials described in detail in <Structure example 1 of semiconductor device> and <Structure example 2 of semiconductor device> can be used as the materials for the transistor 200.

The semiconductor device illustrated in FIG. 5 is different from the semiconductor device described in the above <Structure example 1 of semiconductor device> and <Structure example 2 of semiconductor device> (see FIG. 1 and FIG. 4) in that an oxide 230d including an opening is provided between the insulator 224 and the oxide 230a. The oxide 230a is in contact with the insulator 224 through the opening provided in the oxide 230d.

The material used for the oxide 230d preferably has higher proportions of Ga and Zn than those for the oxide 230a and the oxide 230b. Specifically, the atomic proportion of the element M in constituent elements in the metal oxide used for the oxide 230d is preferably lower than the atomic proportion of the element M in constituent elements in the metal oxide used for the oxide 230a, and higher than the atomic proportion of the element M in constituent elements in the metal oxide used for the oxide 230b. Moreover, the atomic ratio of the element M to In in the metal oxide used for the oxide 230d is preferably greater than the atomic ratio of the element M to In in the metal oxide used for the oxide 230a and the atomic ratio of the element M to In in the metal oxide used for the oxide 230b. As the metal oxide 230d, an oxide film formed by a sputtering method using a target with In:Ga:Zn=1:3:4 [atomic ratio] can be used, for example.

For the oxide 230d, a material that is less likely to transmit oxygen is preferably used. The oxide 230d includes the opening in a position overlapping with the region 234. Therefore, oxygen contained in the insulator 224 is diffused into the oxide 230a and the oxide 230b through the opening. Arrows in FIG. 5(B) are shown to visualize the diffusion of oxygen contained in the insulator 280 and the insulator 224. Oxygen contained in the insulator 280 is diffused into the insulator 224 through the opening provided in the insulator 273. In addition, oxygen in the insulator 224 is diffused into the region 234 of the oxide 230a and the oxide 230b through the opening provided in the oxide 230d. Note that oxygen supplied to the oxide 230a and the oxide 230b may be diffused to the region 231. By provision of the oxide 230d in the transistor 200, oxygen can be supplied to the region 234 efficiently.

In the case where the transistor 200 including the oxide 230d is fabricated, an oxide film to be the oxide 230d (hereinafter referred to as an oxide film 230D) is formed over the insulator 224. Next, an opening portion is formed in the oxide film 230D. The opening portion is formed to overlap with the conductor 205 and the conductor 203. The opening is preferably formed to overlap with the region 234 of the oxide 230 that is to be formed in a later step.

Next, over the oxide film 230D, the oxide film 230A and the oxide film 230B are formed in a manner similar to that in the above <Method 1 for fabricating semiconductor device>. Heat treatment may be performed as appropriate before and after the formation of the film.

Next, by a lithography method, the oxide film 230B, the oxide film 230A, and the oxide film 230D are processed into island shapes to form the oxide 230b, the oxide 230a, and the oxide 230d. For the processing, a dry etching method or a wet etching method can be employed. The processing by a dry etching method is suitable for microfabrication.

After that, a process similar to that in the above <Method 1 for fabricating semiconductor device> is performed, whereby the transistor 200 including the oxide 230d can be fabricated.

The compositions, structures, methods, and the like described in this embodiment can be used in an appropriate combination with the compositions, structures, methods, and the like described in the other embodiments.

Embodiment 2

In this embodiment, a mode of a semiconductor device that functions as a memory device and is different from one in the above embodiment is described with reference to FIG. 33 to FIG. 36.

<Memory Device 1>

Figure 33A:
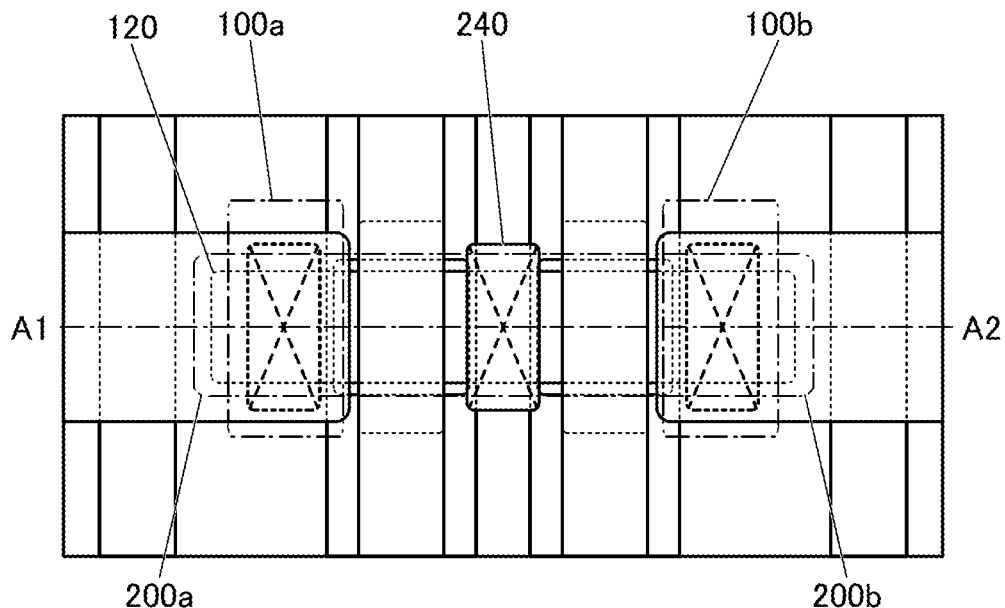
FIGS. 33A and 33B A top view and a cross-sectional view of a semiconductor device of one embodiment of the present invention.
Figure 33B:
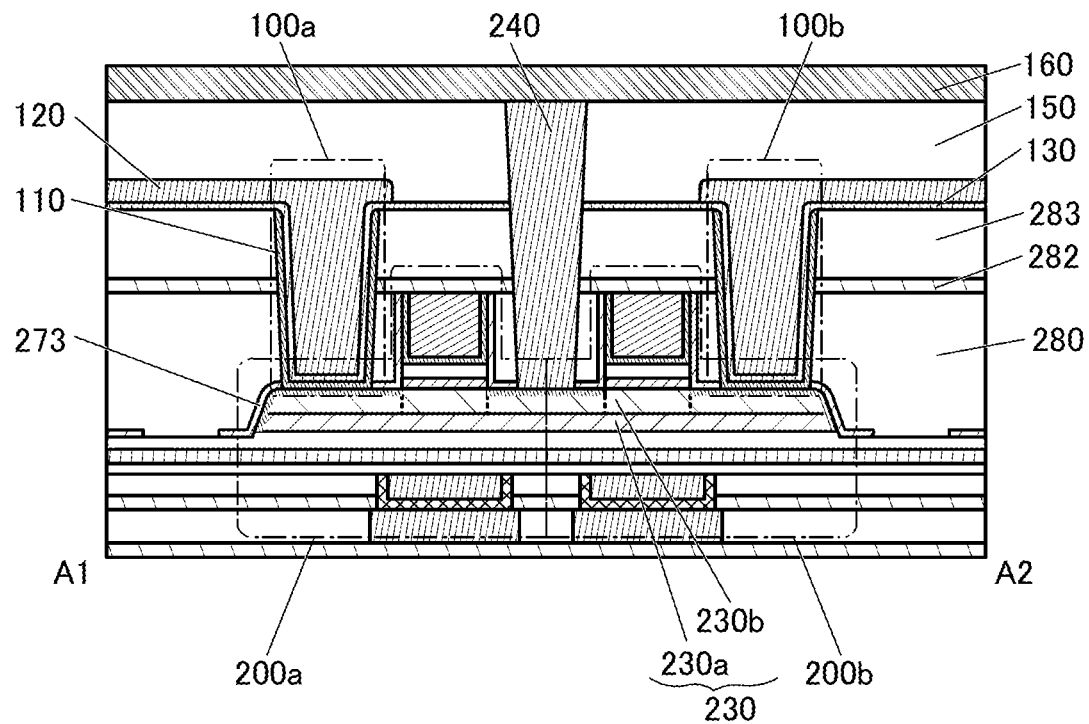

FIGS. 33(A) and 33(B) illustrate a cell 600 included in a memory device. The cell 600 includes the transistor 200a, the transistor 200b, a capacitor 100a, and a capacitor 100b. FIG. 33(A) is a top view of the cell 600. FIG. 33(B) is a cross-sectional view of a portion indicated by a dashed-dotted line A1-A2 in FIG. 33(A). For clarity of the drawing, some components are not illustrated in the top view of FIG. 33(A).

The cell 600 includes the transistor 200a, the transistor 200b, the capacitor 100a over and overlapping with the transistor 200a, and the capacitor 100b over and overlapping with the transistor 200b. In the cell 600, the transistor 200a and the capacitor 100a are sometimes positioned symmetrically to the transistor 200b and the capacitor 100b, respectively. It is thus preferable that the transistor 200a and the transistor 200b have similar structures and the capacitor 100a and the capacitor 100b have similar structures.

The cell 600 includes an insulator 130 over the insulator 283 that is over the transistor 200a and the transistor 200b, and an insulator 150 over the insulator 130. An insulator that can be used as the insulator 283 can be used as the insulator 150.

The cell 600 further includes a conductor 160 over the insulator 150. The conductor 240 is provided to be embedded in an opening formed in the insulator 273, the insulator 280, the insulator 282, the insulator 283, the insulator 130, and the insulator 150. A bottom surface of the conductor 240 is in contact with the region 231 and a top surface of the conductor 240 is in contact with the conductor 160.

The transistor 200 described in the above embodiment can be used as the transistor 200a and the transistor 200b. Note that the above description of the transistor 200 can be referred to for the structures of the transistor 200a and the transistor 200b. In FIGS. 33(A) and 33(B), reference numerals for the components of the transistor 200a and the transistor 200b are omitted. Note that the transistor 200a and the transistor 200b illustrated in FIGS. 33(A) and 33(B) are examples and the structures are not limited thereto; an appropriate transistor is used in accordance with a circuit configuration or a driving method.

The transistor 200a and the transistor 200b share the oxide 230, and accordingly share one of a source and a drain of the transistor 200a and one of a source and a drain of the transistor 200b. Thus, the one of the source and the drain of the transistor 200a and the one of the source and the drain of the transistor 200b are electrically connected to the conductor 240. In this manner, the transistor 200a and the transistor 200b share a contact portion, which can reduce the number of plugs and contact holes. Sharing a wiring that is electrically connected to one of the source and the drain as described above can reduce the area occupied by the memory cell array.

[Capacitor 100a and Capacitor 100b]

As illustrated in FIGS. 33(A) and 33(B), the capacitor 100a is provided in a region overlapping with the transistor 200a. In a similar manner, the capacitor 100b is provided in a region overlapping with the transistor 200b. Note that the capacitor 100b includes components that corresponds to the components included in the capacitor 100a. The structure of the capacitor 100a is described in detail below, and unless otherwise specified, the description of the capacitor 100a can be referred to for the capacitor 100b.

The capacitor 100a includes a conductor 110, the insulator 130, and a conductor 120 over the insulator 130. Here, as the conductor 110 and the conductor 120, a conductor that can be used as the conductor 203, the conductor 205, the conductor 260, or the like can be used.

The capacitor 100a is formed in an opening included in the insulator 273, the insulator 280, the insulator 282, and the insulator 283. At a bottom surface and side surfaces of the opening, the conductor 110 functioning as a lower electrode and the conductor 120 functioning as an upper electrode face each other with the insulator 130 functioning as a dielectric sandwiched therebetween. Here, the conductor 110 of the capacitor 100a is formed in contact with the other of the source and the drain of the transistor 200a.

In particular, when the depth of the opening included in the insulator 280 and the insulator 283 is deeper, the capacitor 100a can have increased capacitance without a change in its projected area. Therefore, the capacitor 100a preferably has a cylinder shape (i.e., the side surface area is larger than the bottom surface area).

The above structure allows the capacitance per unit area of the capacitor 100a to be high, which promotes miniaturization or higher integration of the semiconductor device. The capacitance value of the capacitor 100a can be appropriately set by the thicknesses of the insulator 280 and the insulator 283. Accordingly, a semiconductor device with high design flexibility can be provided.

An insulator having a high dielectric constant is preferably used as the insulator 130. For example, an insulator containing an oxide of one or both of aluminum and hafnium can be used. As the insulator containing an oxide of one or both of aluminum and hafnium, aluminum oxide, hafnium oxide, an oxide containing aluminum and hafnium (hafnium aluminate), or the like is preferably used.

The insulator 130 may have a stacked-layer structure; for example, two or more layers selected from silicon oxide, silicon oxynitride, silicon nitride oxide, silicon nitride, aluminum oxide, hafnium oxide, an oxide containing aluminum and hafnium (hafnium aluminate), and the like may be used for the stacked-layer structure. For example, it is preferable that hafnium oxide, aluminum oxide, and hafnium oxide be deposited in this order by an ALD method to form a stacked-layer structure. Hafnium oxide and aluminum oxide each have a thickness of greater than or equal to 0.5 nm and less than or equal to 5 nm. With such a stacked-layer structure, the capacitor 100a can have a large capacitance value and a low leakage current.

Note that the conductor 110 or the conductor 120 may have a stacked-layer structure. For example, the conductor 110 or the conductor 120 may have a stacked-layer structure of a conductive material containing titanium, titanium nitride, tantalum, or tantalum nitride as its main component and a conductive material containing tungsten, copper, or aluminum as its main component. The conductor 110 or the conductor 120 may have a single-layer structure or a stacked-layer structure of three or more layers.

<Structure of Cell Array>

Next, an example of a cell array in which the above-described cells are arranged in a matrix is described with reference to FIG. 34 to FIG. 37.

Figure 34:
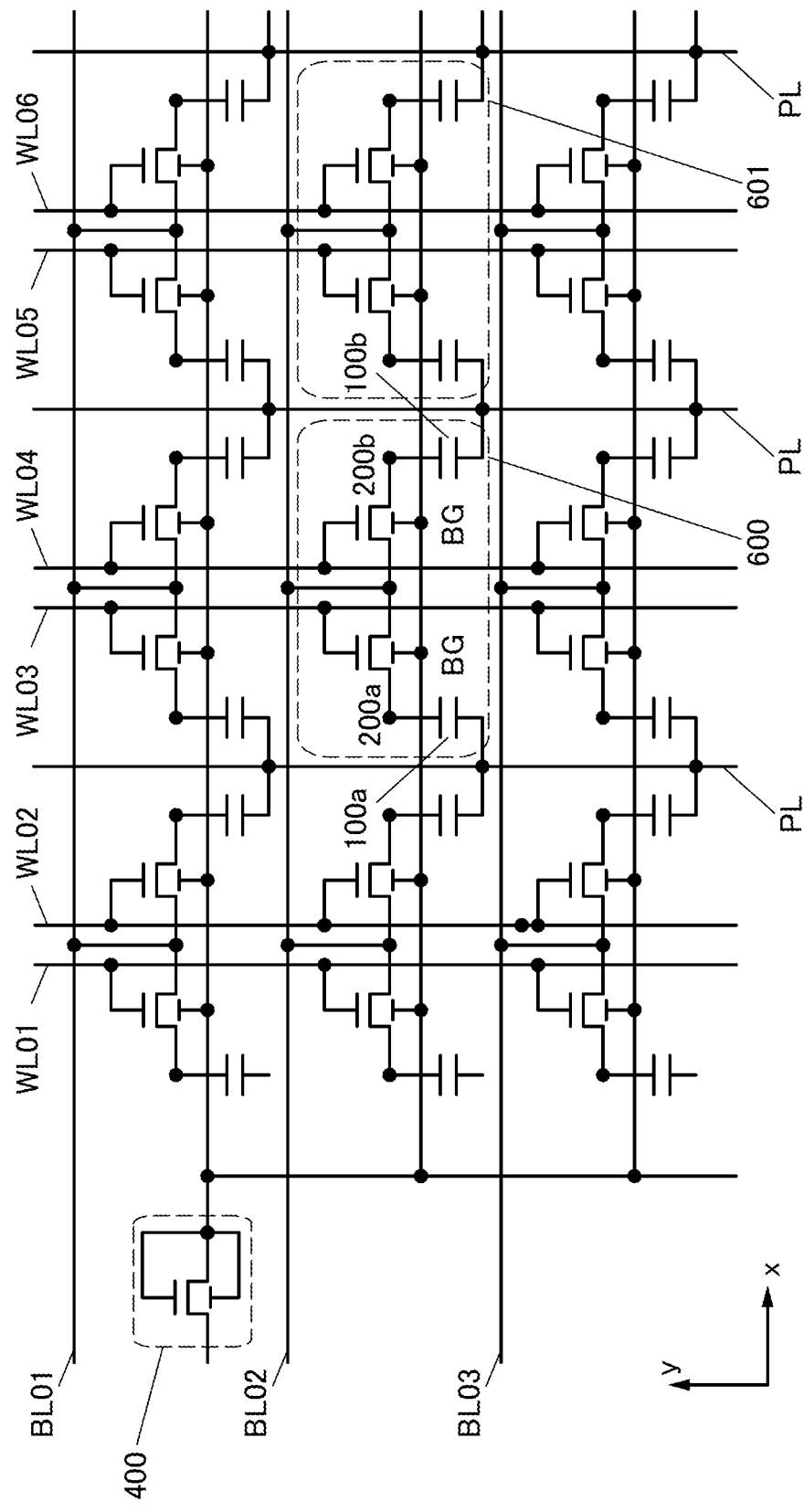
FIG. 34 A circuit diagram of a semiconductor device of one embodiment of the present invention.
Figure 35:
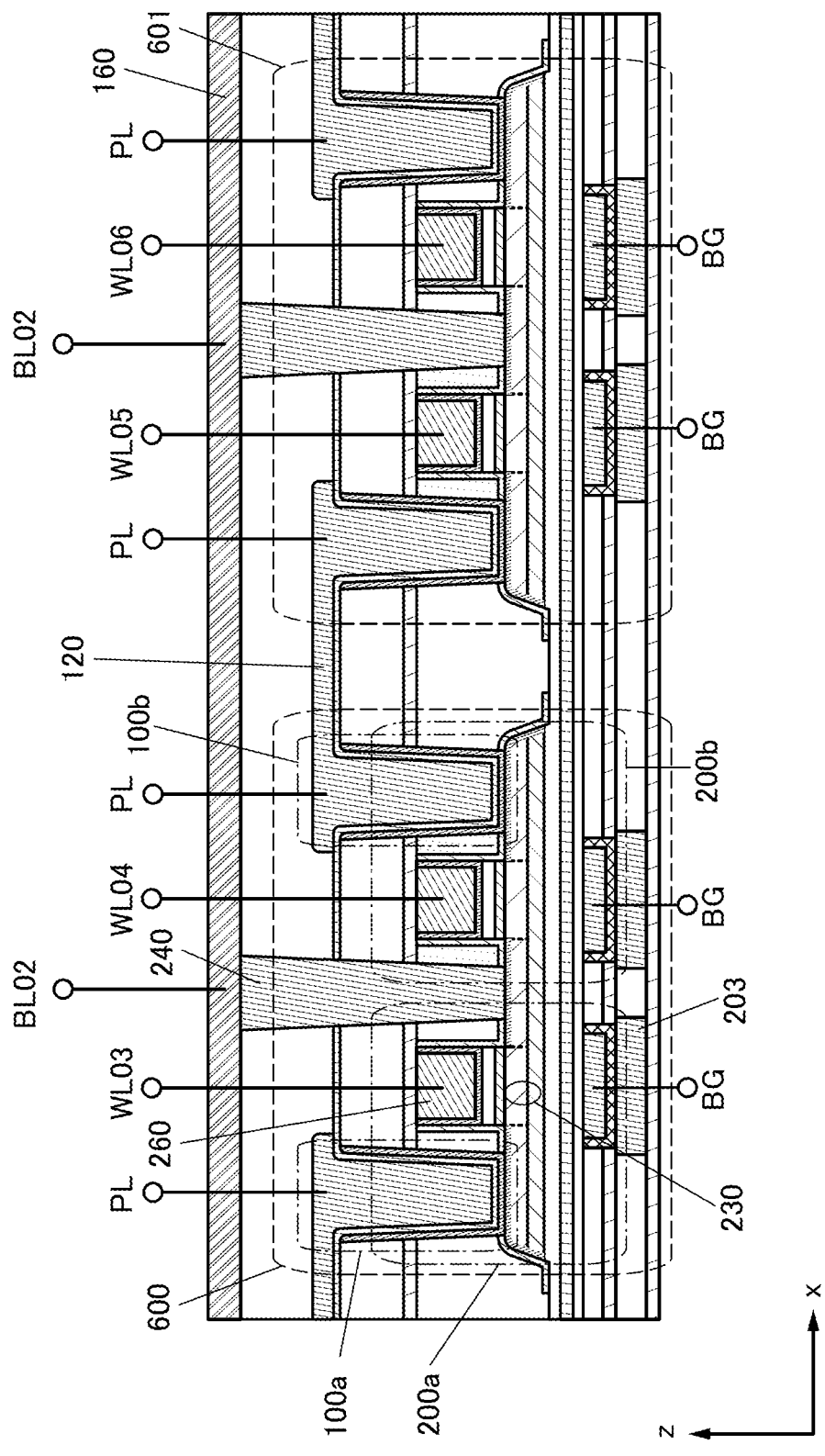
FIG. 35 A cross-sectional view of a semiconductor device of one embodiment of the present invention.
Figure 36:
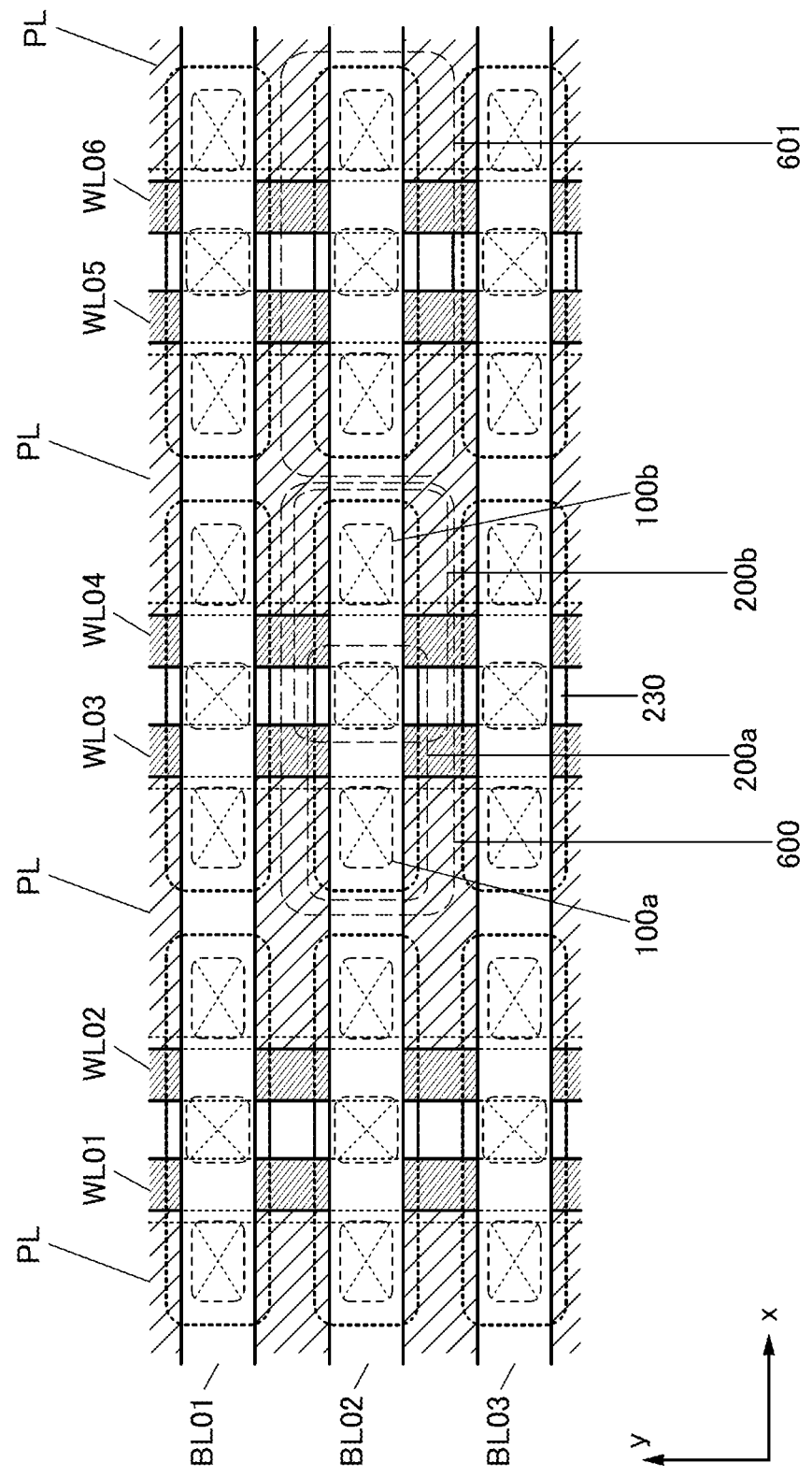
FIG. 36 A plan view of a semiconductor device of one embodiment of the present invention.

FIG. 34 is a circuit diagram showing a mode in which the cells 600 illustrated in FIG. 33 are arranged in a matrix. FIG. 35 is a schematic view illustrating a cross-sectional structure of the cell 600 in the circuit diagram illustrated in FIG. 34, a cell 601 adjacent to the cell 600, and their vicinities. FIG. 36 is a schematic view illustrating a layout of a wiring WL and a wiring BL in the circuit diagram illustrated in FIG. 34 and the oxide 230. In FIG. 34 to FIG. 37, the extending direction of the wiring BL is the x-direction, the extending direction of the wiring WL is the y-direction, and the direction perpendicular to the xy plane is the z-direction. Although FIG. 34, FIG. 36, and FIG. 37 each illustrate an example in which the cells are arranged in a 3×3 matrix, this embodiment is not limited thereto; the number and position of the memory cells, wirings, or the like included in the cell array are appropriately set. In the top views of FIG. 36 and FIG. 37, some components illustrated in FIG. 34 are not illustrated for clarity of the drawing.

As illustrated in FIG. 34, one of the source and the drain of each of the transistor 200a and the transistor 200b which are included in the cell is electrically connected to the common wiring BL (BL01, BL02, and BL03). Furthermore, the wiring BL is also electrically connected to one of the source and the drain of each of the transistor 200a and the transistor 200b included in the cells arranged in the x-direction. The first gate of the transistor 200a and the first gate of the transistor 200b which are included in the cell are electrically connected to different wirings WL (WL01 to WL06). Furthermore, these wirings WL are electrically connected to the first gates of the transistors 200a or the first gates of the transistors 200b included in the cells arranged in the y-direction.

Furthermore, one electrode of the capacitor 100a and one electrode of the capacitor 100b that are included in the cell are electrically connected to wirings PL. For example, the wirings PL are formed to extend in the y-direction.

In addition, the transistor 200a and the transistor 200b that are included in the cells may each be provided with a second gate BG. The threshold voltage of the transistor can be controlled by a potential applied to the second gate BG. The second gate BG is connected to a transistor 400 and the potential applied to the second gate BG can be controlled by the transistor 400.

For example, as illustrated in FIG. 35, the conductor 160 can extend in the x-direction to function as the wiring BL, the conductor 260 can extend in the y-direction to function as the wiring WL, and the conductor 120 can extend in the y-direction to function as the wiring PL. In addition, the conductor 203 can extend in the y-direction to function as a wiring connected to the second gate BG.

As illustrated in FIG. 35, a structure is preferably employed in which the conductor 120 functioning as one electrode of the capacitor 100b included in the cell 600 also functions as one electrode of the capacitor 100a included in the cell 601. Furthermore, although not illustrated, the conductor 120 functioning as one electrode of the capacitor 100a included in the cell 600 also functions as one electrode of a capacitor included in the adjacent cell on the left side of the cell 600. The cell on the right side of the cell 601 has a similar structure. Thus, a cell array can be formed. With this structure of the cell array, the space between adjacent cells can be reduced, which enables smaller projected area and higher integration of the cell array.

As illustrated in FIG. 36, the oxides 230 and the wirings WL are arranged in a matrix, whereby the semiconductor device of the circuit diagram illustrated in FIG. 34 can be formed. Here, the wirings BL are preferably provided in a layer different from the wirings WL and the oxides 230. Specifically, when the capacitor 100a and the capacitor 100b are provided in a layer below the wirings BL, a layout can be achieved in which the long side direction of the oxide 230 and the wiring BL are substantially parallel to each other. Accordingly, the layout of the cell can be simplified, leading to higher design flexibility and lower process cost.

Figure 37:
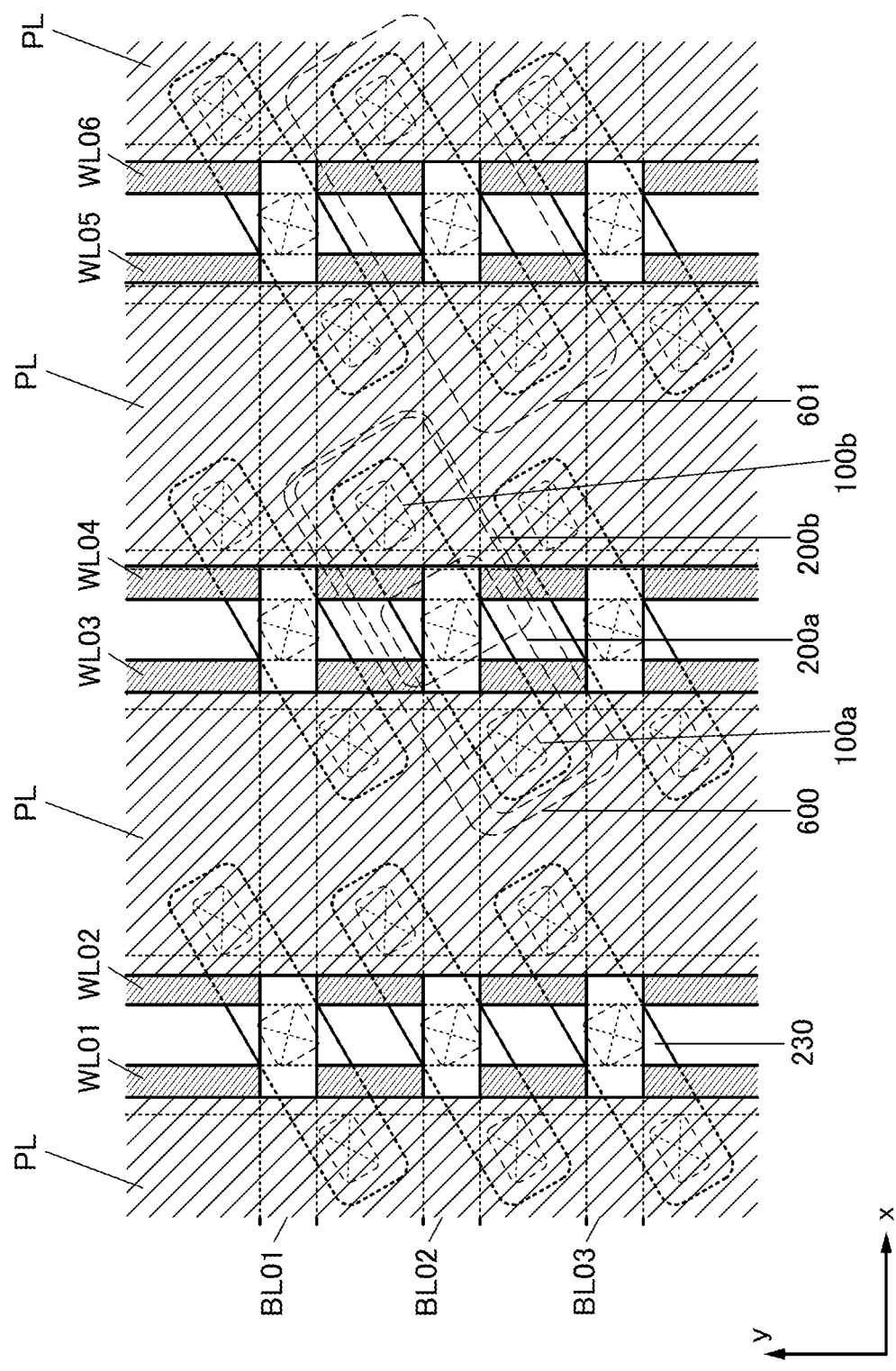
FIG. 37 A plan view of a semiconductor device of one embodiment of the present invention.

The oxides 230 and the wirings WL are provided such that the long sides of the oxides 230 are substantially orthogonal to the extending direction of the wirings WL in FIG. 36; however, the present invention is not limited thereto. For example, a layout may be employed in which the long sides of the oxides 230 are not orthogonal to the extending direction of the wirings WL and the long sides of the oxides 230 are inclined with respect to the extending direction of the wirings WL as illustrated in FIG. 37. With such an inclined arrangement, for example, the capacitor 100a and the capacitor 100b can be positioned not to intersect with the wirings BL, so that the capacitor 100a and the capacitor 100b can extend in the z-direction and the capacitor 100a and the capacitor 100b can have increased capacitance. The oxide 230 and the wiring WL are preferably provided so that an angle between the long side of the oxide 230 and the wiring WL is greater than or equal to 20° and less than or equal to 70°, further preferably greater than or equal to 30° and less than or equal to 60°.

Furthermore, the cell array may have a stacked-layer structure instead of a single-layer structure. When a plurality of cell arrays are stacked, cells can be integrally positioned without increasing the area occupied by the cell arrays. In other words, a 3D cell array can be formed.

As described above, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device having a low off-state current can be provided. Alternatively, according to one embodiment of the present invention, a transistor having a high on-state current can be provided. Alternatively, according to one embodiment of the present invention, a highly reliable semiconductor device can be provided. Alternatively, according to one embodiment of the present invention, a semiconductor device with low power consumption can be provided. Alternatively, according to one embodiment of the present invention, a semiconductor device with high productivity can be provided.

The structures and methods described in this embodiment can be use in an appropriate combination with any of the structures and methods described in the other embodiments.

Embodiment 3

In this embodiment, one embodiment of a semiconductor device will be described with reference to FIG. 38 to FIG. 40.

<Memory device 1>

Figure 38:
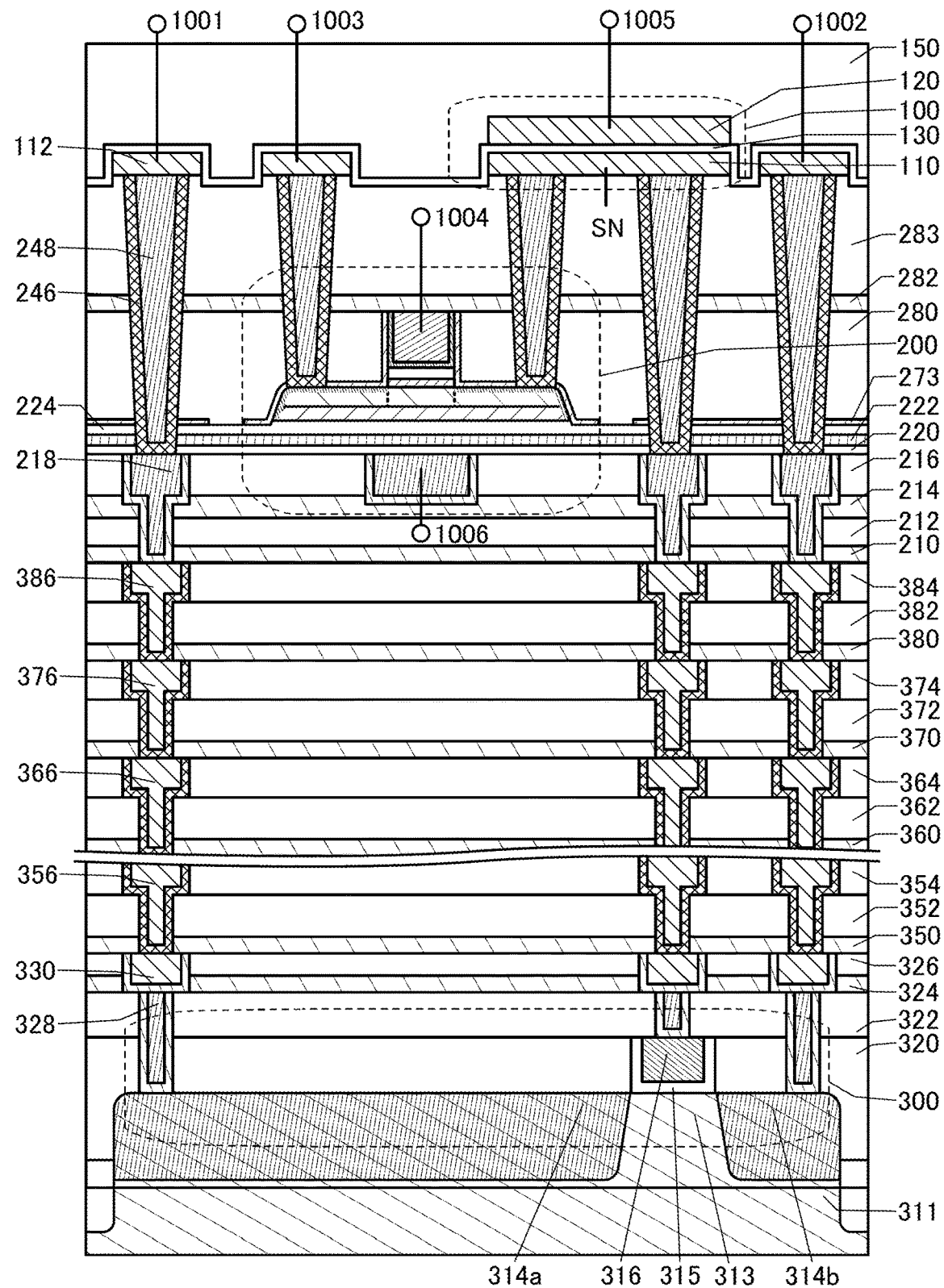
FIG. 38 A cross-sectional view illustrating a structure example of a memory device of one embodiment of the present invention.
Figure 39:
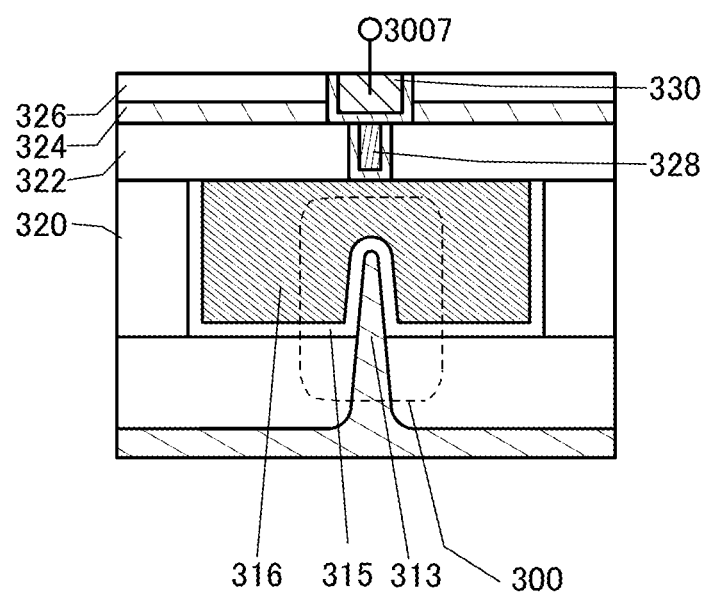
FIG. 39 A cross-sectional view illustrating a structure example of a memory device of one embodiment of the present invention.
Figure 40:
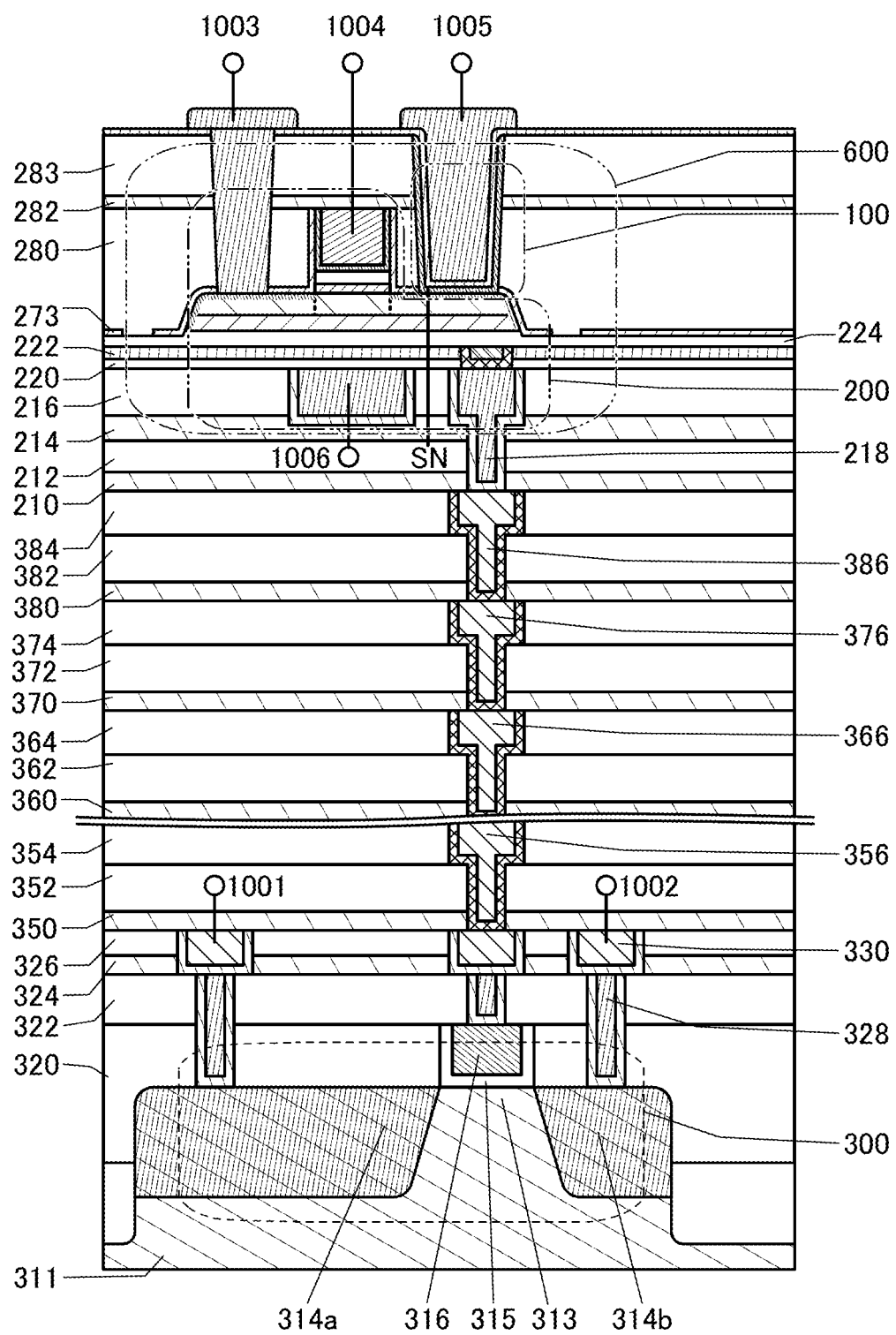
FIG. 40 A cross-sectional view illustrating a structure example of a memory device of one embodiment of the present invention.

Memory devices illustrated in FIG. 38 and FIG. 40 each include a transistor 300, the transistor 200, and the capacitor 100. FIG. 38 and FIG. 40 are cross-sectional views of the transistor 200 and the transistor 300 in the channel length direction. FIG. 39 illustrates a cross-sectional view of the transistor 300 and the vicinity thereof in the channel width direction.

The transistor 200 is a transistor in which a channel is formed in a semiconductor layer including an oxide semiconductor. Since the off-state current of the transistor 200 is low, a memory device using the transistor 200 can retain stored data for a long time. In other words, such a memory device does not require refresh operation or has an extremely low frequency of the refresh operation, which leads to a sufficient reduction in power consumption of the memory device.

In each of the memory devices illustrated in FIG. 38 and FIG. 40, a wiring 1001 is electrically connected to a source of the transistor 300 and a wiring 1002 is electrically connected to a drain of the transistor 300. A wiring 1003 is electrically connected to one of the source and the drain of the transistor 200, a wiring 1004 is electrically connected to a top gate of the transistor 200, and a wiring 1006 is electrically connected to a bottom gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The memory devices illustrated in FIG. 38 and FIG. 40 each have a feature that a potential of the gate of the transistor 300 can be retained and thus enable writing, retaining, and reading of data as follows.

Writing and retaining of data are described. First, the potential of the wiring 1004 is set to a potential at which the transistor 200 is brought into a conduction state, so that the transistor 200 is brought into a conduction state. Accordingly, the potential of the wiring 1003 is supplied to a node SN where the gate of the transistor 300 and one electrode of the capacitor 100 are electrically connected to each other. That is, a predetermined charge is supplied to the gate of the transistor 300 (writing). Here, one of two kinds of charges providing different potential levels (hereinafter referred to as a Low-level charge and a High-level charge) is supplied. After that, the potential of the wiring 1004 is set to a potential at which the transistor 200 is brought into a non-conduction state, so that the transistor 200 is brought into a non-conduction state; thus, the charge is retained in the node SN (retaining).

In the case where the off-state current of the transistor 200 is low, the charge in the node SN is retained for a long time.

Next, reading of data is described. An appropriate potential (reading potential) is supplied to the wiring 1005 while a predetermined potential (constant potential) is supplied to the wiring 1001, whereby the wiring 1002 has a potential corresponding to the amount of charge retained in the node SN. This is because when the transistor 300 is of an n-channel type, an apparent threshold voltage $V_{th\_H}$ at the time when the High-level charge is supplied to the gate of the transistor 300 is lower than an apparent threshold voltage $V_{th\_L}$ at the time when the Low-level charge is supplied to the gate of the transistor 300. Here, an apparent threshold voltage refers to the potential of the wiring 1005 which is needed to bring the transistor 300 into a "conduction state". Thus, the potential of the wiring 1005 is set to a potential $V_0$ which is between $V_{th\_H}$ and $V_{th\_L}$, whereby the charge supplied to the node SN can be determined. For example, in the case where the High-level charge is supplied to the node SN in writing and the potential of the wiring 1005 is $V_0$ ($>V_{th\_H}$), the transistor 300 is brought into a "conduction state". Meanwhile, in the case where the Low-level charge is supplied to the node SN, the transistor 300 remains in a "non-conduction state" even when the potential of the wiring 1005 is $V_0$ ($<V_{th\_L}$). Thus, the data retained in the node SN can be read by determining the potential of the wiring 1002.

<Structure of Memory Device 1>

The memory device of one embodiment of the present invention includes the transistor 300, the transistor 200, and the capacitor 100 as illustrated in FIG. 38. The transistor 200 is provided above the transistor 300, and the capacitor 100 is provided above the transistor 300 and the transistor 200.

The transistor 300 is provided over a substrate 311 and includes a conductor 316, an insulator 315, a semiconductor region 313 that is a part of the substrate 311, and a low-resistance region 314a and a low-resistance region 314b functioning as a source region and a drain region.

As illustrated in FIG. 39, in the transistor 300, a top surface and a side surface in the channel width direction of the semiconductor region 313 are covered with the conductor 316 with the insulator 315 therebetween. When the transistor 300 is such a Fin-type transistor, the effective channel width is increased, whereby the on-state characteristics of the transistor 300 can be improved. In addition, since contribution of an electric field of a gate electrode can be increased, the off-state characteristics of the transistor 300 can be improved.

The transistor 300 is of either a p-channel type or an n-channel type.

It is preferable that a region of the semiconductor region 313 where a channel is formed, a region in the vicinity thereof, the low-resistance region 314a and the low-resistance region 314b functioning as the source region or the drain region, and the like contain a semiconductor such as a silicon-based semiconductor, further preferably single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is adjusted by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use a stacked layer of metal materials such as tungsten and aluminum for the conductor, and it is particularly preferable to use tungsten in terms of heat resistance.

Note that the transistor 300 illustrated in FIG. 38 is only an example and the structure is not limited thereto; a transistor appropriate for a circuit configuration or a driving method can be used.

An insulator 320, an insulator 322, an insulator 324, and an insulator 326 are stacked in this order to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for eliminating a level difference caused by the transistor 300 or the like underlying the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 300, or the like into a region where the transistor 200 is provided.

For the film having a barrier property against hydrogen, silicon nitride formed by a CVD method can be used, for example. The diffusion of hydrogen into a semiconductor element including an oxide semiconductor, such as the transistor 200, degrades the characteristics of the semiconductor element in some cases. Therefore, a film that inhibits hydrogen diffusion is preferably used between the transistor 200 and the transistor 300. The film that inhibits hydrogen diffusion is specifically a film from which a small amount of hydrogen is released.

The amount of released hydrogen can be measured by TDS, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 or less times the dielectric constant of the insulator 324, further preferably 0.6 or less times the dielectric constant of the insulator 324. When a material with a low dielectric constant is used for an interlayer film, the parasitic capacitance generated between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

As a material of each of the plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 38, an insulator 350, an insulator 352, and an insulator 354 are provided to be stacked in this order. Furthermore, a conductor 356 is formed in the insulator 350, the insulator 352, and the insulator 354. The conductor 356 functions as a plug or a wiring. Note that the conductor 356 can be formed using a material similar to those for the conductor 328 and the conductor 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is preferably formed in an opening portion of the insulator 350 having a barrier property against hydrogen. In such a structure, the transistor 300 and the transistor 200 can be separated by a barrier layer, so that the diffusion of hydrogen from the transistor 300 into the transistor 200 can be inhibited.

Note that as the conductor having a barrier property against hydrogen, tantalum nitride is preferably used, for example. The use of a stack including tantalum nitride and tungsten having high conductivity can inhibit the diffusion of hydrogen from the transistor 300 while the conductivity of a wiring is kept. In that case, a structure is preferable in which the tantalum nitride layer having a barrier property against hydrogen is in contact with the insulator 350 having a barrier property against hydrogen.

A wiring layer may be provided over the insulator 350 and the conductor 356. For example, in FIG. 38, an insulator 360, an insulator 362, and an insulator 364 are provided to be stacked in this order. Furthermore, a conductor 366 is formed in the insulator 360, the insulator 362, and the insulator 364. The conductor 366 functions as a plug or a wiring. Note that the conductor 366 can be formed using a material similar to those of the conductor 328 and the conductor 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is preferably formed in an opening portion of the insulator 360 having a barrier property against hydrogen. In such a structure, the transistor 300 and the transistor 200 can be separated by a barrier layer, so that the diffusion of hydrogen from the transistor 300 into the transistor 200 can be inhibited.

A wiring layer may be provided over the insulator 364 and the conductor 366. For example, in FIG. 38, an insulator 370, an insulator 372, and an insulator 374 are provided to be stacked in this order. Furthermore, a conductor 376 is formed in the insulator 370, the insulator 372, and the insulator 374. The conductor 376 functions as a plug or a wiring. Note that the conductor 376 can be formed using a material similar to those for the conductor 328 and the conductor 330.

Note that the insulator 370 is preferably formed using an insulator having a barrier property against hydrogen, as with the insulator 324, for example. Furthermore, the conductor 376 preferably contains a conductor having a barrier property against hydrogen. In particular, the conductor having a barrier property against hydrogen is preferably formed in an opening portion of the insulator 370 having a barrier property against hydrogen. In such a structure, the transistor 300 and the transistor 200 can be separated by a barrier layer, so that the diffusion of hydrogen from the transistor 300 into the transistor 200 can be inhibited.

A wiring layer may be provided over the insulator 374 and the conductor 376. For example, in FIG. 38, an insulator 380, an insulator 382, and an insulator 384 are provided to be stacked in this order. Furthermore, a conductor 386 is formed in the insulator 380, the insulator 382, and the insulator 384. The conductor 386 functions as a plug or a wiring. Note that the conductor 386 can be formed using a material similar to those for the conductor 328 and the conductor 330.

Note that the insulator 380 is preferably formed using an insulator having a barrier property against hydrogen, as with the insulator 324, for example. Furthermore, the conductor 386 preferably contains a conductor having a barrier property against hydrogen. In particular, the conductor having a barrier property against hydrogen is formed in an opening portion of the insulator 380 having a barrier property against hydrogen. In such a structure, the transistor 300 and the transistor 200 can be separated by a barrier layer, so that the diffusion of hydrogen from the transistor 300 into the transistor 200 can be inhibited.

Although the wiring layer including the conductor 356, the wiring layer including the conductor 366, the wiring layer including the conductor 376, and the wiring layer including the conductor 386 are described above, the memory device of this embodiment is not limited thereto. Three or less, or five or less wiring layers which are similar to the wiring layer including the conductor 356 may be provided.

The insulator 210, the insulator 212, the insulator 214, and the insulator 216 are provided to be stacked in this order over the insulator 384. A substance having a barrier property against oxygen or hydrogen is preferably used for one of the insulator 210, the insulator 212, the insulator 214, and the insulator 216.

For example, the insulator 210 and the insulator 214 are preferably formed using a film having a barrier property that prevents diffusion of hydrogen or impurities from the substrate 311, a region where the transistor 300 is provided, or the like into a region where the transistor 200 is provided. Therefore, a material similar to that for the insulator 324 can be used.

For the film having a barrier property against hydrogen, silicon nitride formed by a CVD method can be used, for example. The diffusion of hydrogen into a semiconductor element including an oxide semiconductor, such as the transistor 200, degrades the characteristics of the semiconductor element in some cases. Therefore, a film that inhibits hydrogen diffusion is preferably used between the transistor 200 and the transistor 300. The film that inhibits hydrogen diffusion is specifically a film from which a small amount of hydrogen is released.

For the film having a barrier property against hydrogen used as the insulator 210 and the insulator 214, for example, a metal oxide such as aluminum oxide, hafnium oxide, or tantalum oxide is preferably used.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 200 in a fabrication process and after the fabrication of the transistor. In addition, release of oxygen from the oxide included in the transistor 200 can be inhibited. Therefore, aluminum oxide is suitably used for a protective film of the transistor 200.

The insulator 212 and the insulator 216 can be formed using a material similar to that for the insulator 320, for example. In the case where a material with a relatively low dielectric constant is used for an interlayer film, the parasitic capacitance generated between wirings can be reduced. A silicon oxide film, a silicon oxynitride film, or the like can be used as the insulator 212 and the insulator 216, for example.

A conductor 218, a conductor included in the transistor 200, and the like are embedded in the insulator 210, the insulator 212, the insulator 214, and the insulator 216. Note that the conductor 218 functions as a plug or a wiring that is electrically connected to the capacitor 100 or the transistor 300. The conductor 218 can be formed using a material similar to those for the conductor 328 and the conductor 330.

In particular, the conductor 218 in a region in contact with the insulator 210 and the insulator 214 is preferably a conductor having a barrier property against oxygen, hydrogen, and water. In such a structure, the transistor 300 and the transistor 200 can be separated by a layer having a barrier property against oxygen, hydrogen, and water; thus, the diffusion of hydrogen from the transistor 300 into the transistor 200 can be inhibited.

The transistor 200 is provided over the insulator 216. Note that the structure of the transistor included in the semiconductor device described in the above embodiment can be used as the structure of the transistor 200. Note that the transistor 200 illustrated in FIG. 38 is only an example and the structure is not limited thereto; a transistor appropriate for a circuit configuration or a driving method is used.

The insulator 280 is provided over the transistor 200.

The insulator 282 is provided over the insulator 280. A substance having a barrier property against oxygen or hydrogen is preferably used for the insulator 282. Thus, the insulator 282 can be formed using a material similar to that for the insulator 214. For the insulator 282, a metal oxide such as aluminum oxide, hafnium oxide, or tantalum oxide is preferably used, for example.

In particular, aluminum oxide has an excellent blocking effect that inhibits the passage of both oxygen and impurities such as hydrogen and moisture which are factors of a change in electrical characteristics of the transistor. Accordingly, aluminum oxide can prevent the entry of impurities such as hydrogen and moisture into the transistor 200 in a fabrication process and after the fabrication of the transistor. In addition, release of oxygen from the oxide included in the transistor 200 can be inhibited. Therefore, aluminum oxide is suitably used for a protective film of the transistor 200.

The insulator 283 is provided over the insulator 282. The insulator 283 can be formed using a material similar to that for the insulator 320. In the case where a material with a relatively low dielectric constant is used for an interlayer film, the parasitic capacitance generated between wirings can be reduced. For example, a silicon oxide film, a silicon oxynitride film, or the like can be used for the insulator 283.

A conductor 246, a conductor 248, and the like are embedded in the insulator 220, the insulator 222, the insulator 280, the insulator 282, and the insulator 283.

The conductor 246 and the conductor 248 function as plugs or wirings that are electrically connected to the capacitor 100, the transistor 200, or the transistor 300. The conductor 246 and the conductor 248 can be formed using a material similar to those for the conductor 328 and the conductor 330.

In addition, the capacitor 100 is provided above the transistor 200. The capacitor 100 includes the conductor 110, the conductor 120, and the insulator 130.

A conductor 112 may be provided over the conductor 246 and the conductor 248. The conductor 112 functions as a plug or a wiring that is electrically connected to the capacitor 100, the transistor 200, or the transistor 300. The conductor 110 functions as the electrode of the capacitor 100. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 112 and the conductor 110 each have a single-layer structure in FIG. 38; however, the structure is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 100, the insulator 130 is provided over the conductor 112 and the conductor 110. The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

A material with high dielectric strength, such as silicon oxynitride, is preferably used for the insulator 130, for example. In the capacitor 100 having such a structure, the dielectric strength can be increased and the electrostatic breakdown of the capacitor 100 can be inhibited because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, Cu (copper), Al (aluminum), or the like which is a low-resistance metal material can be used.

The insulator 150 is provided over the conductor 120 and the insulator 130. The insulator 150 can be provided using a material similar to that for the insulator 320. The insulator 150 may function as a planarization film that covers an uneven shape thereunder.

With the use of the structure, a change in electrical characteristics can be reduced and reliability can be improved in a semiconductor device using a transistor including an oxide semiconductor. Alternatively, a transistor including an oxide semiconductor having a high on-state current can be provided. Alternatively, a transistor including an oxide semiconductor having a low off-state current can be provided. Alternatively, a semiconductor device with low power consumption can be provided.

<Modification Example of Memory Device 1>

An example of the memory device of one embodiment of the present invention will be described below with reference to FIG. 40.

FIG. 40 is a cross-sectional view of a memory device including the capacitor 100, the transistor 200, and the transistor 300. Note that in the memory device illustrated in FIG. 40, components having the same functions as the components in the semiconductor device and the memory device described in the above embodiments and <Structure of memory device 1> are denoted by the same reference numerals.

The memory device illustrated in FIG. 40 is different from the memory device in <Structure of memory device 1> in that the cell 600 described in the above embodiment is provided.

Specifically, the memory device illustrated in FIG. 40 includes the cell 600 in which parts of the components of the capacitor 100 and the transistor 200 are common.

In the above structure, the cell 600 and the transistor 300 partly or entirely overlap with each other, so that the projected area of the memory device can be reduced. Accordingly, the cell 600 can be easily miniaturized or highly integrated. Furthermore, the process can be shortened.

Embodiment 4

In this embodiment, with reference to FIG. 41 to FIG. 43, a NOSRAM (registered trademark) will be described as an example of a memory device, which is one embodiment of the present invention, including a transistor in which an oxide is used for a semiconductor (hereinafter referred to as an OS transistor) and a capacitor. A NOSRAM is an abbreviation of "Nonvolatile Oxide Semiconductor RAM", which indicates a RAM including a gain cell (2T or 3T) memory cell. Note that hereinafter, a memory device including an OS transistor, such as a NOSRAM, is referred to as an OS memory in some cases.

A memory device in which OS transistors are used in memory cells (hereinafter referred to as an "OS memory") is used in a NOSRAM. The OS memory is a memory including at least a capacitor and an OS transistor that controls charge and discharge of the capacitor. Since the OS transistor is a transistor with an extremely low off-state current, the OS memory has excellent retention characteristics and thus can function as a nonvolatile memory.

<<NOSRAM>>

Figure 41:
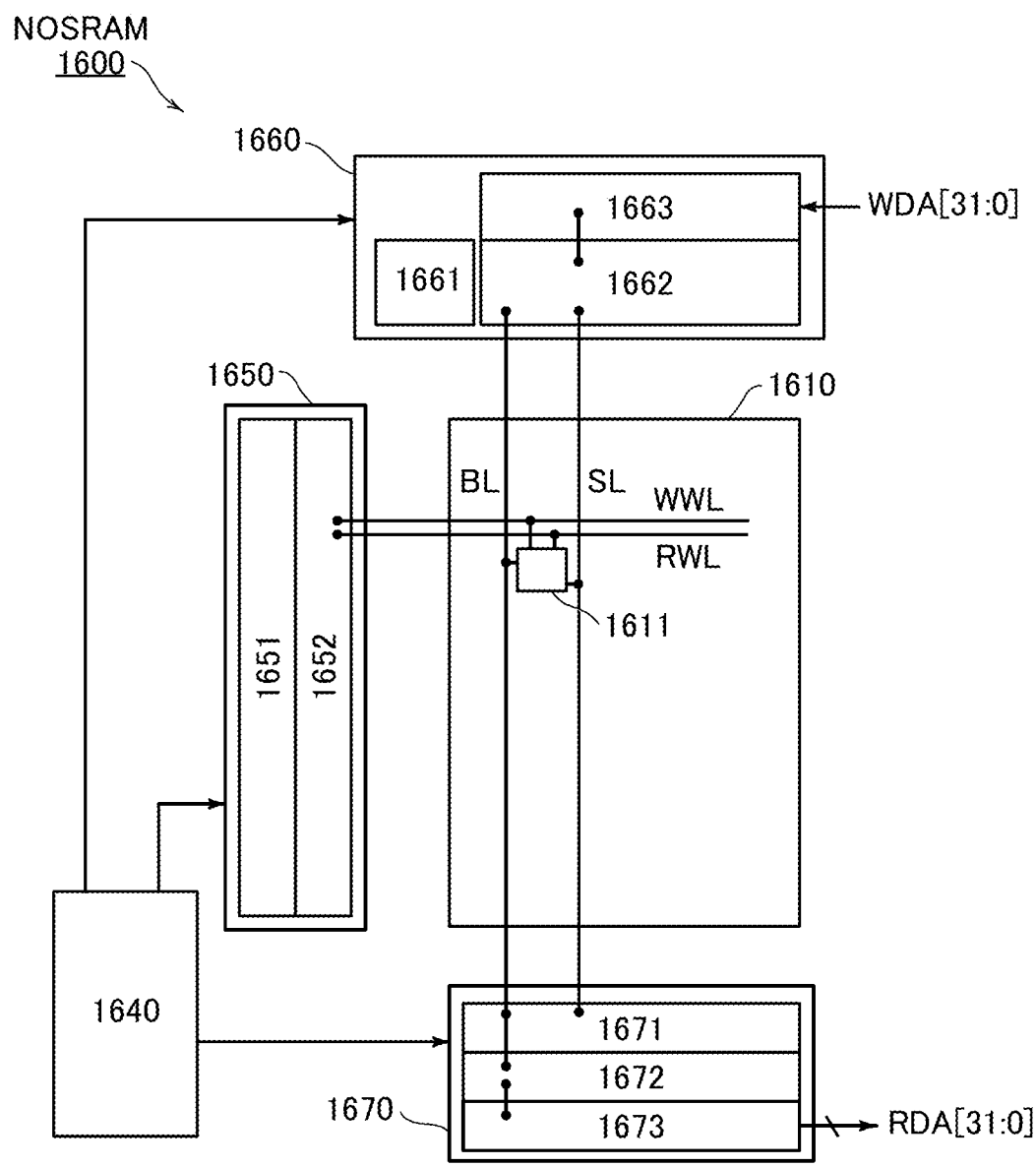
FIG. 41 A block diagram illustrating a configuration example of a memory device of one embodiment of the present invention.

FIG. 41 illustrates a configuration example of a NOSRAM 1600. The NOSRAM 1600 illustrated in FIG. 41 includes a memory cell array 1610, a controller 1640, a row driver 1650, a column driver 1660, and an output driver 1670. Note that the NOSRAM 1600 is a multilevel NOSRAM in which one memory cell stores multilevel data.

The memory cell array 1610 includes a plurality of memory cells 1611, a plurality of word lines WWL and RWL, bit lines BL, and source lines SL. The word lines WWL are write word lines and the word lines RWL are read word lines. In the NOSRAM 1600, one memory cell 1611 stores 3-bit (8-level) data.

The controller 1640 controls the NOSRAM 1600 as a whole, and writes data WDA[31:0] and reads out data RDA[31:0]. The controller 1640 processes command signals from the outside (for example, a chip enable signal and a write enable signal) to generate control signals of the row driver 1650, the column driver 1660, and the output driver 1670.

The row driver 1650 has a function of selecting a row to be accessed. The row driver 1650 includes a row decoder 1651 and a word line driver 1652.

The column driver 1660 drives the source lines SL and the bit lines BL. The column driver 1660 includes a column decoder 1661, a write driver 1662, and a DAC (digital-analog converter circuit) 1663.

The DAC 1663 converts 3-bit digital data into an analog voltage. The DAC 1663 converts 32-bit data WDA[31:0] into an analog voltage per 3 bits.

The write driver 1662 has a function of precharging the source lines SL, a function of bringing the source lines SL into an electrically floating state, a function of selecting a source line SL, a function of inputting a writing voltage generated in the DAC 1663 to the selected source line SL, a function of precharging the bit lines BL, a function of bringing the bit lines BL into an electrically floating state, and the like.

The output driver 1670 includes a selector 1671, an ADC (analog-digital converter circuit) 1672, and an output buffer 1673. The selector 1671 selects a source line SL to be accessed and transmits the voltage of the selected source line SL to the ADC 1672. The ADC 1672 has a function of converting an analog voltage into 3-bit digital data. The voltage of the source line SL is converted into 3-bit data in the ADC 1672, and the output buffer 1673 retains the data output from the ADC 1672.

Note that the configuration of the row driver 1650, the column driver 1660, and the output driver 1670 described in this embodiment is not limited to the above. The arrangement of the drivers and wirings connected to the drivers may be changed or the functions of the drivers and the wirings connected to the drivers may be changed or added, depending on the configuration, the driving method, or the like of the memory cell array 1610. For example, the bit lines BL may have part of a function of the source lines SL.

Note that although the amount of data retained in each of the memory cells 1611 is 3 bits in the above description, the structure of the memory device described in this embodiment is not limited thereto. The amount of data retained in each of the memory cells 1611 may be 2 bits or less or 4 bits or more. In the case where the amount of data retained in each of the memory cells 1611 is one bit, for example, a structure may be employed in which the DAC 1663 and the ADC 1672 are not provided.

<Memory Cell>

Figure 42A:
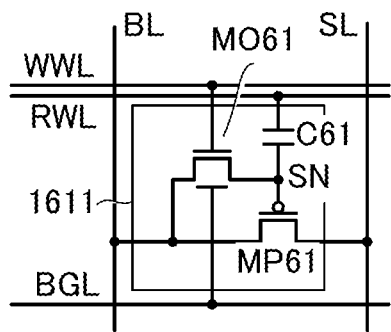
FIGS. 42A to 42E Circuit diagrams each illustrating a configuration example of a memory device of one embodiment of the present invention.

FIG. 42(A) is a circuit diagram showing a configuration example of the memory cell 1611. The memory cell 1611 is a 2T gain cell and the memory cell 1611 is electrically connected to the word lines WWL and RWL, the bit line BL, the source line SL, and a wiring BGL. The memory cell 1611 includes a node SN, an OS transistor MO61, a transistor MP61, and a capacitor C61. The OS transistor MO61 is a write transistor. The transistor MP61 is a read transistor and is formed using a p-channel Si transistor, for example. The capacitor C61 is a storage capacitor for retaining the voltage of the node SN. The node SN is a data storage node and corresponds to a gate of the transistor MP61 here.

The write transistor of the memory cell 1611 is formed using the OS transistor MO61; thus, the NOSRAM 1600 can retain data for a long time.

Figure 42B:
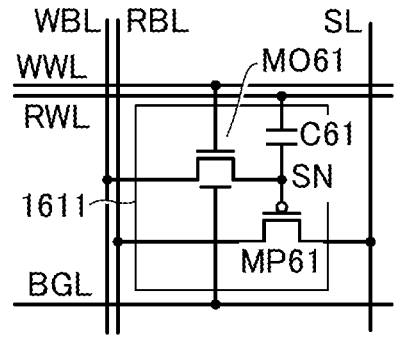

In the example of FIG. 42(A), a common bit line for writing and reading is provided; however, as illustrated in FIG. 42(B), a bit line WBL functioning as a write bit line and a bit line RBL functioning as a read bit line may be provided.

Figure 42C:
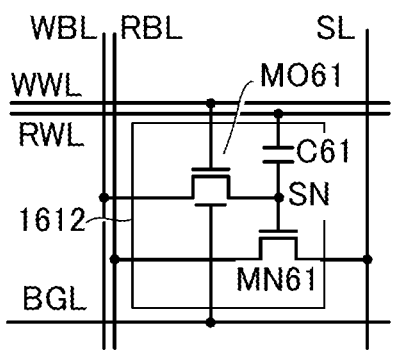
Figure 42D:
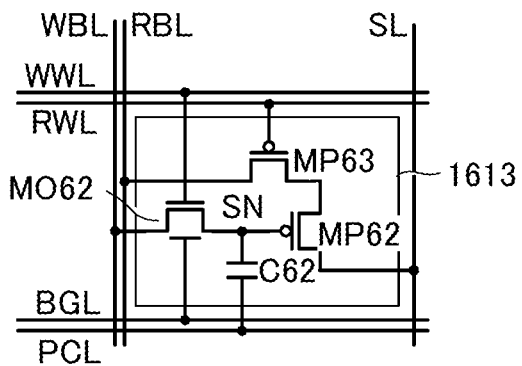
Figure 42E:
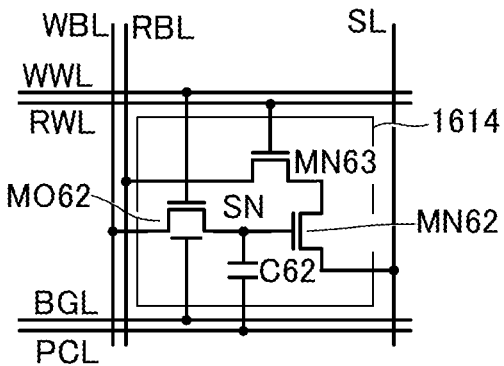

FIG. 42(C) to FIG. 42(E) show other configuration examples of the memory cell. FIG. 42(C) to FIG. 42(E) show examples where the bit line WBL for writing and the bit line RBL for reading are provided; however, as in FIG. 42(A), a bit line shared in writing and reading may be provided.

A memory cell 1612 illustrated in FIG. 42(C) is a modification example of the memory cell 1611 where the read transistor is changed into an n-channel transistor (MN61). The transistor MN61 may be an OS transistor or a Si transistor.

In the memory cells 1611 and 1612, the OS transistor MO61 may be an OS transistor with no back gate.

A memory cell 1613 illustrated in FIG. 42(D) is a 3T gain cell and is electrically connected to the word lines WWL and RWL, the bit lines WBL and RBL, the source line SL, the wiring BGL, and a wiring PCL. The memory cell 1613 includes the node SN, an OS transistor MO62, a transistor MP62, a transistor MP63, and a capacitor C62. The OS transistor MO62 is a write transistor. The transistor MP62 is a read transistor and the transistor MP63 is a selection transistor.

A memory cell 1614 illustrated in FIG. 42(E) is a modification example of the memory cell 1613 where the read transistor and the selection transistor are changed into n-channel transistors (MN62 and MN63). The transistors MN62 and MN63 may be OS transistors or Si transistors.

The OS transistors provided in the memory cells 1611 to 1614 may each be a transistor with no back gate or a transistor with a back gate.

What is called a NOR memory device in which the memory cells 1611 or the like are connected in parallel is described above, but the memory device of this embodiment is not limited thereto. For example, what is called a NAND memory device in which memory cells 1615 described below are connected in series may be provided.

Figure 43:
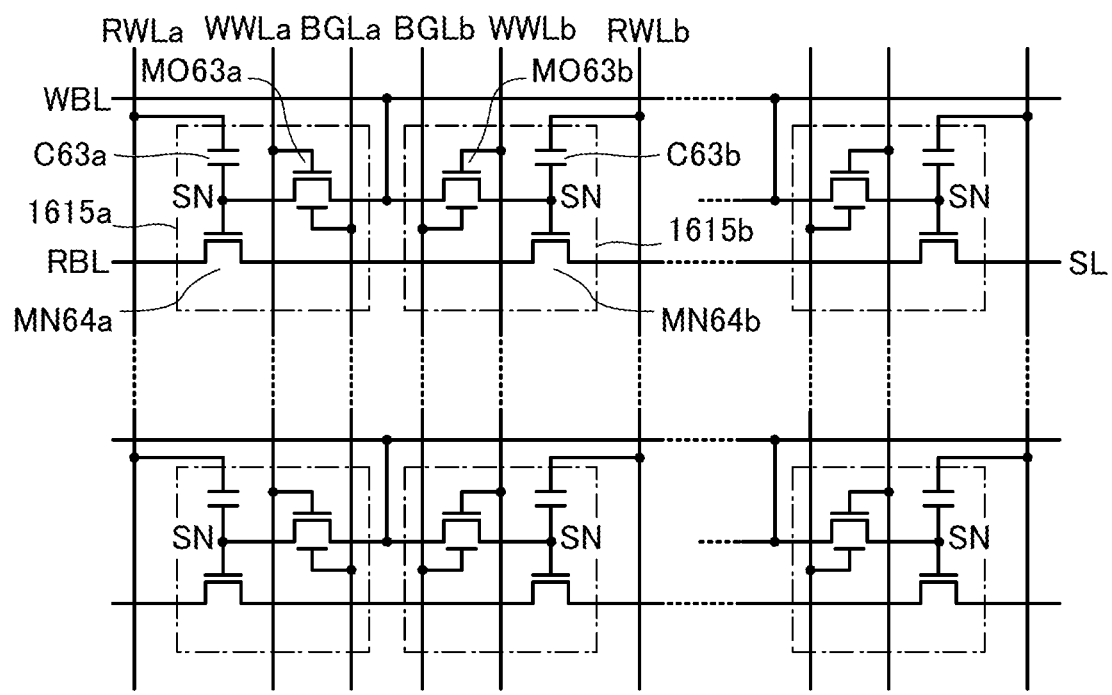
FIG. 43 A circuit diagram illustrating a configuration example of a memory device of one embodiment of the present invention.

FIG. 43 is a circuit diagram showing a configuration example of the NAND memory cell array 1610. The memory cell array 1610 illustrated in FIG. 43 includes the source line SL, the bit line RBL, the bit line WBL, the word line WWL, the word line RWL, the wiring BGL, and the memory cell 1615. The memory cell 1615 includes the node SN, an OS transistor MO63, a transistor MN64, and a capacitor C63. Here, the transistor MN64 is an n-channel Si transistor, for example. The transistor MN64 is not limited thereto and may be a p-channel Si transistor or an OS transistor.

A memory cell 1615*a* and a memory cell 1615*b*, which are illustrated in FIG. 43, are described below as examples. Here, the character "a" or "b" is added to the reference numerals of the wirings and circuit elements connected to the memory cell 1615*a* or the memory cell 1615*b*.

In the memory cell 1615*a*, a gate of a transistor MN64*a*, one of a source and a drain of a transistor MO63*a*, and one electrode of a capacitor C63*a* are electrically connected to each other. The bit line WBL and the other of the source and the drain of the transistor MO63*a* are electrically connected to each other. A word line WWLa and a gate of the transistor MO63*a* are electrically connected to each other. A wiring BGLa and a back gate of the transistor MO63*a* are electrically connected to each other. A word line RWLa and the other electrode of the capacitor C63*a* are electrically connected to each other.

The memory cell 1615*b* can be provided to be symmetric to the memory cell 1615*a* with the use of a contact portion with the bit line WBL as a symmetry axis. Therefore, circuit elements included in the memory cell 1615*b* are connected to wirings as in the memory cell 1615*a*.

A source of the transistor MN64*a* of the memory cell 1615*a* is electrically connected to a drain of a transistor MN64*b* of the memory cell 1615*b*. A drain of the transistor MN64*a* of the memory cell 1615*a* is electrically connected to the bit line RBL. A source of the transistor MN64*b* of the memory cell 1615*b* is electrically connected to the source line SL through the transistors MN64 of the plurality of memory cells 1615. As described here, the plurality of transistors MN64 are connected in series between the bit line RBL and the source line SL in the NAND memory cell array 1610.

In a memory device including the memory cell array 1610 illustrated in FIG. 43, writing operation and reading operation are performed for a plurality of memory cells (hereinafter referred to as a memory cell column) connected to the same word line WWL (or word line RWL). For example, the writing operation can be performed as follows. A potential at which the OS transistor MO63 is brought into an on state is supplied to the word line WWL connected to a memory cell column on which writing is performed so that the OS transistors MO63 in the memory cell column on which writing is performed are brought into an on state. Accordingly, the potential of the bit line WBL is applied to the gates of the transistors MN64 and ones of electrodes of the capacitors C63 in the specified memory cell column, whereby a predetermined charge is supplied to the gates. After that, turning off the OS transistors MO63 in the memory cell column allows the predetermined charge to be retained in the gates. Thus, data can be written to the memory cells 1615 in the specified memory cell column.

For example, the reading operation can be performed as follows. First, a potential at which the transistor MN64 is brought into an on state is supplied to the word lines RWL not connected to a memory cell column on which reading is to be performed regardless of a charge supplied to the gates of the transistors MN64, so that the transistors MN64 in memory cell columns other than the memory cell column on which reading is to be performed are brought into an on state. Then, a potential (reading potential) at which an on state or an off state of the transistor MN64 is selected is supplied to the word line RWL connected to the memory cell column on which reading is to be performed in accordance with a charge of the gates of the transistors MN64. After that, a constant potential is supplied to the source line SL and a reading circuit connected to the bit line RBL is brought into an operation state. Here, the plurality of transistors MN64 between the source line SL and the bit line RBL are in an on state except the transistor MN64 in the memory cell column on which reading is to be performed; therefore, the conductance between the source line SL and the bit line RBL depends on the state (an on state or an off state) of the transistor MN64 in the memory cell column on which reading is to be performed. Since the conductance of the transistor varies depending on the charge of the gate of the transistor MN64 in the memory cell column on which reading is to be performed, the potential of the bit line RBL varies accordingly. By reading the potential of the bit line RBL with the reading circuit, data can be read from the memory cell 1615 in the selected memory cell column.

There is theoretically no limitation on the number of rewriting operations of the NOSRAM 1600 because data is rewritten by charging and discharging the capacitor C61, the capacitor C62, or the capacitor C63; and writing and reading of data can be performed with low energy. Furthermore, since data can be retained for a long time, the refresh rate can be reduced.

In the case where the semiconductor device described in the above embodiment is used for the memory cells 1611, 1612, 1613, 1614, and 1615, the transistors 200 can be used as the OS transistors MO61, MO62, and MO63, the capacitors 100 can be used as the capacitors C61, C62, and C63, and the transistors 300 can be used as the transistors MP61, MP62, MP63, MN61, MN62, MN63, and MN64. Thus, the area occupied by one set consisting of a transistor and a capacitor in the top view can be reduced, so that the memory device of this embodiment can be further highly integrated. As a result, storage capacity per unit area of the memory device of this embodiment can be increased.

The structure described in this embodiment can be used in an appropriate combination with the structures described in the other embodiments and the like.

Embodiment 5

In this embodiment, a DOSRAM (registered trademark) is described as an example of a memory device including a transistor in which an oxide is used for a semiconductor (hereinafter referred to as an OS transistor) and a capacitor, which is one embodiment of the present invention, with reference to FIG. 44 and FIG. 45. DOSRAM is an abbreviation for "Dynamic Oxide Semiconductor RAM" and refers to a RAM including 1T (transistor) 1C (capacitor) memory cell.

A memory device in which OS transistors are used in memory cells (hereinafter referred to as an OS memory) is applied to the DOSRAM. The OS memory is a memory including at least a capacitor and an OS transistor that controls charge and discharge of the capacitor. Since the OS transistor is a transistor with an extremely low off-state current, the OS memory has excellent retention characteristics and thus can function as a nonvolatile memory.

<<DOSRAM 1400>>

Figure 44:
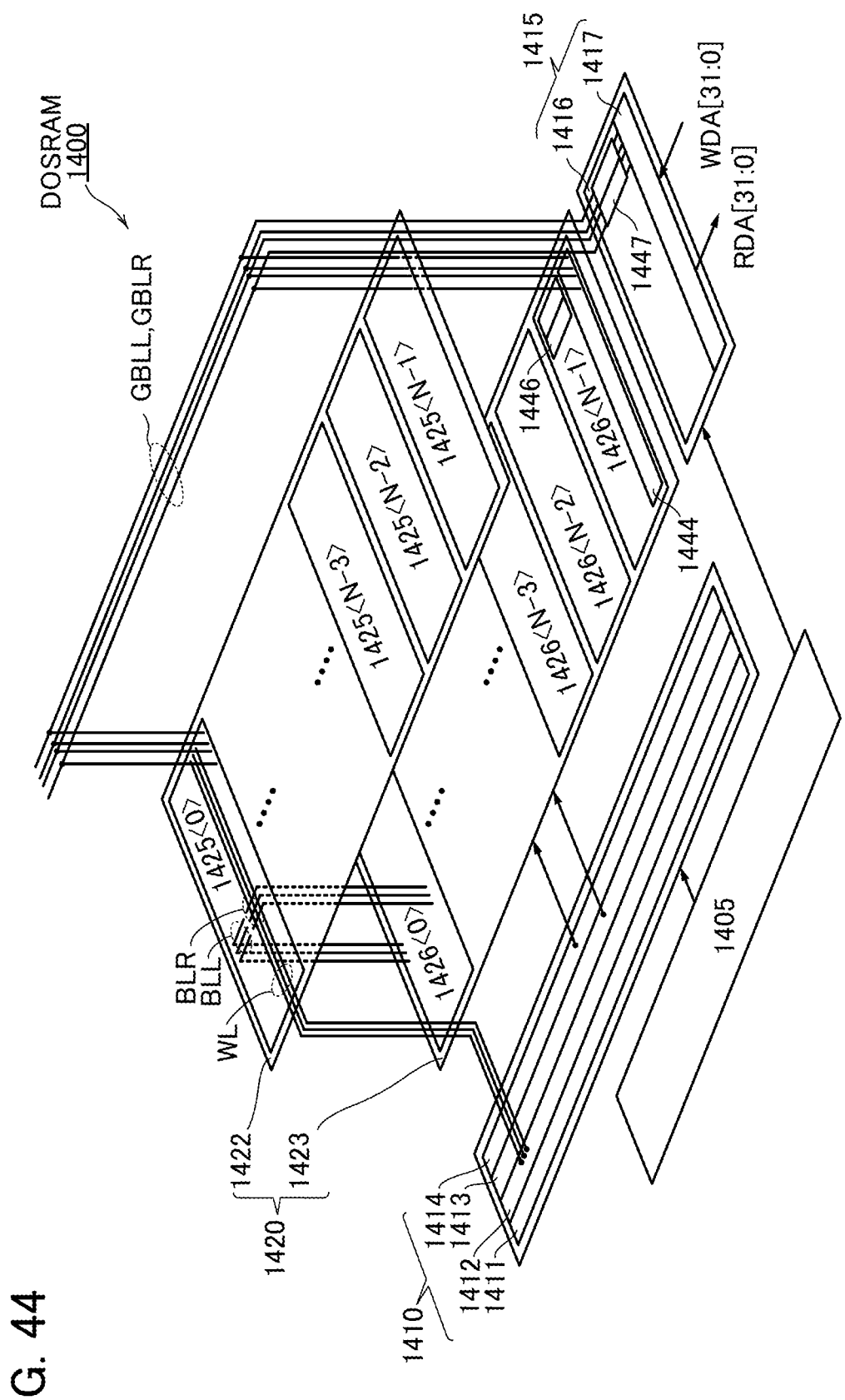
FIG. 44 A block diagram illustrating a configuration example of a memory device of one embodiment of the present invention.

FIG. 44 illustrates a configuration example of the DOSRAM. As illustrated in FIG. 44, a DOSRAM 1400 includes a controller 1405, a row circuit 1410, a column circuit 1415, and a memory cell and sense amplifier array 1420 (hereinafter referred to as an "MC-SA array 1420").

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts, as the bit-line structure, a hierarchical bit line structure hierarchized with local bit lines and global bit lines.

Figure 45A:
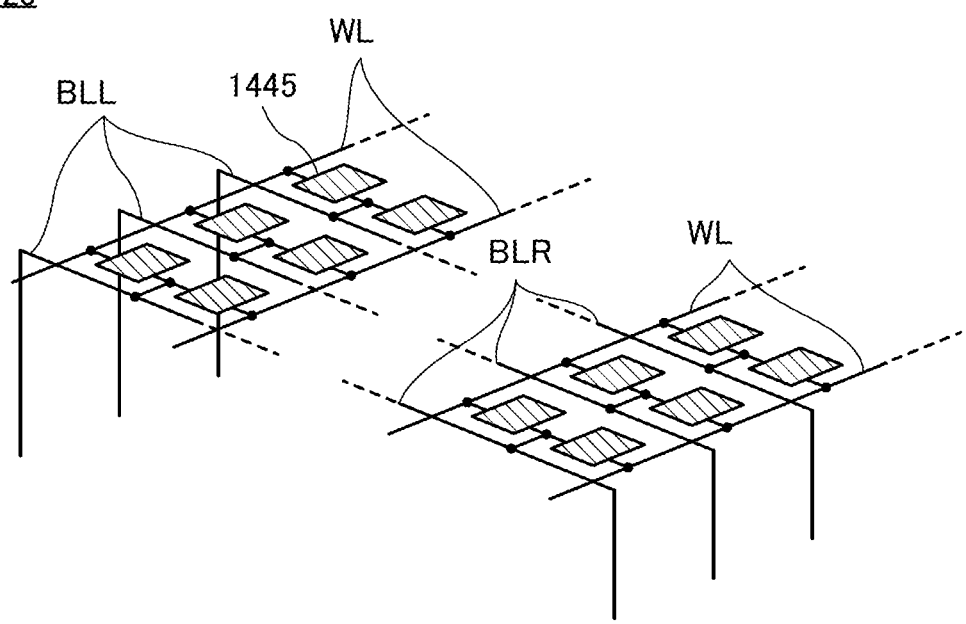
FIGS. 45A and 45B A block diagram and a circuit diagram illustrating a configuration example of a memory device of one embodiment of the present invention.

The memory cell array 1422 includes N local memory cell arrays 1425<0> to 1425<N−1> (N is an integer greater than or equal to 2). FIG. 45(A) illustrates a configuration example of the local memory cell array 1425. The local memory cell array 1425 includes a plurality of memory cells 1445, a plurality of word lines WL, and a plurality of bit lines BLL and BLR. In the example in FIG. 45(A), the local memory cell array 1425 has an open bit-line architecture but may have a folded bit-line architecture.

Figure 45B:
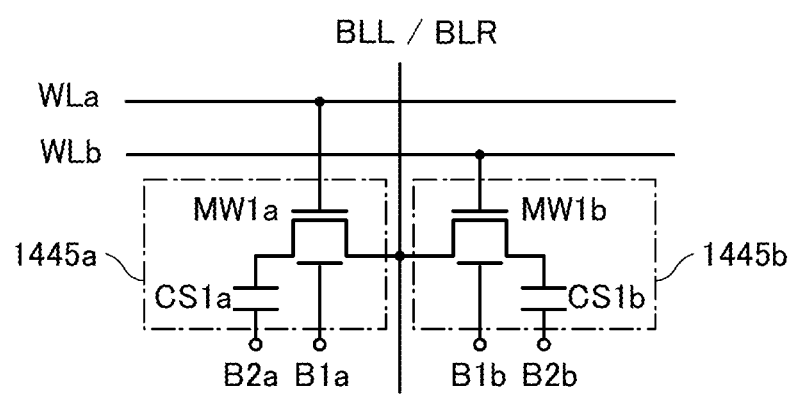

FIG. 45(B) illustrates a circuit configuration example of a memory cell 1445a and a memory cell 1445b connected to the same bit line BLL (BLR). The memory cell 1445a includes a transistor MW1a, a capacitor CS1a, and terminals B1a and B2a, and is connected to a word line WLa and the bit line BLL (BLR). The memory cell 1445b includes a transistor MW1b, a capacitor CS1b, and terminals B1b and B2b, and is connected to a word line WLb and the bit line BLL (BLR). Hereinafter, in the case where the description is not limited to the memory cell 1445a or the memory cell 1445b, the memory cell 1445 and its components are described without using the letter "a" or "b", in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW1a is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS1b.

A second terminal of the capacitor CS1 is electrically connected to the terminal B2. A constant voltage (e.g., low power supply voltage) is input to the terminal B2.

In the case where the semiconductor device described in the above embodiment is used for the memory cells 1445a and 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. In that case, the area occupied by one set consisting of one transistor and one capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage of the terminal B1. For example, the voltage of the terminal B1 may be a fixed voltage (e.g., a negative constant voltage); alternatively, the voltage of the terminal B1 may be changed in response to the operation of the DOSRAM 1400.

The back gate of the transistor MW1 may be electrically connected to the gate, the first terminal, or the second terminal of the transistor MW1. Alternatively, the back gate is not necessarily provided in the transistor MW1.

The sense amplifier array 1423 includes N local sense amplifier arrays 1426<0> to 1426<N−1>. The local sense amplifier array 1426 includes one switch array 1444 and a plurality of sense amplifiers 1446. The sense amplifier 1446 is electrically connected to a bit line pair. The sense amplifier 1446 has a function of precharging the bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair. The global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a target column. The local sense amplifier array 1426 amplifies the written data, and then retains the amplified data. In the specified local memory cell array 1425, the word line WL of the target row is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a target row is selected, and data of the memory cell 1445 is written to the bit line. The local sense amplifier array 1426 detects a voltage difference of the bit line pair of each column as data, and retains the data. The switch array 1444 writes the data of a column specified by the address signal to the global bit line pair; the data is chosen from the data retained at the local sense amplifier array 1426. The global sense amplifier array 1416 determines and retains the data of the global bit line pair. The data retained at the global sense amplifier array 1416 is output to the input/output circuit 1417. Thus, the read operation is completed.

The DOSRAM 1400 has no limitation on the number of rewrites in principle and data can be read and written with low energy consumption, because data is rewritten by charging and discharging the capacitor CS1. In addition, the memory cell 1445 has a simple circuit configuration, and thus the capacity can be easily increased.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

The structure described in this embodiment can be used in an appropriate combination with the structures described in the other embodiments and the like.

Embodiment 6

In this embodiment, an AI system in which the semiconductor device of the above embodiment is used is described with reference to FIG. 46.

Figure 46:
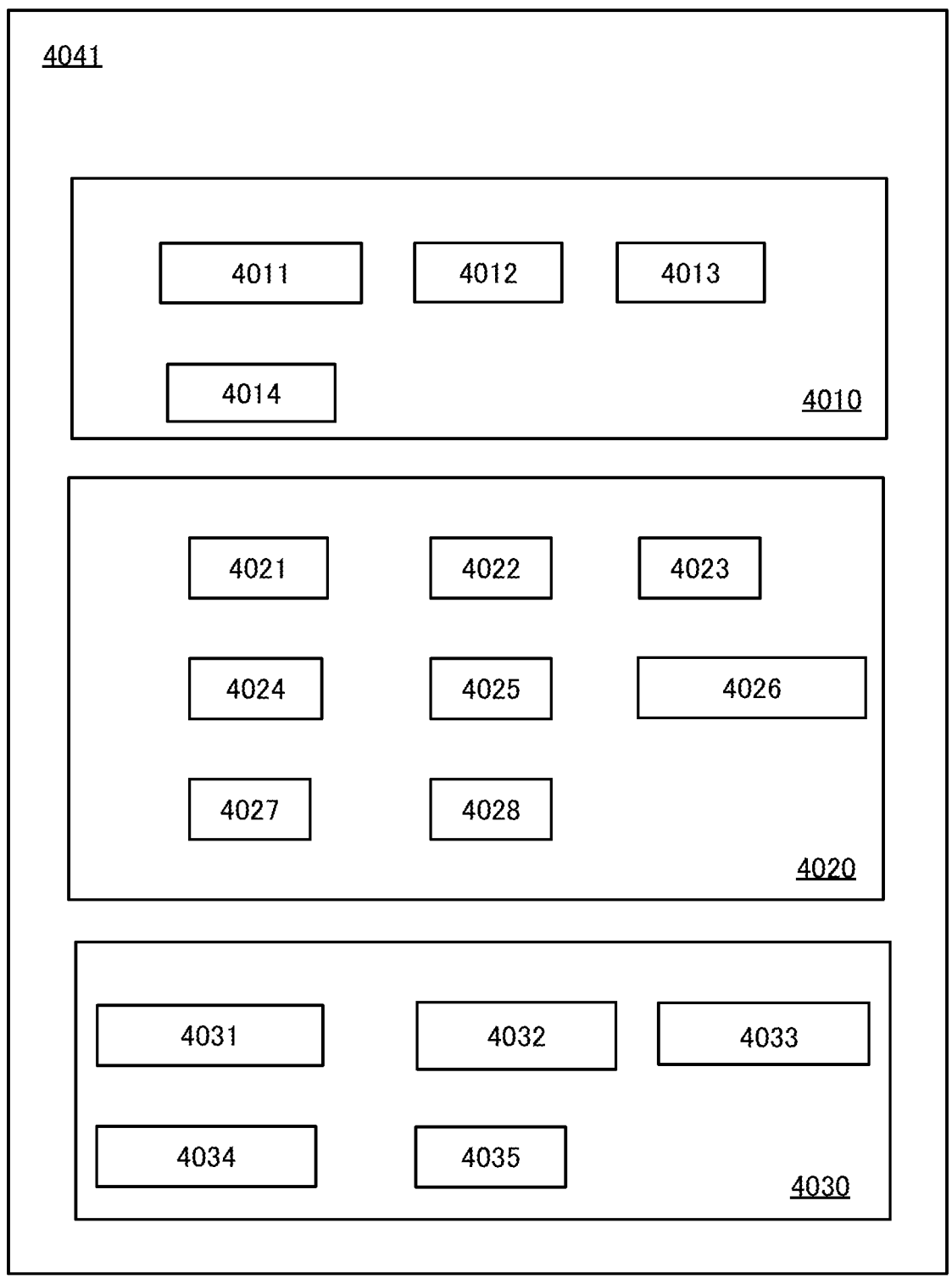
FIG. 46 A block diagram illustrating a structure example of an AI system of one embodiment of the present invention.

FIG. 46 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400 and the NOSRAM 1600 described in the above embodiment can be used as the DOSRAM 4012 and the NOSRAM 4013, respectively.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in the SRAM 4024, the input data have to be subdivided and stored because of the circuit area limitation and small storage capacity of the SRAM 4024. The DOSRAM 4012 has a larger storage capacity than the SRAM 4024 because the memory cells can be arranged to be highly integrated even in a limited circuit area. Therefore, the DOSRAM 4012 can efficiently store the input data.

The NOSRAM 4013 is a nonvolatile memory using an OS transistor. The NOSRAM 4013 consumes less power in data writing than the other nonvolatile memories such as a flash memory, a ReRAM (Resistive Random Access Memory), and an MRAM (Magnetoresistive Random Access Memory). Furthermore, unlike in a flash memory and a ReRAM, elements do not deteriorate because of data writing and there is no limitation on the number of times of data writing.

Furthermore, the NOSRAM 4013 can store multilevel data of two or more bits as well as one-bit binary data. Storage of the multilevel data in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 can have a longer bit line than the DOSRAM 4012 and thus can have an increased storage capacity.

The FPGA 4014 is an FPGA using an OS transistor. In the FPGA of this embodiment, an OS memory can be used for a configuration memory and a register. Here, such an FPGA is referred to as an "OS-FPGA". With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with hardware. Establishing the connection of the neural network with hardware enables higher speed performance.

The FPGA 4014 is an OS-FPGA. An OS-FPGA can have a smaller memory area than an FPGA including an SRAM. Thus, adding a context switching function only causes a small increase in area. Moreover, an OS-FPGA can transmit data and parameters at high speed by boosting.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not need to include all of the following: the DOSRAM 4012, the NOSRAM 4013, and the FPGA 4014. One or more selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013.

Most of the existing programs used as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and can execute the other product-sum operations in the GPU 4022. In this manner, the learning and inference can be executed at high speed.

The power supply circuit 4027 generates not only a low power supply potential for a logic circuit but also a potential for an analog operation. An OS memory may be used for the power supply circuit 4027. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external storage device (an HDD (Hard Disk Drive), an SSD (Solid State Drive), or the like) in many cases. Therefore, the AI system 4041 preferably includes the external memory control circuit 4031 functioning as an interface with the external storage device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, the multi-level flash memory is extremely difficult to embed (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structures described in this embodiment can be used in an appropriate combination with the structures described in the other embodiments and the like.

Embodiment 7

<Application Example of AI System>

In this embodiment, application examples of the AI system described in the above embodiment will be described with reference to FIG. 47.

Figure 47A:
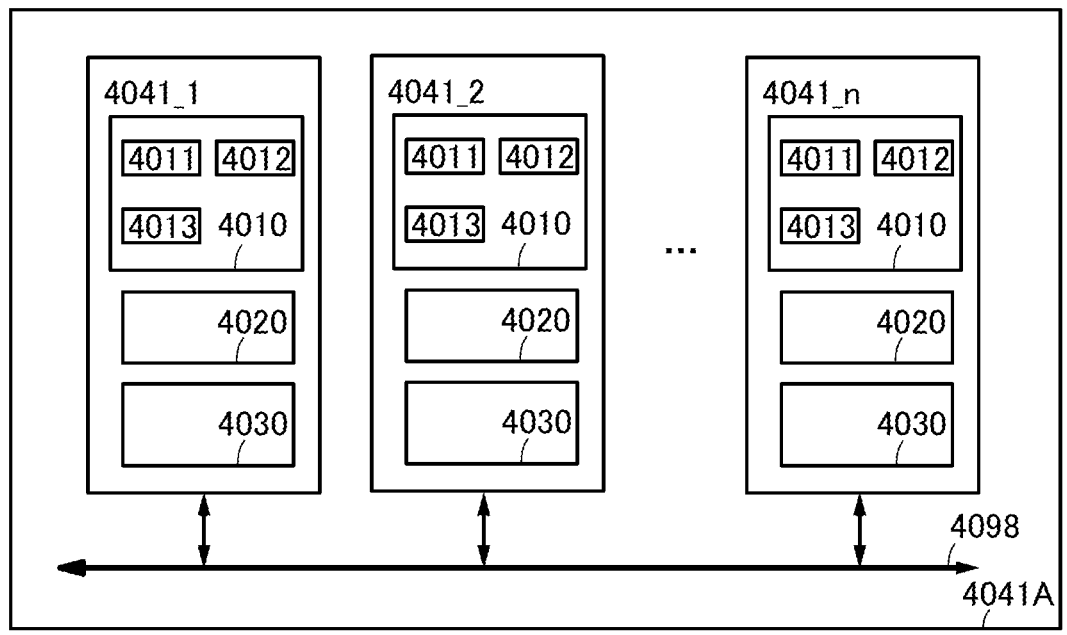
FIGS. 47A and 47B Block diagrams each illustrating an application example of an AI system of one embodiment of the present invention.

FIG. 47(A) illustrates an AI system 4041A in which the AI systems 4041 described with FIG. 46 are arranged in parallel and a signal can be transmitted between the systems via a bus line.

The AI system 4041A illustrated in FIG. 47(A) includes a plurality of AI systems 4041_1 to 4041_*n* (n is a natural number). The AI system 4041_1 to the AI system 4041_*n* are connected to each other via a bus line 4098.

Figure 47B:
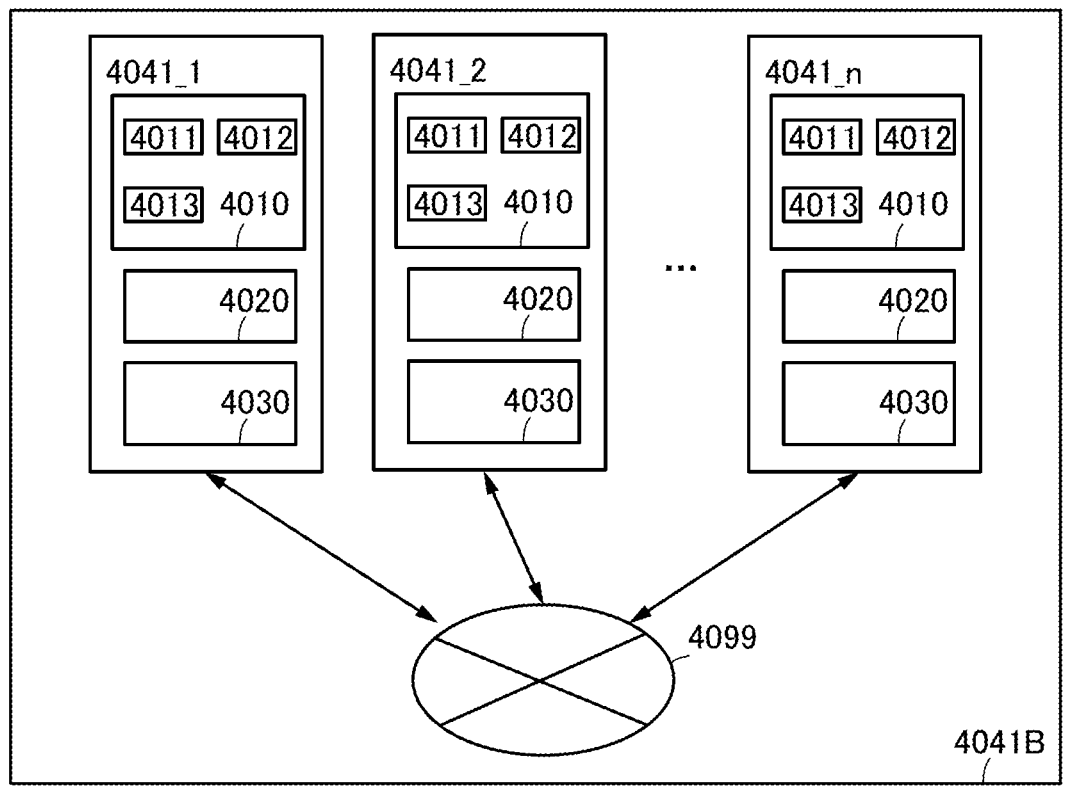

FIG. 47(B) illustrates an AI system 4041B in which the AI systems 4041 described with FIG. 46 are arranged in parallel as in FIG. 47(A) and a signal can be transmitted between the systems via a network.

The AI system 4041B illustrated in FIG. 47(B) includes the plurality of AI systems 4041_1 to 4041_*n*. The AI system 4041_1 to the AI system 4041_*n* are connected to each other via a network 4099.

A communication module is provided in each of the AI system 4041_1 to the AI system 4041_*n*; such a configuration enables wireless or wired communication via the network 4099. A communication module can communicate via an antenna. Communication can be performed when an electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the configuration illustrated in FIG. 47(A) or 47(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning can be performed with a smaller amount of arithmetic processing. As a result, recognition accuracy can be increased. The information obtained with each AI system is expected to enable instant and collective understanding of biological information that irregularly changes.

The structure described in this embodiment can be used in an appropriate combination with any of the other structures described in the other embodiments.

Embodiment 8

In this embodiment, an example of an IC into which the AI system described in the above embodiment is incorporated is described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 48:
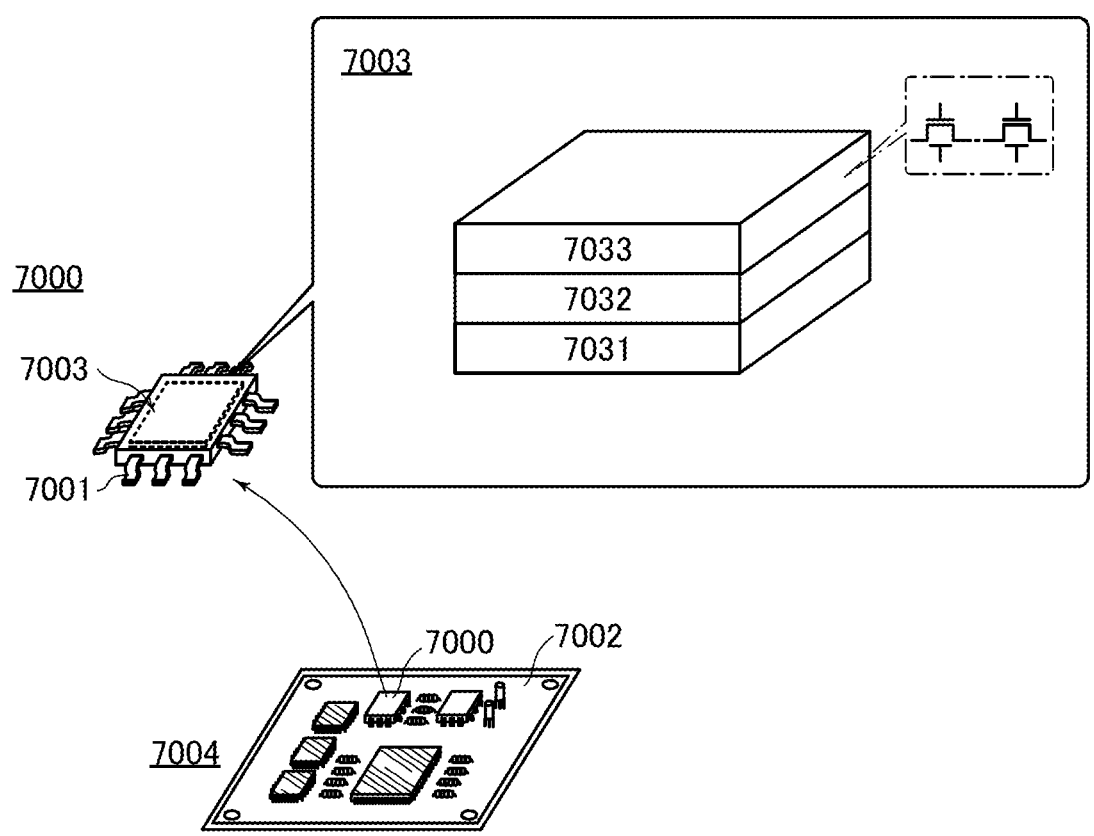
FIG. 48 A schematic perspective view illustrating a structure example of an IC into which an AI system of one embodiment of the present invention is incorporated.

FIG. 48 illustrates the example of the IC into which the AI system is incorporated. An AI system IC 7000 illustrated in FIG. 48 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. As described in the above embodiment, the circuit portion 7003 has a stacked-layer structure, which is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 48, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in an appropriate combination with the structures described in the other embodiments.

Embodiment 9

<Electronic Device>

A semiconductor device of one embodiment of the present invention can be used for a variety of electronic devices. FIG. 49 and FIG. 50 illustrate specific examples of the electronic devices using the semiconductor device of one embodiment of the present invention.

Figure 49A:
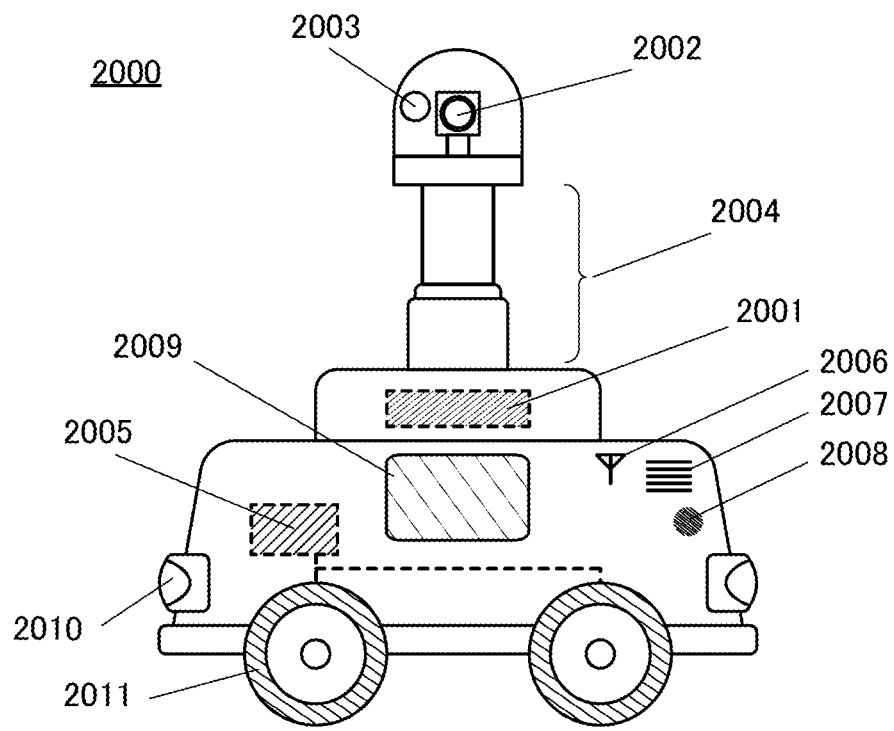
FIGS. 49A and 49B Diagrams illustrating an electronic device of one embodiment of the present invention.

A robot 2000 illustrated in FIG. 49(A) includes an arithmetic device 2001, a sensor 2002, a light 2003, a lift 2004, a driver portion 2005, and a moving mechanism 2011, and can take a still image and a moving image while moving. Such a robot can be used for a security system or a monitoring system.

The robot 2000 may further include a communication means 2006, a speaker 2007, a microphone 2008, a display portion 2009, a light-emitting portion 2010, and the like.

In the arithmetic device 2001, the semiconductor device of one embodiment of the present invention can be used. As the arithmetic device 2001, an IC into which the AI system of one embodiment of the present invention is incorporated can be used. The sensor 2002 functions as a camera which takes photographs of surroundings of the robot 2000. The light 2003 can be used as light when the photographs of the surroundings of the robot 2000 are taken by the sensor 2002. When a photograph of a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2000, which is provided with the driver portion 2005 and the moving mechanism 2011 connected to the driver portion 2005, is preferable because an imaging range of the sensor 2002, that is, a monitoring range, is expanded.

The communication means 2006 can send data taken by the sensor 2002 to a manager or the server owned by the manager. In addition, when the arithmetic device 2001 analyzes the data taken by the sensor 2002 and judges that there is an emergency such as a crime, an accident, or a fire, the communication means 2006 can report to the security company, the police, the fire station, the medical institution, or the owner of the land or the building. The speaker 2007 can transmit information such as an alert to a criminal, a call to an injured person or an emergency patient, and evacuation guidance, to the surroundings of the robot. The microphone 2008 can be used to obtain sounds around the robot 2000. The use of the communication means 2006 and the speaker 2007 enables the robot 2000 to function as a telephone. A person around the robot 2000 can have a conversation with the manager or a given person. The display portion 2009 can display given data. In emergency, the disaster information and the evacuation route can be displayed. The use in combination with the communication means 2006, the speaker 2007, and the microphone 2008 enables the robot 2000 to function as a videophone. A person around the robot 2000 can have a conversation with the manager or a given person while seeing the display portion 2009.

The light-emitting portion 2010 emits light or displays characters to show the direction of movement and the stopped state of the robot 2000. In addition, emergency may also be shown.

Figure 49B:
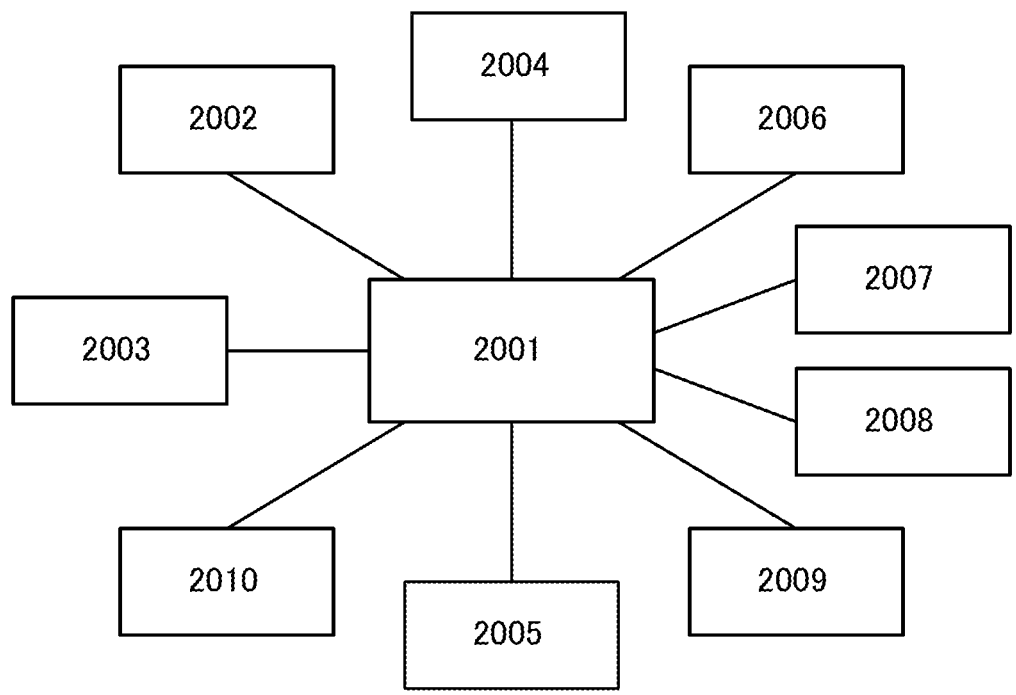

FIG. 49(B) is a block diagram illustrating a configuration of the robot 2000. The arithmetic device 2001 adjusts turning on or off and the brightness of the light 2003 from data such as an image obtained by the sensor 2002. In addition, the height of the lift 2004 is adjusted or the driver portion 2005 is controlled to align the positions of the robot 2000 and the sensor 2002. The operating condition of the driver portion 2005 can be shown by using the light-emitting portion 2010. With the communication means 2006, information around the robot 2000 obtained from the sensor 2002 and the microphone 2008 can be transmitted to the manager or the server owned by the manager. Depending on the judgment of the arithmetic device 2001 or the manager, information can be sent to the surroundings of the robot 2000 with the speaker 2007 and the display portion 2009.

In the case where a sensor that can take an image even in dark surroundings is used as a sensor used as the sensor 2002, the light 2003 is not necessarily provided. As such a sensor, an image sensor using selenium (Se) in the light-receiving portion can be used.

Such a robot 2000 can be used in commercial facilities and for security of the office. Data obtained from the sensor 2002 and the microphone 2008 is stored in the arithmetic device 2001 or the server. The stored data is analyzed by the AI system to check whether there is an anomaly situation such as loss or damage of an object, entry of suspicious individual, or disaster such as a fire. For the data analysis, deep learning may be used. When there is an anomaly situation, the robot 2000 reports to the manager and transmits information to the surroundings, and records the conditions of the surroundings.

The robot 2000 may be used for monitoring the growing conditions of the crops. The robot 2000 placed in a rice field or a field monitors the shapes, the sizes, or the colors of leaves or fruit of the crops by the sensor 2002 to check whether the crops are damaged or not or whether the crops are harmed by pests or not. Since the moving mechanism 2011 is provided for the robot 2000, the growing conditions of the crops can be monitored in a wide range. In addition, since the robot 2000 is provided with the lift 2004, the leaves and fruit at a certain height can be monitored regardless of the kind of crops and the growing conditions. The monitoring results are transmitted to a grower using the communication means 2006, and the grower can determine the kind, the amount, and the spraying timing of fertilizer and agricultural chemicals necessary for the crops. Alternatively, the monitoring results may be analyzed with the AI system using the arithmetic device 2001, and the kind, the amount, and the spraying timing of fertilizer and agricultural chemicals necessary for the crops may be determined and reported to the grower. Deep learning may be used for analysis of the monitoring results.

Figure 50A:
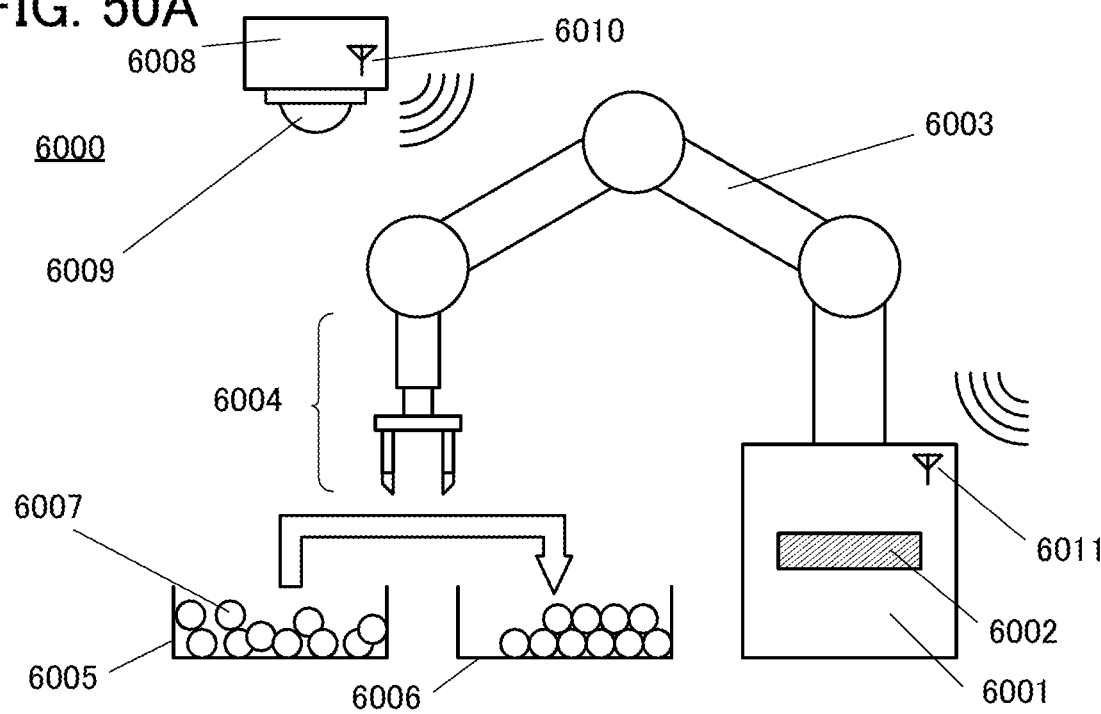
FIGS. 50A to 50F Diagrams illustrating an electronic device of one embodiment of the present invention.

FIG. 50(A) illustrates a sorting system 6000 using a robot 6001. The robot 6001 includes an arithmetic device 6002, a boom 6003, and an arm 6004. The robot 6001 may further include a wired or wireless communication means 6011. In addition, the sorting system 6000 includes a housing 6008 including a sensor 6009. The housing 6008 includes a communication means 6010. The housing 6008 is provided for a ceiling, a wall, or a beam (not illustrated) of the sorting system 6000 or a sorting operation area. The housing 6008 may be provided in the robot 6001. For example, the housing 6008 may be provided for the boom 6003 or the arm 6004. In the case where the housing 6008 is provided in the robot 6001, data obtained by the sensor 6009 may be transmitted to the arithmetic device 6002 without passing through the communication means 6010 and the communication means 6011, and processed.

The boom 6003 is movable, and the arm 6004 can be placed at a desired position. The arm 6004 may be telescopic. After the arm placed over a desired object 6007 is stretched to grab the desired object 6007 and the arm 6004 is shortened, the arm 6004 may be moved by the boom 6003.

The sorting system 6000 can transfer the object 6007 in a container 6005 to a container 6006. The container 6005 and the container 6006 may have the same shape or different shapes. Furthermore, a plurality of objects 6007 put in one container 6005 may be moved to a plurality of containers 6006 to be sorted.

As the container 6005 and the container 6006, a container, a cardboard box, a box for packing a product, a case, a film, a bag, a tray for storing foods, a lunch box, or the like is used. Furthermore, at least one of the container 6005 and the container 6006 may be cooking utensils such as a pot or a frying pan.

In the arithmetic device 6002, the semiconductor device of one embodiment of the present invention can be used. As the arithmetic device 6002, an IC into which the AI system of one embodiment of the present invention is incorporated can be used.

The sensor 6009 reads the position of the container 6005, the position of the container 6006, the state of the inside of the container 6005, and the state of the object 6007 in the container 6005 and transmits the data to the arithmetic device 6002 using the communication means 6010. Transmission of data is performed with or without a wire. Alternatively, the data may be transmitted through a wire without the communication means 6010. The arithmetic device 6002 analyzes the transmitted data. Here, the state of the object 6007 indicates the shape or the number of objects 6007, the overlap between the objects 6007, or the like. The arithmetic device 6002 performs analyzation on the basis of data from the sensor 6009 and obtains detailed information of the object 6007. The three-dimensional shape and hardness (or softness) of the object 6007 are obtained by comparison with the data stored in the arithmetic device 6002 or the server that can be communicated with the robot 6001. Depending on the three-dimensional shape and hardness (or softness) of the object 6007, the shape of the arm 6004 can be changed.

To obtain the detailed data of the object 6007, analysis using an AI system can be utilized. For the data analysis, deep learning may be used.

Figure 50B:
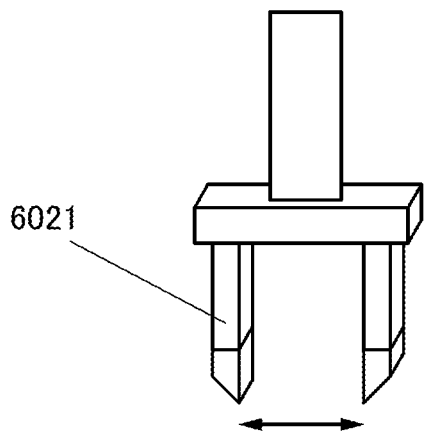
Figure 50C:
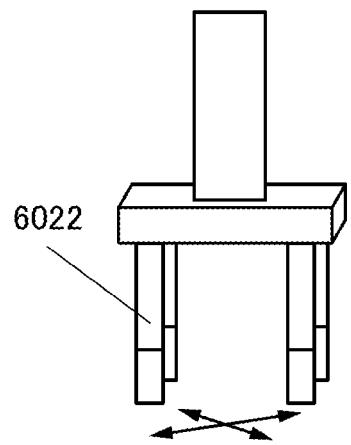
Figure 50D:
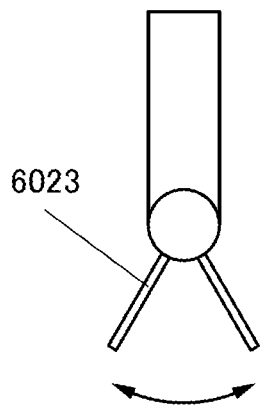
Figure 50E:
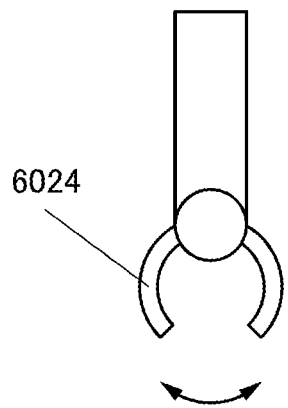
Figure 50F:
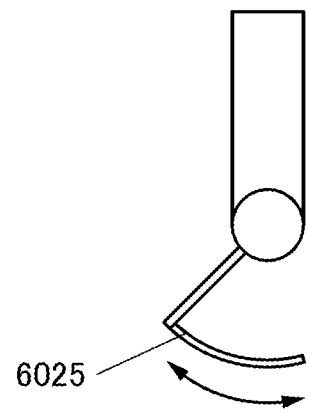

FIG. 50(B) illustrates an arm in which a pair of plates 6021 can move in the horizontal direction to pick up the object 6007. The pair of plates 6021 moves toward the center horizontally, whereby the object 6007 can be picked up. Such an arm can hold the object 6007 by the surfaces, and is suitable for picking up the object 6007 with a columnar shape, such as a cube or a rectangular solid. FIG. 50(C) illustrates an arm in which a plurality of bars 6022 can move in the horizontal direction to pick up the object 6007. The plurality of bars 6022 move toward the center horizontally, whereby the object 6007 can be picked up. Such an arm can pinch the object 6007 by the points, and is suitable for picking up the object 6007 in a spherical shape or in a non-fixed shape, that is, the object 6007 in an irregular shape. Note that although the number of bars 6022 is four in FIG. 50(C), this embodiment is not limited thereto. The number of bars 6022 may be three or five or more. FIG. 50(D) illustrates an arm in which a pair of plates 6023 rotates around the common axis to be closer to each other to pick up the object 6007. Such an arm can hold the object 6007 by the surfaces, and is suitable for picking up the object 6007 with a thin-film shape, such as paper or films. FIG. 50(E) illustrates an arm in which a pair of crook-shaped plates 6024 rotates around the common axis such that the ends of them are closer to each other to pick up the object 6007. Such an arm can pinch the object 6007 by the points or the sides, and is suitable for picking up the object 6007 with a thin-film shape, such as paper or films, or the object 6007 with a finer-grained shape. As illustrated in FIG. 50(F), a spatula 6025 may be attached to the tip of the arm, and the object 6007 with a finer-grained shape may be scooped.

The arms illustrated in FIG. 50(A) to FIG. 50(F) are just examples and one embodiment of the present invention is not limited to these shapes. In addition, the application of the arms is just an example and one embodiment of the present invention is not limited thereto.

The robot 6001 moves the boom 6003 to move the arm 6004 to a position over the desired object 6007 in the container 6005 on the basis of signals from the arithmetic device 6002. In the case of using the telescopic arm 6004, the arm 6004 is stretched, and the tip of the arm 6004 is brought down to a position on the level of the object 6007. The tip of the arm is moved to catch the desired object 6007. The arm is shortened while catching the object 6007. The boom 6003 is moved again to transfer the arm 6004 to the desired position in the container 6006. At this time, the arm 6004 may be rotated to adjust the angle of the object 6007 to the container 6006. The arm 6004 is stretched to place the object 6007 in the container 6006, and the arm 6004 releases the object 6007. The above operation is repeated, so that the robot 6001 can move the objects 6007 from the container 6005 to the container 6006.

Since the positional information on the container 6005 and the container 6006 and the state of the object 6007 are analyzed using the AI system, the object 6007 can be moved surely regardless of the shape or hardness of the object 6007. Examples of the object 6007 include not only an object packed in a box with a shape of a cube or a rectangular solid or a box or a case with a given shape but also eggs, shaped processed foods such as a hamburger steak and a croquette, foods such as vegetables with an irregular shape such as a potato and a tomato, machine parts such as a screw and a nut, and a thin film of paper or a film. Since in the sorting system 6000 described in this embodiment, the shape of the arm can be changed in consideration of the shape and the hardness of the object 6007, the object 6007 given above as examples can be transferred from the container 6005 to the container 6006 regardless of the shape and the hardness.

For example, a memory device using the semiconductor device of one embodiment of the present invention can retain control data, a control program, or the like of the above-described electronic device for a long time. With the use of the semiconductor device of one embodiment of the present invention, a highly reliable electronic device can be achieved.

An IC in which the above AI system is incorporated can be used for the arithmetic device or the like of the above-described electronic device, for example. Accordingly, the AI system enables the electronic device described in this embodiment to perform optimal operations depending on circumstances with low power consumption.

This embodiment can be implemented in an appropriate combination with the structures described in the other embodiments and the like.

Embodiment 10

<Electronic Device>

A semiconductor device of one embodiment of the present invention can be used for a variety of electronic devices. FIG. 51 illustrates specific examples of the electronic devices using the semiconductor device of one embodiment of the present invention.

Figure 51A:
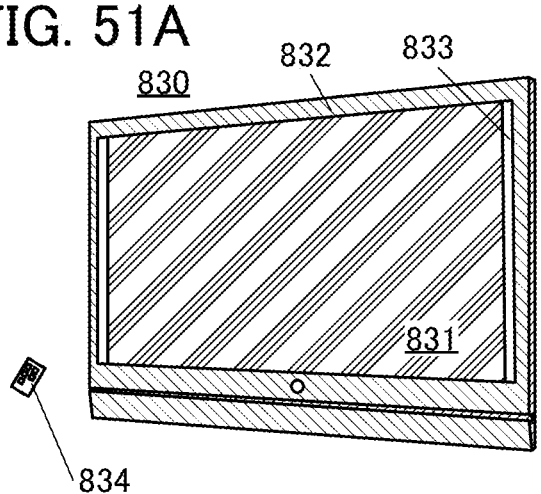
FIGS. 51A to 51F Diagrams each illustrating an electronic device of one embodiment of the present invention.

FIG. 51(A) illustrates a monitor 830. The monitor 830 includes a display portion 831, a housing 832, a speaker 833, and the like. Furthermore, an LED lamp, operation keys (including a power switch or an operation switch), a connection terminal, a variety of sensors, a microphone, and the like can be included. The monitor 830 can be controlled with a remote controller 834.

The monitor 830 can function as a television device by receiving airwaves.

Examples of the airwaves the monitor 830 can receive include ground waves and waves transmitted from a satellite. The example of the airwaves also include analog broadcasting, digital broadcasting, image-sound-only broadcasting, and sound-only broadcasting. For example, airwaves transmitted in a certain frequency band in a UHF band (higher than or equal to 300 MHz and lower than or equal to 3 GHz) or a VHF band (higher than or equal to 30 MHz and lower than or equal to 300 MHz) can be received. When a plurality of pieces of data received in a plurality of frequency bands is used, the transfer rate can be increased and more information can be obtained. Accordingly, the display portion 831 can display an image with a resolution exceeding the full high definition. An image with a resolution of, for example, 4K2K, 8K4K, 16K8K, or more can be displayed.

A structure may be employed in which an image to be displayed on the display portion 831 is generated using broadcasting data transmitted with a technology for transmitting data via a computer network such as the Internet, a LAN (Local Area Network), or Wi-Fi (registered trademark). In this case, the monitor 830 does not need to include a tuner.

The monitor 830 can be used as a computer monitor when connected to a computer. Several people can see the monitor 830 connected to a computer at the same time; thus, the monitor 830 can be used for a conference system. The monitor 830 can also be used for a videoconference system by display of data in a computer via a network or connection of the monitor 830 itself to a network.

The monitor 830 can also be used as a digital signage.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the monitor 830, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Figure 51B:
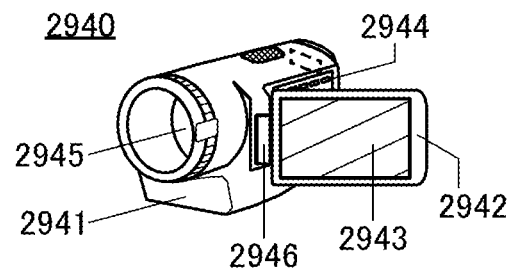

A video camera 2940 illustrated in FIG. 51(B) includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. A structure is employed in which the housing 2941 and the housing 2942 are connected to each other with the joint 2946, and the angle between the housing 2941 and the housing 2942 can be changed with the joint 2946. The orientation of an image displayed on the display portion 2943 may be changed and display and non-display of an image can be switched depending on the angle between the housing 2941 and the housing 2942.

The semiconductor device of one embodiment of the present invention can be used for, for example, a driver circuit or an image processing portion of the display portion. When the semiconductor device of one embodiment of the present invention is used for the driver circuit or the image processing portion of the display portion, high-speed operation or signal processing can be achieved with low power consumption.

When an AI system using the semiconductor device of one embodiment of the present invention is used for the image processing portion of the video camera 2940, imaging appropriate for the surroundings of the video camera 2940 can be achieved. Specifically, imaging can be performed with optimal exposure for the surrounding brightness. In the case of performing imaging with backlighting or imaging under different brightness conditions such as indoors and outdoors at the same time, high-dynamic-range (HDR) imaging can be performed.

Furthermore, the AI system can learn the user's habit and assist in performing imaging. Specifically, the AI system can learn the user's camera shaking habit and correct the camera shaking during imaging, so that blurring of the obtained image associated with camera shaking can be reduced as much as possible. In the case of using a zoom function during imaging, the orientation of the lens or the like can be controlled such that a subject is positioned at the center of an image all the time.

Figure 51C:
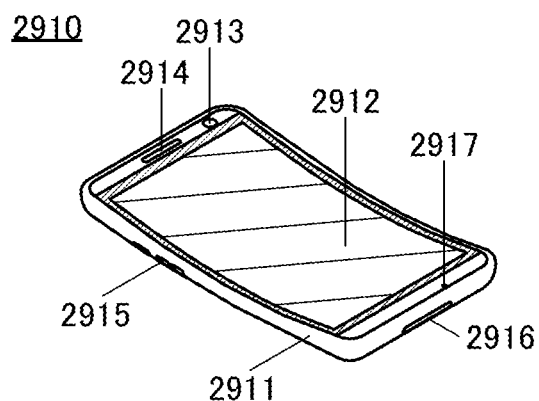

An information terminal 2910 illustrated in FIG. 51(C) includes a housing 2911, a display portion 2912, a microphone 2917, a speaker portion 2914, a camera 2913, an external connection portion 2916, operation switches 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

For example, a memory device using the semiconductor device of one embodiment of the present invention can retain control data, a control program, or the like of the information terminal 2910 for a long time.

When an AI system using the semiconductor device of one embodiment of the present invention is used for an image processing portion of the information terminal 2910, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the information terminal 2910. The information terminal 2910 into which the AI system is incorporated can predict touch input from the motion of the user's fingers, eyes, or the like.

Figure 51D:
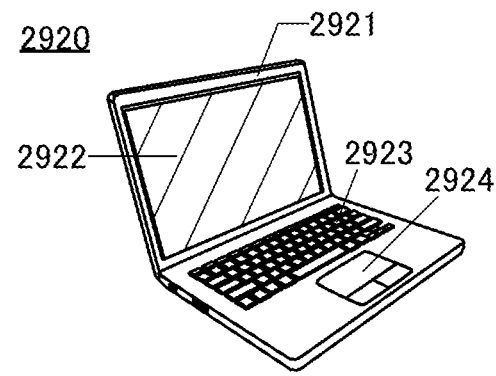

A laptop personal computer 2920 illustrated in FIG. 51(D) includes a housing 2921, a display portion 2922, a keyboard 2923, a pointing device 2924, and the like. The laptop personal computer 2920 also includes an antenna, a battery, and the like inside the housing 2921.

For example, a memory device using the semiconductor device of one embodiment of the present invention can retain control data, a control program, or the like of the laptop personal computer 2920 for a long time.

When an AI system using the semiconductor device of one embodiment of the present invention is used for an image processing portion of the laptop personal computer 2920, image processing such as noise removal processing, grayscale conversion processing, color tone correction processing, or luminance correction processing can be performed. Furthermore, pixel interpolation processing due to resolution up-conversion, frame interpolation processing due to frame frequency up-conversion, or the like can be performed. In the grayscale conversion processing, not only the number of grayscale levels of an image can be changed, but also interpolation of the gray value in the case of increasing the number of grayscale levels can be performed. In addition, high-dynamic range (HDR) processing for increasing a dynamic range is also included in the grayscale conversion processing.

Furthermore, the AI system can learn the user's habit and assist in operating the laptop personal computer 2920. The laptop personal computer 2920 into which the AI system is incorporated can predict touch input to the display portion 2922, from the motion of the user's fingers, eyes, or the like. In inputting text, the AI system predicts input from the past input text data or a text or a diagram such as a photograph around the text, to assist conversion. Accordingly, input mistakes and conversion mistakes can be reduced as much as possible.

Figure 51E:
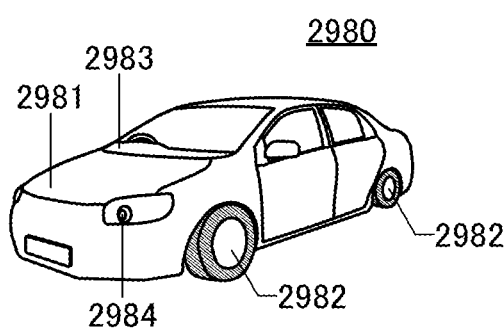
Figure 51F:
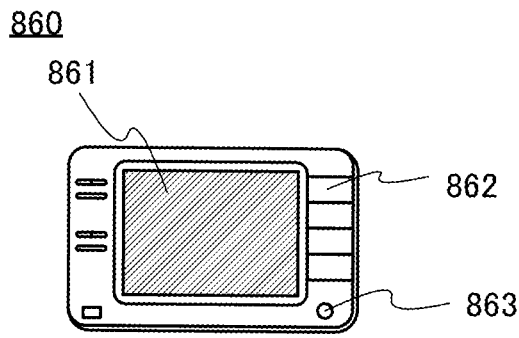

FIG. 51(E) is an external view illustrating an example of an automobile, and FIG. 51(F) illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that a structure be employed in which the navigation device 860 is incorporated into and liked to the automobile 2980.

For example, a memory device using the semiconductor device of one embodiment of the present invention can retain control data, a control program, or the like of the automobile 2980 or the navigation device 860 for a long time. When an AI system using the semiconductor device of one embodiment of the present invention is used for a control device or the like of the automobile 2980, the AI system can learn driver's driving skill and habit and assist in safe driving or driving involving efficient use of fuel such as gasoline or a battery. To assist in safe driving, the AI system learns not only driver's driving skill and habit, but also learns the behavior of the automobile such as the speed and movement of the automobile 2980, road information saved in the navigation device 860, and the like complexly; thus, driving lane departure can be prevented and collision with other automobiles, pedestrians, objects, and the like can be avoided. Specifically, when there is a sharp curve in the traveling direction, the navigation device 860 transmits the road information to the automobile 2980 so that the speed of the automobile 2980 can be controlled and steering can be assisted.

This embodiment can be implemented in an appropriate combination with the structures described in the other embodiments and the like.

REFERENCE NUMERALS

100: capacitor, 100*a*: capacitor, 100*b*: capacitor, 110: conductor, 112: conductor, 120: conductor, 130: insulator, 150: insulator, 160: conductor, 200: transistor, 200a: transistor, 200b: transistor, 203: conductor, 205: conductor, 205a: conductor, 205b: conductor, 210: insulator, 212: insulator, 214: insulator, 216: insulator, 218: conductor, 220: insulator, 222: insulator, 224: insulator, 224A: insulating film, 230: oxide, 230a: oxide, 230A: oxide film, 230b: oxide, 230B: oxide film, 230c: oxide, 230C: oxide film, 230d: oxide, 230D: oxide film, 231: region, 231a: region, 231b: region, 232a: region, 232b: region, 234: region, 239: region, 240: conductor, 240a: conductor, 240b: conductor, 242: layer, 242A: film, 246: conductor, 248: conductor, 250: insulator, 250A: insulating film, 260: conductor, 260a: conductor, 260Aa: conductive film, 260Ab: conductive film, 260b: conductor, 260B: conductor, 260Ba: conductor, 260Bb: conductor, 262: dummy gate, 262A: dummy gate film, 262B: dummy gate layer, 270: insulator, 273: insulator, 273A: insulating film, 273B: insulator, 275: insulator, 275A: insulating film, 275B: insulator, 280: insulator, 282: insulator, 283: insulator, 286: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 400: transistor, 600: cell, 601: cell, 830: monitor, 831: display portion, 832: housing, 833: speaker, 834: remote controller, 860: navigation device, 861: display portion, 862: operation button, 863: external input terminal, 1001: wiring, 1002: wiring, 1003: wiring, 1004: wiring, 1005: wiring, 1006: wiring, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier array, 1417: input/output circuit, 1420: MC-SA array, 1422: memory cell array, 1423: sense amplifier array, 1425: local memory cell array, 1426: local sense amplifier array, 1444: switch array, 1445: memory cell, 1445a: memory cell, 1445b: memory cell, 1446: sense amplifier, 1447: global sense amplifier, 1600: NOSRAM, 1610: memory cell array, 1611: memory cell, 1612: memory cell, 1613: memory cell, 1614: memory cell, 1615: memory cell, 1615a: memory cell, 1615b: memory cell, 1640: controller, 1650: row driver, 1651: row decoder, 1652: word line driver, 1660: column driver, 1661: column decoder, 1662: write driver, 1663: DAC, 1670: output driver, 1671: selector, 1672: ADC, 1673: output buffer, 2000: robot, 2001: arithmetic device, 2002: sensor, 2003: light, 2004: lift, 2005: driver portion, 2006: communication means, 2007: speaker, 2008: microphone, 2009: display portion, 2010: light-emitting portion, 2011: moving mechanism, 2910: information terminal, 2911: housing, 2912: display portion, 2913: camera, 2914: speaker portion, 2915: operation switch, 2916: external connection portion, 2917: microphone, 2920: laptop personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2980: car, 2981: car body, 2982: wheel, 2983: dashboard, 2984: light, 4010: arithmetic portion, 4011: analog arithmetic circuit, 4012: DOSRAM, 4013: NOSRAM, 4014: FPGA, 4020: control circuit, 4021: CPU, 4022: GPU, 4023: PLL, 4024: SRAM, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_n: AI system, 4041_1: AI system, 4041A: AI system, 4041B: AI system, 4098: bus line, 4099: network, 6000: system, 6001: robot, 6002: arithmetic device, 6003: boom, 6004: arm, 6005: container, 6006: container, 6007: object, 6008: housing, 6009: sensor, 6010: communication means, 6011: communication means, 6021: plate, 6022: bar, 6023: plate, 6024: plate, 6025: spatula, 7000: AI system IC, 7001: lead, 7002: printed circuit board, 7003: circuit portion, 7004: circuit board, 7031: Si transistor layer, 7032: wiring layer, 7033: OS transistor layer

The invention claimed is:

1. A semiconductor device comprising:
a first insulator;
an oxide over the first insulator;
a second insulator over the oxide;
a first conductor over the second insulator;
a third insulator in contact with a top surface of the first insulator, a side surface of the oxide, a top surface of the oxide, a side surface of the second insulator, and a side surface of the first conductor; and
a fourth insulator over the third insulator,
wherein the third insulator comprises an opening exposing the first insulator, and
wherein the fourth insulator is in contact with the first insulator through the opening.

2. The semiconductor device according to claim 1, wherein the first insulator and the fourth insulator are more likely to transmit oxygen than the third insulator.

3. The semiconductor device according to claim 1, wherein the oxide comprises In, an element M, and Zn, and
wherein M is Al, Ga, Y, or Sn.

4. The semiconductor device according to claim 1, wherein the third insulator is an oxide comprising one or both of aluminum and hafnium.

5. A semiconductor device comprising:
a first insulator;
a first oxide comprising an opening over the first insulator;
a second oxide over the first oxide;
a second insulator over the second oxide;
a first conductor over the second insulator;
a third insulator in contact with a top surface of the first insulator, a side surface of the first oxide, a side surface of the second oxide, a top surface of the second oxide, a side surface of the second insulator, and a side surface of the first conductor; and
a fourth insulator over the third insulator,
wherein the third insulator comprises an opening exposing the first insulator, and
wherein the fourth insulator is in contact with the first insulator through the opening in the third insulator.

6. The semiconductor device according to claim 5, wherein the first oxide comprises In, an element M, and Zn, and
wherein the second oxide comprises In, an element M, and Zn, and
wherein M is Al, Ga, Y, or Sn.

7. The semiconductor device according to claim 5, wherein the second oxide is more likely to transmit oxygen than the first oxide.

8. A method for fabricating a semiconductor device,
wherein a first insulator is formed over a substrate,
wherein an oxide layer is formed over the first insulator,
wherein a first insulating film and a dummy gate film are deposited in this order over the oxide layer,
wherein the first insulating film and the dummy gate film are processed to form a second insulator and a dummy gate layer,
wherein a first film comprising metal is formed in contact with the first insulator, the oxide layer, and the dummy gate layer,
wherein first heat treatment is performed in an atmosphere comprising nitrogen;
wherein the first film is removed wherein a second insulating film is deposited to cover the first insulator, the oxide layer, and the dummy gate layer,
wherein the second insulating film is processed to form a third insulator comprising an opening,
wherein a third insulating film is deposited over the third insulator,
wherein first CMP treatment is performed to remove parts of the dummy gate layer, the third insulator, and the third insulating film until part of the dummy gate layer is exposed,
wherein the dummy gate layer is etched to expose the second insulator,
wherein a conductive film is deposited,
wherein second CMP treatment is performed to remove parts of the conductive film until the third insulator is exposed and to form a first conductive layer and a fourth insulator,
wherein oxygen is injected into the fourth insulator,
wherein a fifth insulator is formed over the first conductive layer and over the fourth insulator, and
wherein second heat treatment is performed in an atmosphere comprising oxygen.

9. The method for fabricating the semiconductor device according to claim 8,
wherein the first film is formed by a sputtering method using one or a plurality of gases selected from argon, nitrogen, and oxygen.

10. The method for fabricating the semiconductor device according to claim 8,
wherein the oxygen is injected into the oxide layer through the opening and the first insulator by performing the second heat treatment.

11. The method for fabricating the semiconductor device according to claim 8,
wherein the injection of oxygen is performed using a method selected from an ion implantation method, an ion doping method, a plasma treatment method, and a plasma immersion ion implantation method.

12. The method for fabricating the semiconductor device according to claim 8,
wherein the injection of oxygen is performed using an ion implantation method.

* * * * *